United States Patent [19]
Asano et al.

[11] Patent Number: 6,037,207
[45] Date of Patent: Mar. 14, 2000

[54] METHOD OF MANUFACTURING SEMICONDUCTOR INTEGRATED CIRCUIT DEVICE INCLUDING A DRAM HAVING REDUCED PARASITIC BIT LINE CAPACITY

[75] Inventors: Isamu Asano, Iruma, Japan; Robert Tsu, Plano, Tex.

[73] Assignees: Hitachi, Ltd., Tokyo, Japan; Texas Instruments, Inc., Dallas, Tex.

[21] Appl. No.: 08/968,586

[22] Filed: Nov. 13, 1997

[30] Foreign Application Priority Data

Nov. 14, 1996 [JP] Japan .................................. 8-302821
Oct. 16, 1997 [JP] Japan .................................. 9-283419

[51] Int. Cl.$^7$ .............................................. H01L 21/8242
[52] U.S. Cl. .......................... 438/241; 438/256; 438/656
[58] Field of Search .................................... 438/241, 253, 438/256, 396, 656

[56] References Cited

U.S. PATENT DOCUMENTS

| 5,320,976 | 6/1994 | Chin et al. ............................ | 438/241 |
| 5,387,532 | 2/1995 | Hamamoto et al. .................... | 438/253 |
| 5,438,008 | 8/1995 | Ema ...................................... | 438/241 |
| 5,604,365 | 2/1997 | Kajigaya et al. ....................... | 257/296 |

FOREIGN PATENT DOCUMENTS 7-122654  5/1995  Japan .

OTHER PUBLICATIONS

Kang et al. Highly Manufacturable Process Technology for Reliable 256 Mbit and 1Gbit DRAMS, IEDM–1994.

*Primary Examiner*—Chandra Chaudhari
*Attorney, Agent, or Firm*—Antonelli, Terry, Stout & Kraus, LLP

[57] ABSTRACT

In semiconductor integrated circuit device having a DRAM including a memory cell portion formed at a first portion of a main surface of a semiconductor substrate and a peripheral circuit portion formed at a second portion of the main surface of the semiconductor substrate, bit line conductors and first level interconnect conductors in the peripheral circuit portion for connecting the memory cell portion and the peripheral circuit portion so as to exchange signals between them are constituted by conductor layers that are formed simultaneously and hence, exist at the same level. The conductor layers exist at an outside position of the memory cell portion such as in the peripheral circuit portion, and the thickness of portions of the conductor layers constituting the first level interconnect conductors of the peripheral circuit portion is greater than the thickness of portions of the conductor layers constituting the bit line conductors. A position at which a transistor for selectively connecting the memory cell portion and the peripheral circuit portion is formed may be a boundary, or a position inside a boundary region between the memory cell portion and the peripheral circuit portion may be a boundary, where the thickness change is effected.

17 Claims, 44 Drawing Sheets

METHOD OF MANUFACTURING SEMICONDUCTOR INTEGRATED CIRCUIT DEVICE INCLUDING A DRAM HAVING REDUCED PARASITIC BIT LINE CAPACITY

BACKGROUND OF THE INVENTION

This invention relates to a semiconductor integrated circuit device and a method of manufacturing the same. More particularly, this invention relates to a technology which will be useful when applied to a semiconductor integrated circuit device in which bit line conductors disposed in a memory cell region of a DRAM (Dynamic Random Access Memory) and first level interconnect conductors disposed in a peripheral circuit region of the DRAM are formed by the same layer.

Recent large capacity DRAMs employ a stacked capacitor structure in which an information storage capacitor device is disposed over a memory cell selection MISFET so as to supplement a decrease of a stored charge quantity (Cs) of the information storage capacitor device due to scaling-down of memory cells.

The information storage capacitor device of the stacked capacitor structure is formed by serially laminating a storage electrode (lower electrode), a capacity insulating film and a plate electrode (upper electrode). The storage electrode of the information storage capacitor device is connected to one of the semiconductor regions (source region and drain region) of an n-channel memory cell selection MISFET (Metal Insulator Semiconductor Field Effect Transistor). The plate electrode is constituted as an electrode common to a plurality of memory cells and a predetermined fixed potential (plate potential) is supplied to this plate electrode.

A bit line for writing and reading data is connected to the other of the semiconductor regions of the memory cell selection MISFET. A bit line conductor is disposed between the memory cell selection MISFET and the information storage capacitor device or over the information storage capacitor device. The structure wherein the information storage capacitor device is disposed over the bit line conductor is referred to as a "capacitor over bit line (COB)" structure.

A DRAM having the COB structure is described, for example, in U.S. Pat. No. 5,604,365 issued on Feb. 18, 1977 (corresponding to JP-A-7-122654 laid open on).

In the DRAM described in the above-mentioned reference, bit lines constituted by a polysilicon film (or a policide film) are disposed over a memory cell selection MISFET the gate electrode (word line) of which is constituted by a polysilicon film or a laminate film (policide film) of the polysilicon film and a tungsten silicide (WSix) film, and an information storage capacitor device comprising a storage electrode formed by a polysilicon film, a capacity insulating film formed by a laminate film of a silicon oxide film and a silicon nitride film and a plate electrode formed by a polysilicon film is disposed over the bit lines.

A higher integration density has been required for the DRAM having such a COB structure, too. A multi-level interconnect structure has become indispensable with the progress of scaling-down of interconnect conductors, and a three-layered interconnect structure having a minimum line width of 0.3 $\mu$m has been employed in 64 Mbit DRAMs, for example.

The adoption of a multi-level interconnect technology for arranging the interconnect conductors in a multi-level configuration invites an increase in the number of process steps in the conductor formation process and eventually causes a drop of through-put of a production process. Therefore, the increase of the number of interconnect conductor levels must be reduced essentially to minimum. A proposal has been made as one of the methods of solving the problem which forms interconnect conductors of a peripheral circuit in the same process when bit lines for transferring directly memory cell information to a sense amplifier of the peripheral circuit portion are formed. In other words, a technology has been proposed which forms a part of the interconnect conductors (more specifically, a first level interconnect conductor) among the interconnect conductors of the peripheral circuit portion at the same level by the same process step as the formation step of the bit lines.

This technology is described, for example in U.S. Pat. No. 5,604,365 described above and in IEDM '94, p.635.

SUMMARY OF THE INVENTION

Nonetheless, the inventors of the present invention have found out the following problems in the technology described above in which the bit line conductor of the memory cell portion and the first level interconnect conductor are formed by the same step.

In other words, it is required for the bit line to reduce its parasitic capacity in order to improve detection accuracy of charges stored in an information storage capacitor device, and it is required for an interconnect conductor of a peripheral circuit portion to secure a sufficiently low resistance in order to prevent the drop of an operation speed of the peripheral circuit portion.

To satisfy both of these requirements, the thickness of the bit line as well as the thickness of a conductor film constituting the interconnect conductor of the peripheral circuit portion must be optimized, respectively. When tungsten is employed, for example, it is necessary to set the thickness of the bit line conductor to 0.1 $\mu$m and the thickness of the interconnect conductor of the peripheral circuit portion to 0.3 $\mu$m. Therefore, it is necessary that after a thin conductor film is formed and processed on a semiconductor substrate so as to form the bit line conductor at the memory cell portion, a thick conductor film must be formed and processed on the semiconductor substrate to form the interconnect conductor in the peripheral circuit portion. As a result, not only the number of process steps but also the production time increase remarkably.

It is an object of the present invention to provide a technology which can reduce a parasitic capacity of bit lines and can also reduce a resistance of interconnect conductors of a peripheral circuit portion in a semiconductor integrated circuit device of the type in which bit lines and first level interconnect conductors are formed at the same level.

It is another object of the present invention to provide a technology which can suppress an increase of the number of process steps and can form bit line conductors having a low parasitic capacity and interconnect conductors of a peripheral circuit portion having a low resistance without increasing the production time.

The above and other objects and novel features of the present invention will become more apparent from the following description of the specification when taken in conjunction with the accompanying drawings.

According to one aspect of the present invention, there is provided a semiconductor integrated circuit device including a DRAM having a memory cell portion, a peripheral circuit portion and bit line conductors for exchanging information between the memory cell portion and the peripheral circuit portion, wherein each interconnect conductor of the peripheral circuit portion comprises a single or a plurality of conductor films, at least one layer of the conductor films is made of the same material as that of the conductor film constituting a bit line conductor and is formed at the same level as the conductor film of the bit line conductors (that is, it is formed by the same step as that of the conductor film), and the film thickness of the interconnect conductors in the peripheral circuit portion is greater than that of the bit line conductors.

In the semiconductor integrated circuit device described above, each interconnect conductor in the peripheral circuit portion (hereinafter called merely the "interconnect conductor") and each bit line conductor is formed by the same step. In consequence, the number of process steps does not increase and through-put does not drop, either. Because the film thickness of the interconnect conductor is greater than that of the bit line conductor, the resistance of the interconnect conductor can be reduced and at the same time, the parasitic capacity of the bit line conductor can be reduced by reducing the film thickness of the bit line conductor. As a result, a response speed of the peripheral circuit portion can be improved on one hand and detection accuracy of stored charges through the bit line conductor can be improved, on the other.

According to another aspect of the present invention, after circuit devices of a memory cell portion are formed at a first portion of a main surface of a semiconductor substrate and circuit devices of a peripheral circuit portion are formed at a second portion of the main surface of the semiconductor substrate, an insulating film is formed over the semiconductor substrate and conductor films are then formed on the insulating film by the same step. Bit line conductors, through which signals propagate between the memory cell portion and the peripheral circuit portion, that is, conductor portions having a first film thickness and located over the first portion of the main surface of the semiconductor substrate, and interconnect conductors in the peripheral circuit portion, that is, conductors having a second film thickness and located over the second portion of the main surface of the semiconductor substrate, are formed from the conductor films formed by the same step. The film thickness of the bit line conductors (first film thickness) is smaller than the film thickness of the interconnect conductors (second film thickness).

DESCRIPTION OF THE PREFERRED EMBODIMENTS

Figure 1:
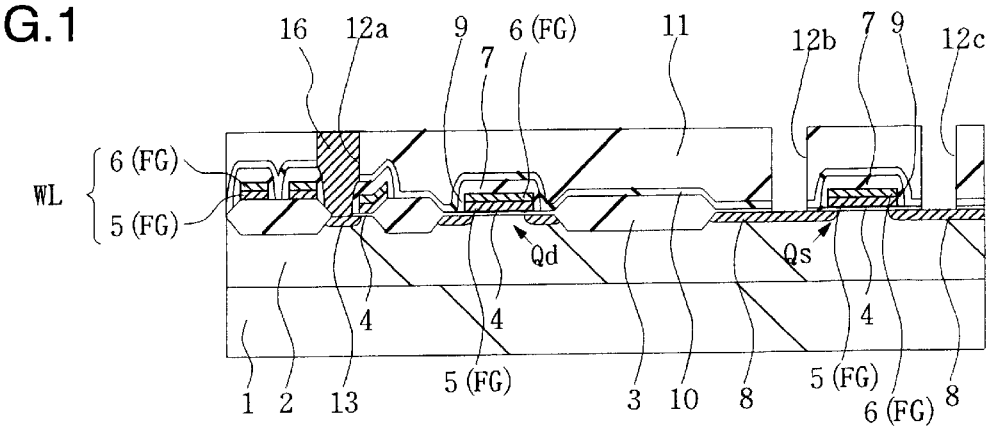
FIGS. 1 to 4 are sectional views of the principal portions of a semiconductor substrate and show a method of manufacturing a semiconductor integrated circuit device including a DRAM according to one embodiment of the present invention.

Hereinafter, some preferred embodiments of the present invention will be explained in detail with reference to the accompanying drawings. Incidentally, like reference numerals will be used throughout the entire drawings to identify like constituent elements, and repetition of the explanation will be omitted.

(Embodiment 1)

A semiconductor integrated circuit device including a DRAM and a method of manufacturing the same according to one embodiment of the present invention will be explained with reference to FIGS. 1 to 4.

Figure 4:
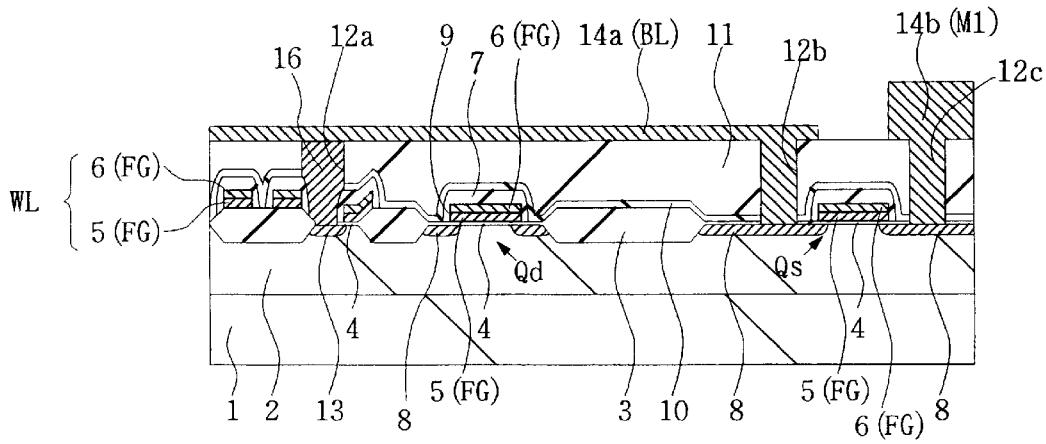

FIG. 4 is a sectional view of the principal portions of a semiconductor substrate and shows bit line conductors of a DRAM according to the first embodiment of the present invention and first level interconnect conductors in a direct peripheral circuit portion.

The DRAM in this embodiment includes a memory cell selection MISFET as a circuit device for constituting a memory cell of a memory cell portion formed at a first portion of a main surface of a semiconductor substrate 1 and an n channel MISFETQs for selectively connecting the memory cell portion to a sense amplifier of the direct peripheral circuit portion. A dummy MISFETQd is disposed in a boundary region between the memory cell portion and the peripheral circuit portion in this embodiment. However, this construction is not particularly limitative and the MISFETQd may be omitted. The memory cell portion is formed at the first portion of the main surface of the semiconductor substrate 1 and the peripheral circuit portion, at the second portion of the main surface of the semiconductor substrate 1.

A p-well 2 having a p-type conductivity is formed in the vicinity of the main surface of the semiconductor substrate 1 and a field insulating film 3 formed by a LOCOS (Local Oxidation of Silicon) method, for example, is deposited to the main surface of the p-well 2.

One of the source and drain regions of the memory cell selection MISFET is connected to an information storage capacitor device (capacitor) but it is not shown in FIG. 4. The other source and drain regions of the memory cell selection MISFET is connected to the bit line conductor BL. In this embodiment, an n type semiconductor region 13 as the other source or drain region of the memory cell selection MISFET and the bit line interconnect conductor BL are connected through a plug 16 comprising a polysilicon film.

A word line conductor WL of the DRAM is so formed as to extend in a direction traversing the bit line conductors BL and functions as a gate electrode of the memory cell selection MISFET. It is shown as the word line conductor WL formed over the field insulating film 3 in FIG. 4.

The n-channel MISFETQs and the dummy MISFETQd are formed at the main surface of the p-well 2 and each comprises a gate electrode 4 disposed through the gate insulating film 4 and n-type semiconductor regions 8 formed at the main surface of the p-wells 2 on both sides of the gate electrode. The gate electrode comprises a polysilicon film 5 so formed as to keep in touch with the gate insulating film 4 and a tungsten silicide film 6 formed as an upper layer of the polysilicon film 5. The tungsten silicide film 5 is doped with an impurity at a high concentration. Since the polysilicon film 5 constitutes a laminate film with the tungsten silicide film 6, it can reduce a series resistance of the gate electrode and can improve the read/write speed of the DRAM.

Sidewall spacers 9 are formed on both sides of the gate electrode and a silicon nitride film 7 as a cap insulating film is formed above the gate electrode.

A silicon oxide film 10 is formed in such a manner as to cover the field insulating film 3, the memory cell selection MISFET, the n-channel MISFETQs and the dummy MISFETQd. A BPSG film 11 is deposited on the silicon oxide film 10 and its surface is planarized.

The bit line conductor BL and the first level interconnect conductor M1 as the first level interconnect conductor are formed on the BPSG film 11. The bit line conductor BL is formed to extend in the memory cell portion of the DRAM, in a portion of the peripheral circuit portion of the RAM which opposes the memory cell portion and in a boundary region interposed between the memory cell portion and the peripheral circuit portion, and the first level interconnect conductor M1 is formed inside the peripheral circuit portion of the DRAM. In consequence, the bit line conductor BL connects the memory cell portion and the peripheral circuit portion with each other in order to exchange information between them.

As shown in FIG. 4, each of the bit line conductor BL and the first level interconnect conductor M1 comprises a tungsten (W) film 14a, 14b of the same level. In this embodiment, the film thickness of the bit line conductor BL is different from that of the first level interconnect conductor M1 above the n-channel MISFETQs, which selectively connects the memory cell portion to the sense amplifier of the direct peripheral circuit portion, as the boundary, and the thickness of the W film 14b constituting the first level interconnect conductor M1 is greater than that of the W film 14a constituting the bit line conductor BL.

Besides the construction described above, the DRAM according to this embodiment includes an information storage capacitor device and the second level interconnect conductor or the third level interconnect conductor. Since known information storage capacitor devices and interconnect conductors can be applied, however, the explanation will be hereby omitted.

As described above, the bit line conductor BL and the first level interconnect conductor M1 are constituted by the tungsten film of the same level, and the film thickness of the bit line conductor BL is different from that of the first level interconnect conductor M1. Further, because the film thickness of the bit line conductor BL can be made small irrespective of the film thickness of the first level interconnect conductor M1, the parasitic capacity of the bit line conductor BL can be reduced. Consequently, detection accuracy of the stored charges of the information storage capacitor device can be improved. On the other hand, because the film thickness of the first level interconnect conductor M1 can be made large irrespective of the film thickness of the bit line conductor BL, the resistance of the first level interconnect conductor M1 can be reduced and the operation speed of the peripheral circuit can be improved.

Next, a method of manufacturing the first level interconnect conductor in the bit line conductor and the direct peripheral circuit portion of the DRAM in the semiconductor integrated circuit device according to one embodiment of the present invention will be explained with reference to FIGS. 1 to 4.

On the main surface of the semiconductor substrate 1 made of a p-type silicon single crystal are formed serially the p-well 2 by a known method such as ion implantation, the field insulating film 3 by the LOCOS method and the gate insulating film 4 by the thermal oxidation method, as shown in FIG. 1.

Next, the polysilicon film 5 into which phosphorus (P) is introduced, the tungsten silicide film (WSix) film 6, the silicon oxide film (not shown) and the silicon nitride film 7 are consecutively deposited over the semiconductor substrate 1. A laminate film comprising the silicon nitride film 7, the silicon oxide film, the WSix film 6 and the polysilicon film 5 is serially etched by using a photoresist as a mask, thereby forming the gate electrode FG of the memory cell selection MISFET of the memory cell portion and the gate electrode FG of the n-channel MISFETQs comprising the WSix film 6 and the polysilicon film 5.

Though this embodiment uses the WSix film 6 over the gate electrode FG, it is also possible to use other metal silicide films such as a molybdenum silicide (MoSix) film, a titanium silicide (TiSix) film or a tantalum silicide (TaSix) film.

Next, thermal oxidation is applied to the semiconductor substrate 1 to form a thin silicon oxide film (not shown) on the sidewalls of the WSix film 6 and the polysilicon film 5 constituting the gate electrode FG.

An n type impurity such as P is implanted into the p-well 2 by using photoresist and the laminate film comprising the silicon nitride film 7, the silicon oxide film, the WSix film 6 and the polysilicon film 5 as the mask in such a manner as to form an n type semiconductor region (source/drain region) of the n-channel MISFETQs in the self-alignment with the gate electrode FG.

The silicon nitride film deposited over the semiconductor substrate 1 is anisotropically etched by an RIE (Reactive Ion Etching) method, or the like, to form a sidewall spacers 9 on the sidewalls of the gate electrodes FG of all the n-channel MISFETs.

Incidentally, it is possible to form the source/drain region of the n-channel MISFETQs into an LDD (Lightly Doped Drain) structure by implanting the ions of a high concentration n-type impurity such as arsenic (As) after the sidewall spacer 9 is formed as described above.

Next, the silicon oxide film 10 and the BPSG (Boron Phospho-Silicate Glass) film 11 are deposited over the semiconductor substrate 1 by a CVD (Chemical Vapor Deposition) method and the surface of the BPSG film 11 is planarized by a reflow processing at 900 to 950° C. Incidentally, CMP (Chemical Mechanical Polishing) may be used in combination for planarizing the surface of the BPSG film 11.

Next, the BPSG film 11, the silicon oxide film 10 and the insulating film which is at the same level as the gate insulating film 4 are serially etched by using the photoresist as the mask so as to define contact hole 12a on the p-well 2 to which the bit line conductors BL are to be connected later. Thereafter, the polysilicon film 16 into which P is introduced is deposited over the semiconductor substrate 1 by the CVD process and is then etched back so as to bury the polysilicon film 16 into the contact hole 12a. In this instance, diffusion of P from the polysilicon film 16 forms one of the n type semiconductor regions 13 of the memory cell selection MISFET in the p-well 2 of the memory cell portion.

The BPSG film 11, the silicon oxide film 10 and the insulating layer which is at the same level as the gate insulating film 4 are serially etched by using the photoresist as the mask so as to form contact holes 12b and 12c on the n-type semiconductor region 8 of the n-channel MISFETQs.

Figure 2:
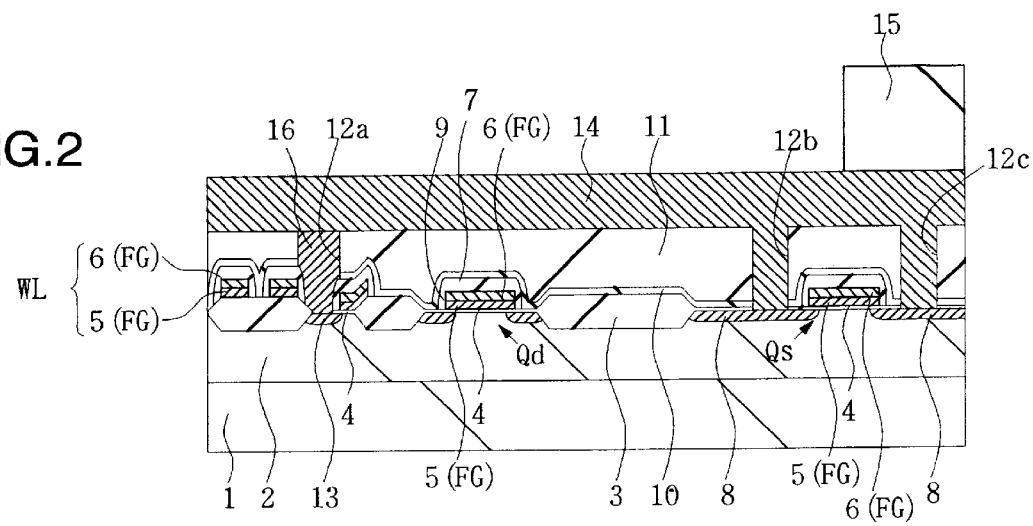
Figure 3:
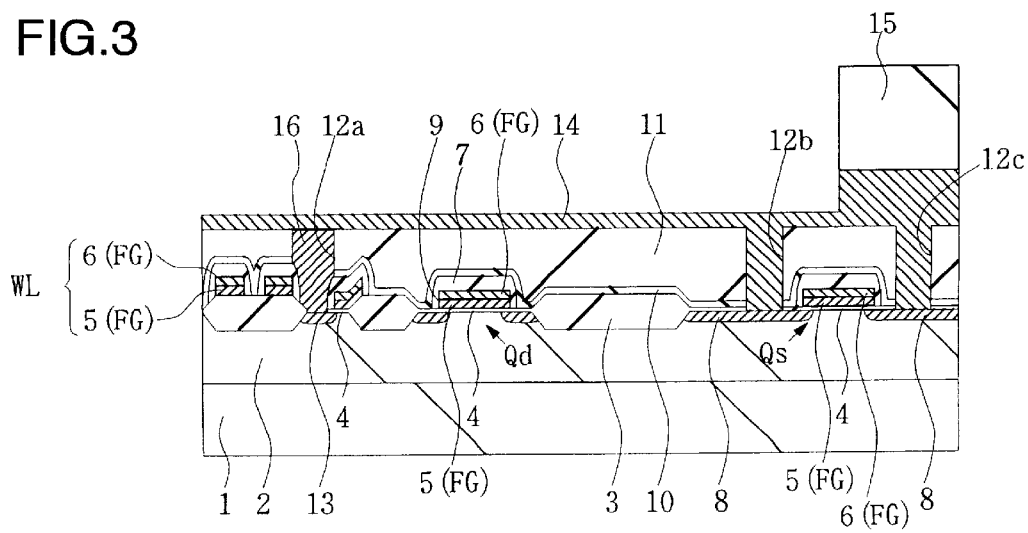

Next, after a conductive film such as a W film 14 is deposited over the semiconductor substrate 1 by the CVD process as shown in FIG. 2, a photoresist pattern 15 is formed at the region of the semiconductor substrate 1 where the bit line conductor BL is not formed, that is, the region where the film thickness of the conductor film is desired to be increased. Here, the photoresist pattern 15 is formed in such a manner as to cover the right-hand portion of the boundary line represented by II in FIG. 22, that is, the peripheral circuit portion formed at the second portion of the main surface of the semiconductor substrate 1. In this case, the W film 14 so deposited has a film thickness satisfying the wiring resistance of the first level interconnect conductor M1 disposed in the direct peripheral circuit portion.

The thickness of the W film 14 in the region where the bit line conductor BL is formed is reduced by etch-back by using the photoresist pattern 15 as the mask until the bit line conductor BL can acquire a predetermined parasitic capacity.

After the photoresist pattern 15 is removed as shown in FIG. 4, the W film 14 is etched by using a photoresist, which is formed afresh, as the mask, so as to form the bit line conductor BL constituted by the W film 14a and the first level interconnect conductor M1 constituted by the W film 14b.

Thereafter, an information storage capacitor device is constituted by forming a storage electrode, a capacity insulating film and a plate electrode in the memory cell portion, and the interconnect conductors of the second et seq levels are formed. Finally, the surface of the semiconductor substrate 1 is covered with a passivation film and a semiconductor integrated circuit device according to this embodiment is completed.

In this embodiment 1, the contact hole 12a is buried by the polysilicon film 16 and the contact holes 12b and 12c are buried by the bit line conductor BL or by the W film 14 having the same level as the first level interconnect conductor M1. However, it is also possible to bury a blanket W in advance into the contact holes 12b and 12c by a blanket W-CVD process and then to deposit the W film 14 over the semiconductor substrate 1. It is further possible to bury the contact holes 12a to 12c by the bit line conductor BL or the W film 14 having the same level as the first level interconnect conductor M1 after the contact holes 12a to 12c are formed simultaneously.

The manufacturing method of this embodiment can form the bit line conductor BL having a small film thickness and the first level interconnect conductor M1 having a large film thickness.

(Embodiment 2)

A method of manufacturing bit line conductors and first level interconnect conductors of a direct peripheral circuit of a DRAM according to another embodiment of the present invention will be described with reference to FIGS. 5 to 8.

Since the DRAM in the second embodiment of the present invention has substantially the same construction as that of the DRAM of the first embodiment, the explanation will be given on only the different portions.

First, a memory cell selection MISFET of a memory cell portion and an n-channel MISFETQs are formed on a semiconductor substrate 1 in the same way as in the first embodiment as shown in FIG. 1, and a silicon oxide film 10 and a planarized BPSG film 11 are formed over the semiconductor substrate 1.

Figure 5:
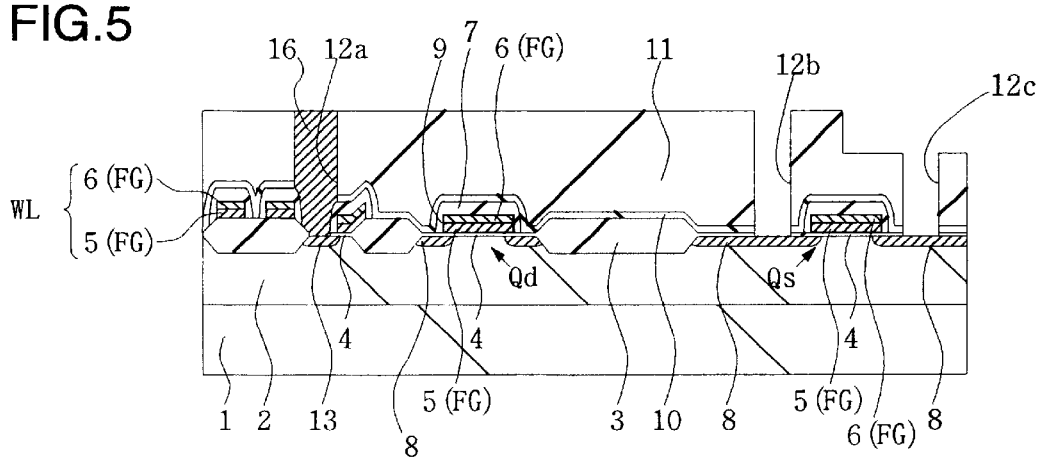
FIGS. 5 to 8 are sectional views of the principal portion of a semiconductor substrate and show a method of manufacturing a semiconductor integrated circuit device including a DRAM according to another embodiment of the present invention.

Next, the surface of the BPSG film 11 of the direct peripheral circuit portion is etched back by a dry etching process by using a photoresist as a mask as shown in FIG. 5. The photoresist has a pattern such that it covers at least the memory cell portion formed at the first portion of the main surface of the semiconductor substrate and exposes the peripheral circuit portion, and its boundary is represented by boundary line II shown in FIG. 22. In this instance, the etchback quantity of the BPSG film 11 is set so that a level difference between the top faces of the memory cell portion and the direct peripheral circuit portion is identical with a predetermined difference of thickness between the bit line conductor BL and the first level interconnect conductor M1. In other words, the BPSG film (insulating film) 11 of the direct peripheral circuit portion is etched by the difference of film thickness between the bit line conductor BL and the interconnect conductor 11.

Next, the BPSG film 11, the silicon oxide film 10 and the insulating film having the same level as the gate insulating film 4 are serially etched by using the photoresist as the mask so as to form a contact hole 12a, to which the bit line conductor BL is to be connected later, on the p-well 2. A polysilicon film 16 into which P is introduced is deposited over the semiconductor substrate 1 by a CVD process and is then etched back to bury the polysilicon film 16 into the contact hole 12a. Incidentally, diffusion of P from the polysilicon film 16 forms one of the n-type semiconductor regions 13 of the memory cell selection MISFET in the p-well 2 of the memory cell portion.

The BPSG film 11, the silicon oxide film 10 and the insulating film having the same level as the gate insulating film 4 are then etched serially to form contact holes 12b and 12c on the n-type semiconductor region 8 of the n-channel MISFETQs.

Figure 6:
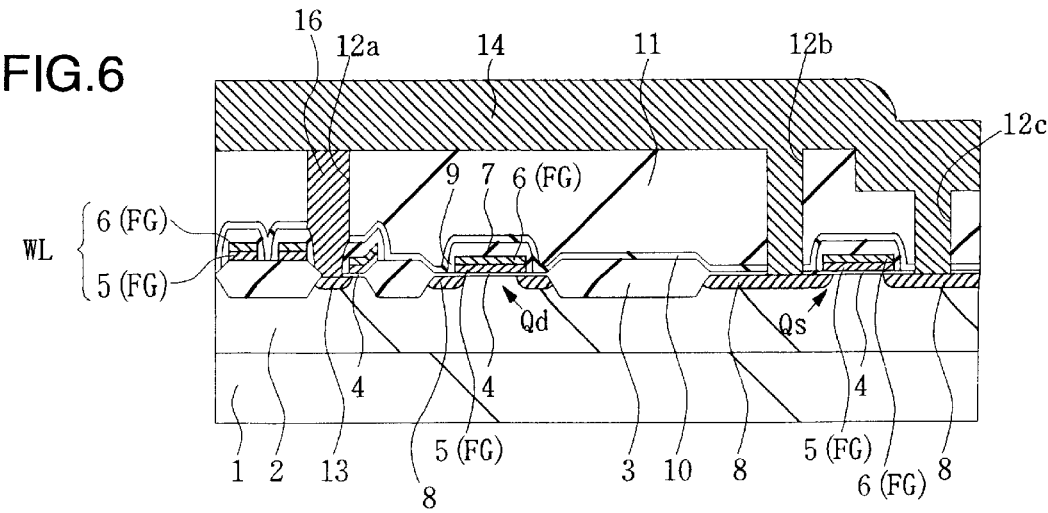
Figure 7:
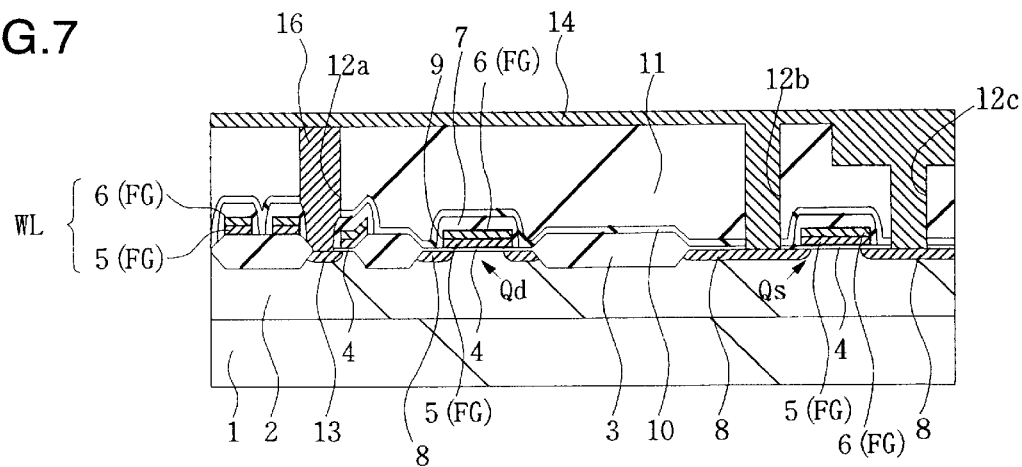

Next, as shown in FIG. 6, a conductor film such as a W film 14 is deposited over the semiconductor substrate 1 by the CVD process. In this instance, the W film 14 has a greater film thickness than the thickness required for the first level interconnect conductor M1 disposed in the direct peripheral circuit portion. The surface of the W film 14 is then planarized by a CMP process, for example, as shown in FIG. 7 so as to reduce the thickness of the W film 14 to a predetermined thickness necessary for the bit line conductor BL and the first level interconnect conductor M1.

Figure 8:
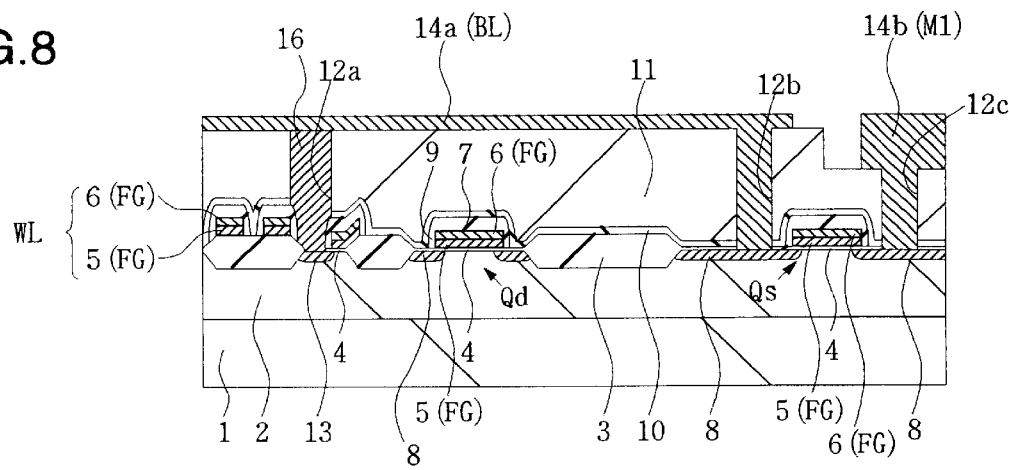

Next, the W film 14 is etched by using the photoresist as the mask as shown in FIG. 8 so as to constitute the bit line conductor BL comprising the W film 14a and the first level interconnect conductor M1 comprising the W film 14b.

The second embodiment described above can form the bit line conductor BL and the first level interconnect conductor M1 in mutually different film thickness and can form the bit line conductor BL in a smaller film thickness than the first level interconnect conductor in the same way as the semiconductor integrated circuit device of the first embodiment. Therefore, the parasitic capacity of the bit line conductor BL as well as the resistance of the first level interconnect conductor M1 can be reduced.

Since the surface of the W film 14 is planarized in this second embodiment, the patterning step for forming the bit line conductor BL and the first level interconnect conductor M1 by etching the W film 14 becomes easier. In other words, the margin in the photo-lithography step can be increased because the W film 14 is not patterned under the state where any step exists, but is etched under the planarized state.

(Embodiment 3)

A method of manufacturing bit line conductors and first level interconnect conductors of a direct peripheral circuit portion of a DRAM in a semiconductor integrated circuit device according to a third embodiment of the present invention will be explained with reference to FIG. 9.

The surface of the BPSG film 11 deposited over the direct peripheral circuit portion of the semiconductor substrate 1 is etched back so that a level difference between the top faces of the memory cell portion and the direct peripheral circuit portion is identical with the difference of the film thickness between the bit line conductor BL and the first level interconnect conductor M1 in the same way as in the manufacturing method of the second embodiment.

Figure 9:
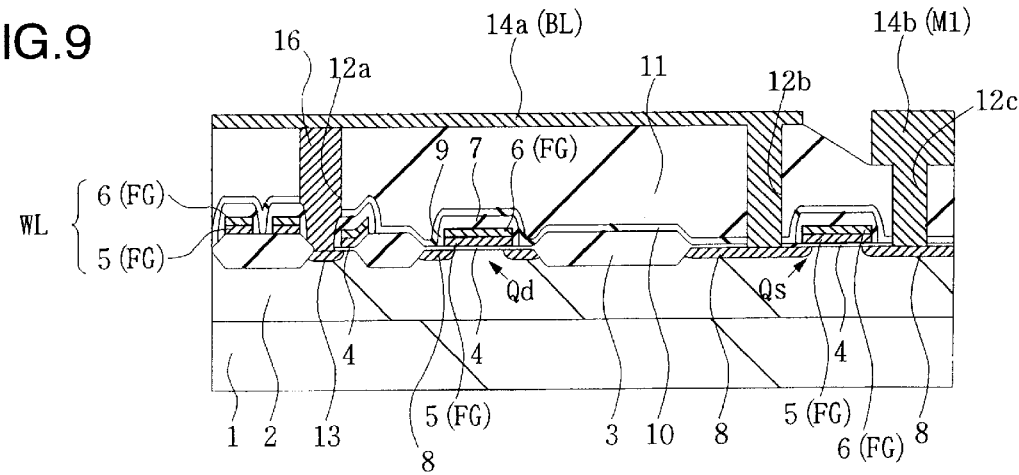
FIG. 9 is a sectional view of the principal portion of a semiconductor substrate and shows a method of manufacturing a semiconductor integrated circuit device including a DRAM according to still another embodiment of the present invention.

Whereas the surface of the BPSG film 11 of the direct peripheral circuit portion is etched back by the dry etching method in the second embodiment, the surface of the BPSG film 11 is etched back by wet etching as shown in FIG. 9 in this third embodiment. In consequence, the step shape of the boundary between the memory cell portion and the direct peripheral circuit portion can be made gentle (into a slope), and step coverage at the boundary between the film, which is to be later deposited over the semiconductor substrate 1, and the direct peripheral circuit portion can be improved.

Next, the contact hole 12a, the polysilicon film 16 and the contact holes 12b and 12c are formed, respectively, in the same way as in the manufacturing method of the second embodiment, and one of the n-type semiconductor regions 13 of the memory cell selection MISFET is formed. Next, a W film 14 is deposited over the semiconductor substrate 1 by the CVD process. In this instance, the W film 14 is formed into a greater film thickness than the thickness required for the first level interconnect conductor M1 disposed in the direct peripheral circuit portion.

The thickness of the W film 14 is then reduced to a predetermined thickness necessary for the bit line conductor BL and the first level interconnect conductor M1 by planarizing the surface of the W film 14 by the CMP process, for example. The W film 14 is etched by using a photoresist as a mask so as to constitute the bit line conductor BL comprising the W film 14a and the first level interconnect conductor M1 comprising the W film 14b.

Since the surface of the BPSG film 11 is gently etched according to this third embodiment, the margin of the deposition and etching steps of the W film 14 can be improved.

(Embodiment 4)

A method of manufacturing bit line conductors and first level interconnect conductors of a direct peripheral circuit portion of a DRAM in a semiconductor integrated device according to the fourth embodiment of the present invention will be explained with reference to FIGS. 10 to 13.

After a memory cell selection MISFET of a memory cell portion and an n-channel MISFETQs are formed on a semiconductor substrate 1 as shown in FIG. 1 in the same way as in the manufacturing method of the first embodiment, a silicon oxide film 10 and a planarized BPSG film 11 are formed over the semiconductor substrate 1.

Figure 10:
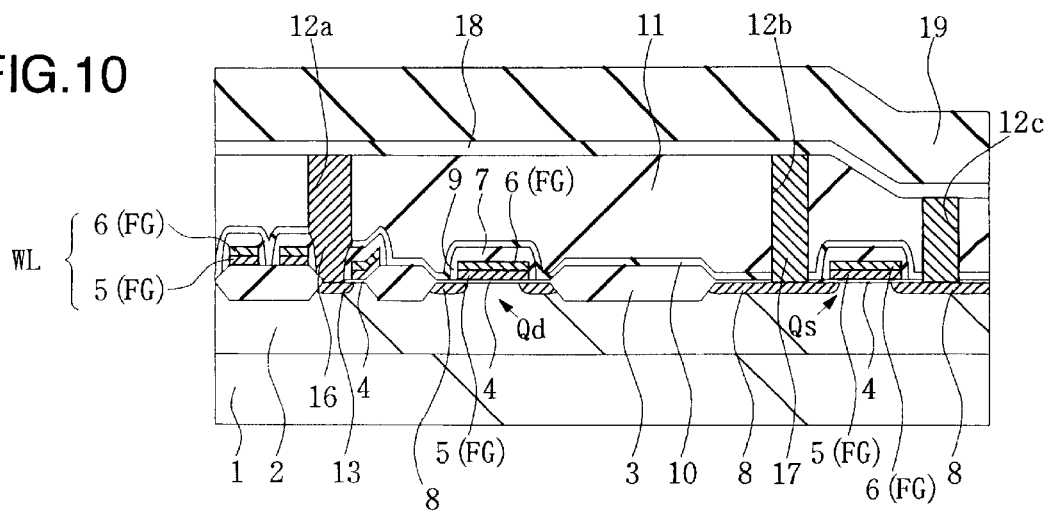
FIGS. 10 to 13 are sectional views of the principal portions of a semiconductor substrate and show a method of manufacturing a semiconductor integrated circuit device according to still another embodiment of the present invention.

Next, the BPSG film 11, the silicon oxide film 10 and an insulating film having the same level as the gate insulating film 4 are serially etched as shown in FIG. 10 so as to form a contact hole 12a, to which a bit line conductor BL is to be later connected, on the p-well 2 of the memory cell portion. Subsequently, a polysilicon film 16 into which P is introduced is deposited over the semiconductor substrate 1 by the CVD process and is then etched back to bury the polysilicon film 16 into the contact hole 12a. Incidentally, diffusion of P from the polysilicon film 16 forms one of the n-type semiconductor regions 13 of a memory cell selection MISFET in the p-well 2 of the memory cell portion.

The surface of the BPSG film 11 of the direct peripheral circuit portion is the etched back by wet etching by using a photoresist, which covers at least the memory cell portion formed at the first portion of the main surface of the semiconductor substrate, as the mask. In this instance, the etchback quantity of the BPSG film 11 is set so that a level difference between the top faces of the film 11 of the memory cell portion and the film 11 of the direct peripheral circuit portion is identical with the difference of the film thickness between the bit line conductor BL and the first level interconnect conductor M1.

Next, the BPSG film 11, the silicon oxide film 10 and the insulating film having the same level as the gate insulating film 4 are serially etched by using the photoresist as the mask so as to form contact holes 12b and 12c on the n-type semiconductor region 8 of the n-channel MISFETQs. Thereafter, a W film 17 is deposited over the semiconductor substrate 1 by the CVD process and is then etched back so as to bury the W film 17 into the contact holes 12b and 12c. In this instance, an interconnection layer of a barrier metal layer comprising a laminate film of a titanium nitride film and a titanium film, for example, may be interposed between the W film 17 and the n-type semiconductor region 8. This barrier metal layer prevents WF6 used for forming the W film 17 from entering the semiconductor substrate.

A silicon nitride film 18 and a silicon oxide film 19 are serially deposited over the semiconductor substrate 1.

Figure 11:
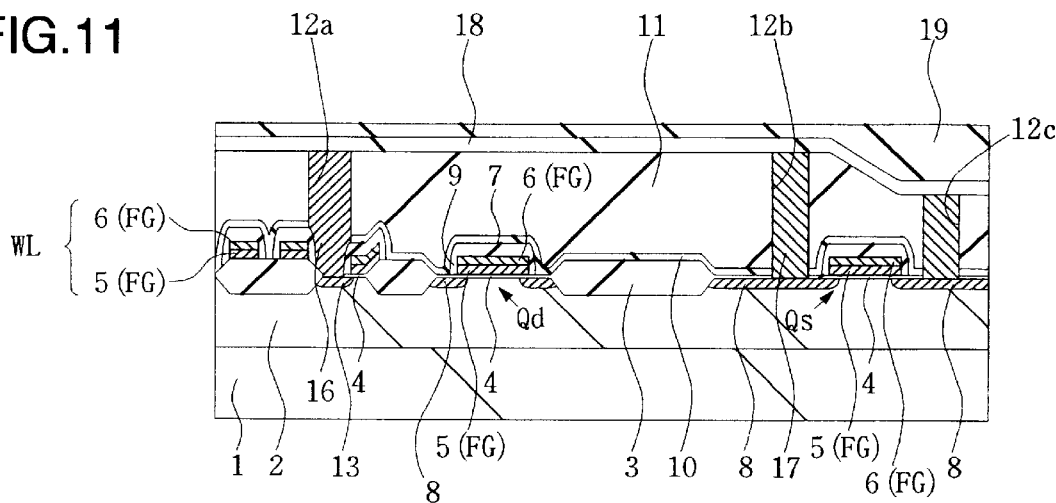

Next, as shown in FIG. 11, the surface of the silicon oxide film 19 is planarized by the CMP process and at the same time, the thickness of the silicon oxide film 19 is controlled so that the sum of the thickness of the silicon oxide film 19 located at least at the memory cell portion and at the direct peripheral circuit portion and the thickness of silicon nitride film 18 has two values substantially identical with the thickness of the bit line conductor BL and the thickness of the first level interconnect M1 that are to be later formed, respectively.

In this fourth embodiment, a level difference is provided between the top face of the film 11 of the memory cell portion and the top face of the film 11 at the direct peripheral circuit portion by etching back the surface of the BPSG film 11 by wet etching, but dry etching may be employed, as well. In addition, the silicon oxide film 19 may be processed without providing the level difference with the top face of the BPSG film 11 so that the thickness of the silicon oxide film 19 is substantially equal to the thickness of the bit line conductor BL and the thickness of the silicon oxide film 19 of the direct peripheral circuit portion is substantially equal to the thickness of the first level interconnect conductor.

Figure 12:
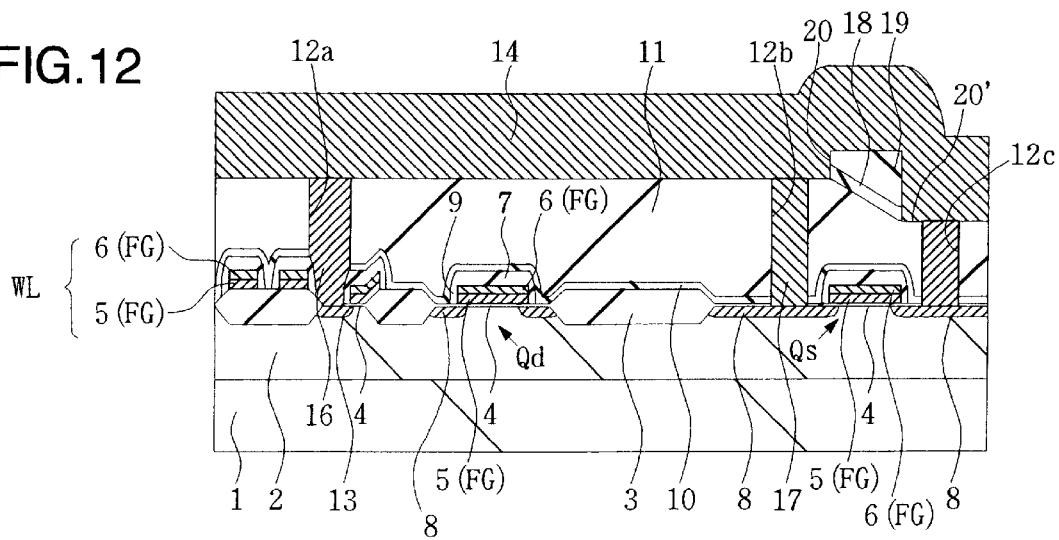

Next, as shown in FIG. 12, the silicon oxide film 19 is etched by using a photoresist as a mask and trenches 20 and 20' are formed in the region where the bit line BL and the first level interconnect conductor M1 are to be later formed. After the exposed silicon nitride film 18 is removed, the W film 14 is deposited over the semiconductor substrate 1 by the CVD process. In this instance, the W film 14 so deposited has a thickness which satisfies at least the resistance of the interconnect conductor M1 to be later disposed in the direct peripheral circuit portion.

Figure 13:
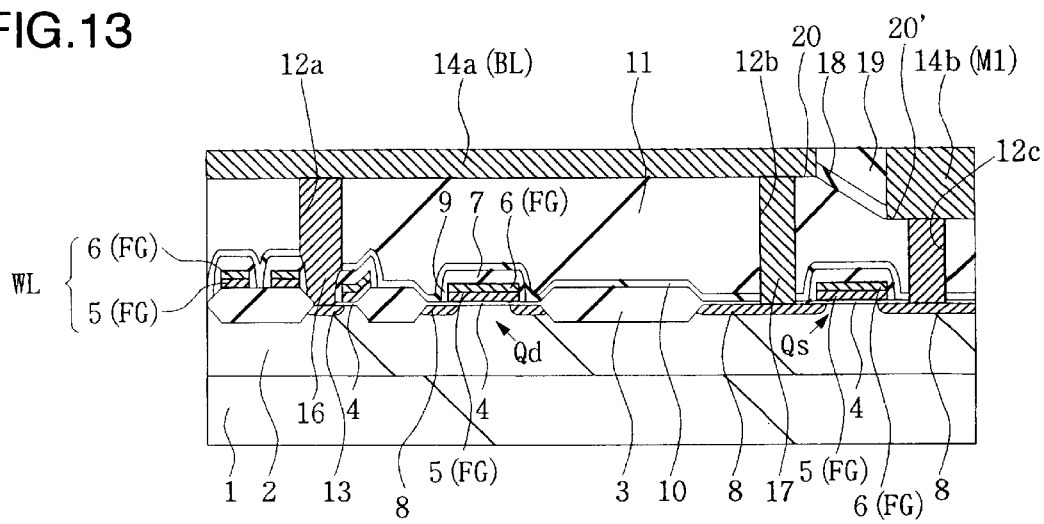
Figure 14:
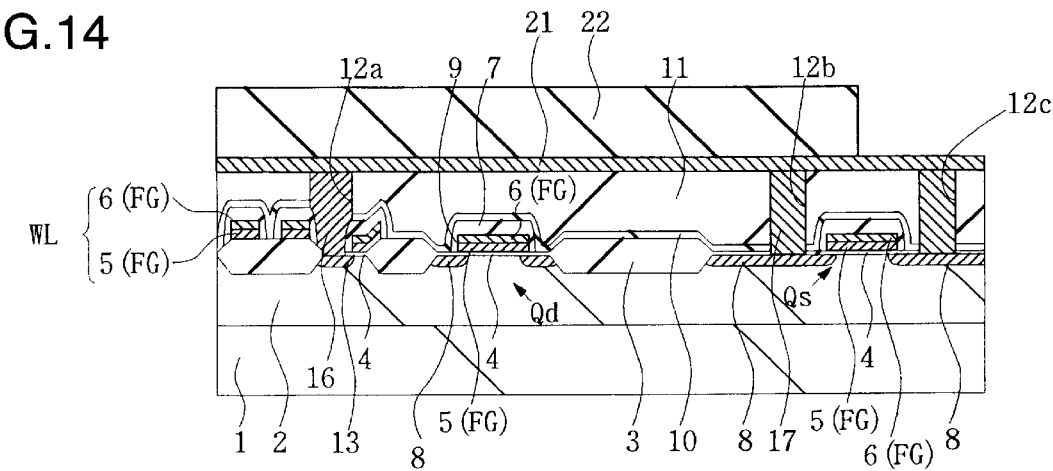
FIGS. 14 to 17 are sectional views of the principal portions of a semiconductor substrate and show a method of manufacturing a semiconductor integrated circuit device including a DRAM according to still another embodiment of the present invention.

Next, the surface of the W film 14 is planarized by the CMP process, for example, as shown in FIG. 13, and the bit line conductor BL comprising the W film 14a and the first level interconnect conductor M1 comprising the W film 14b are formed inside the trenches 20 and 20'.

According to the fourth embodiment, the surface of the films deposited over the semiconductor substrate 1 are planarized, the silicon oxide film 19 and the silicon nitride film 18 are then etched so as to form the trenches 20 and 20' and thereafter the surface of the W film 14 deposited over the semiconductor substrate 1 is planarized. However, it is also possible to form the trenches 20 and 20' in the silicon oxide film 19 and the silicon nitride film 18 deposited over the semiconductor substrate 1, then to deposit the W film 14 and thereafter to planarize simultaneously the surfaces of the W film 14 and the silicon oxide film 19.

The fourth embodiment can form the bit line conductor BL and the first level interconnect conductor M1 into the mutually different film thickness and can make the bit line conductor BL thinner than the first level interconnect conductor M1. Therefore, the parasitic capacity of the bit line conductor BL as well as the resistance of the first level interconnect conductor M1 can be reduced.

Since the surface of the silicon oxide film 19 is planarized in the fourth embodiment, the focus margin in the patterning step of the silicon oxide film 19 can be increased and processing can be facilitated.

According to the fourth embodiment, further, the bit line conductor BL and the first level interconnect conductor M1 can be formed by a so-called "Damascene method", and very small interconnect conductors can be formed.
(Embodiment 5)

A method of manufacturing bit line conductors and first level interconnect conductor of a direct peripheral circuit of a DRAM in a semiconductor integrated circuit device according to a fifth embodiment of the present invention will be explained with reference to FIGS. 14 to 17.

After a memory cell selection MISFET and an n-channel MISFETQs are formed on a semiconductor substrate 1 in the same way as the manufacturing method of the first embodiment, a silicon oxide film 10 and a planarized BPSG film 11 are formed over the semiconductor substrate 1.

Next, the BPSG film 11, the silicon oxide film 10 and an insulating film having the same level as a gate insulating film 4 are serially etched by using a photoresist as a mask so as to form a contact hole 12a on a p-well 2 of the memory portion to which the bit line conductor BL is to be later connected. A polysilicon film 16 to which P is doped is deposited over the semiconductor substrate 1 by the CVD process and is then etched back so as to bury the polysilicon film 16 into the contact hole 12a. Incidentally, diffusion of P from the polysilicon film 16 forms one of the n-type semiconductor regions 13 of the memory cell selection MISFET in the p-well 2 of the memory cell portion.

The BPSG film 11, the silicon oxide film 10 and the insulating film having the same level as the gate insulating film 4 are serially etched to form contact holes 12b and 12c on the n-type semiconductor region of the n-channel MIS-FETQs. A W film 17 is then deposited over the semiconductor substrate 1 by the CVD process and is etched back so as to bury the W film 17 into these contact holes 12b and 12c.

Next, the first W film 21 is deposited over the semiconductor substrate 1. Here, the first W film 21 has a thickness necessary for constituting the bit line conductor BL. Next, after the silicon oxide film 22 is deposited over the semiconductor substrate 1, the silicon oxide film 22 located at the direct peripheral circuit portion is etched by using a photoresist as a mask. This photoresist has a pattern which covers at least the memory cell portion formed at the first portion of the main surface of the substrate and exposes the peripheral circuit portion, and an edge portion of the photoresist pattern is represented by the boundary line of FIG. 22. Incidentally, the thickness of the silicon oxide film 22 is greater than a difference between the thickness of the bit line conductor BL and the thickness of the first level interconnect conductor M1 that are to be later formed.

Figure 15:
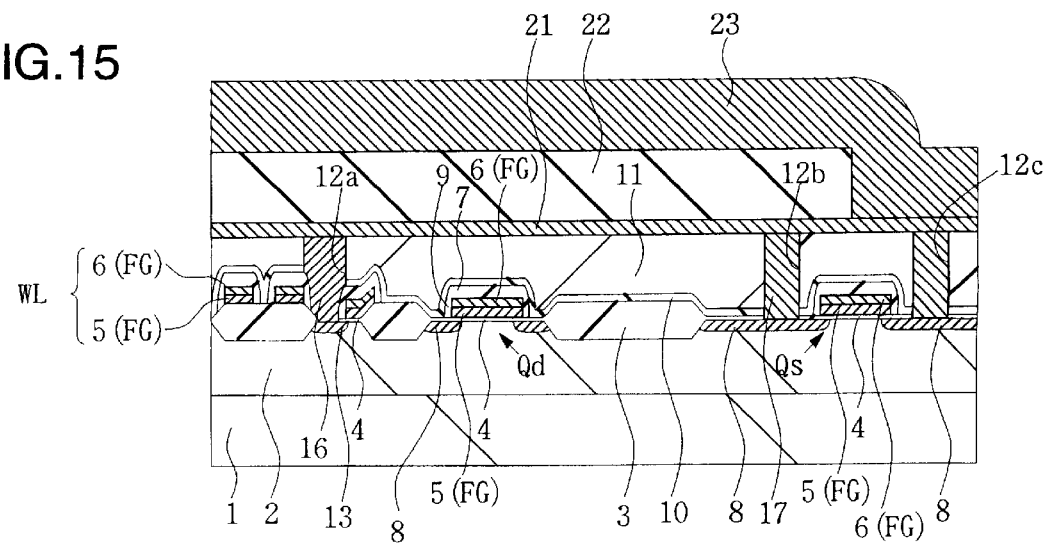
Figure 16:
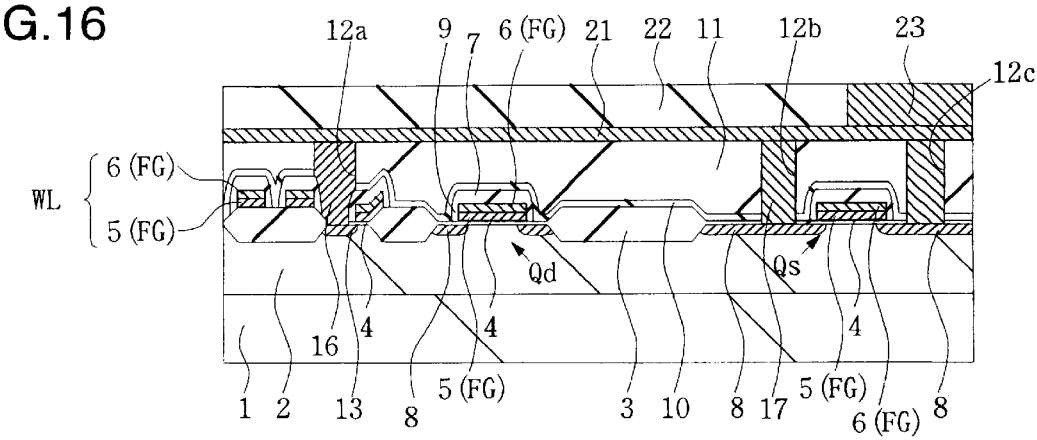

After the second W film 23 is deposited over the semiconductor substrate 1 as shown in FIG. 15, the surfaces of the second W film 23 and the silicon oxide film 22 are polished by the CMP method, for example, as shown in FIG. 16 in such a manner as to leave the second W film 23 at only the direct peripheral circuit portion.

Figure 17:
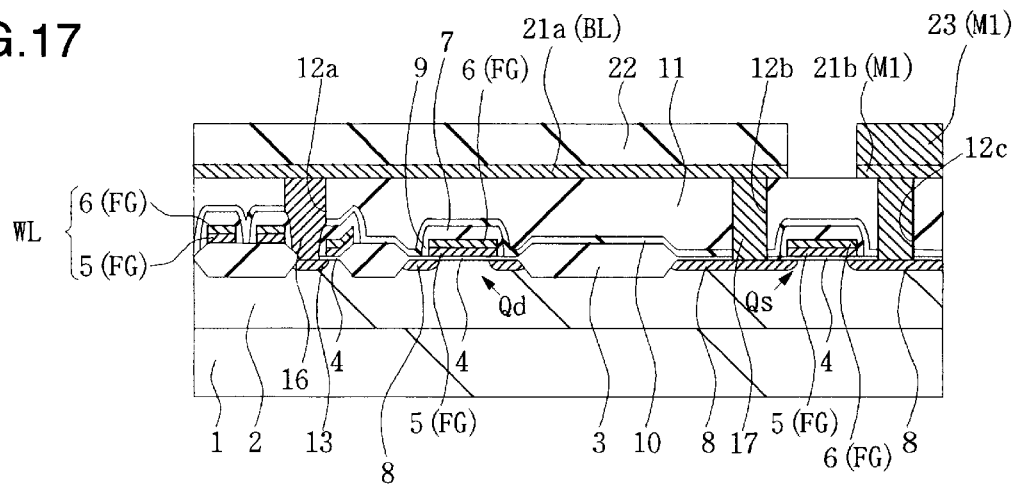

Thereafter, the silicon oxide film 22, the second W film 23 and the first W film 21 in the region as the boundary between the memory cell portion and the direct peripheral circuit portion are serially etched by using the photoresist as the mask as shown in FIG. 17 so as to form the bit line conductor BL comprising the first W film 21a and the first level interconnect conductor M1 comprising a laminate film of the second W film 23 and the first W film 21b.

The fifth embodiment of the present invention can form the bit line conductor BL and the first level interconnect conductor M1 into mutually different film thicknesses so that the bit line conductor BL is formed to a smaller thickness than that of the first level interconnect conductor M1. Therefore, this embodiment can reduce the parasitic capacity of the bit line conductor BL as well as the resistance of the first level interconnect conductor M1.

In this fifth embodiment, the surface of the silicon oxide film 22 and that of the second W film 23 are planarized. For this reason, the focus margin in the patterning step of the silicon oxide film 22 and the second W film 23 can be increased and processing can be made easier.

According to the fifth embodiment, further, the film thickness of the bit line conductor BL can be limited by only the deposition of the first W film 21a. Consequently, process variance is small and the bit line conductor BL can be formed with high uniformity. As a result, symmetry of the bit line conductors BL interposing the sense amplifier between them can be improved and consequently, the sensitivity of the sense amplifier can be improved.

(Embodiment 6)

Figure 18:
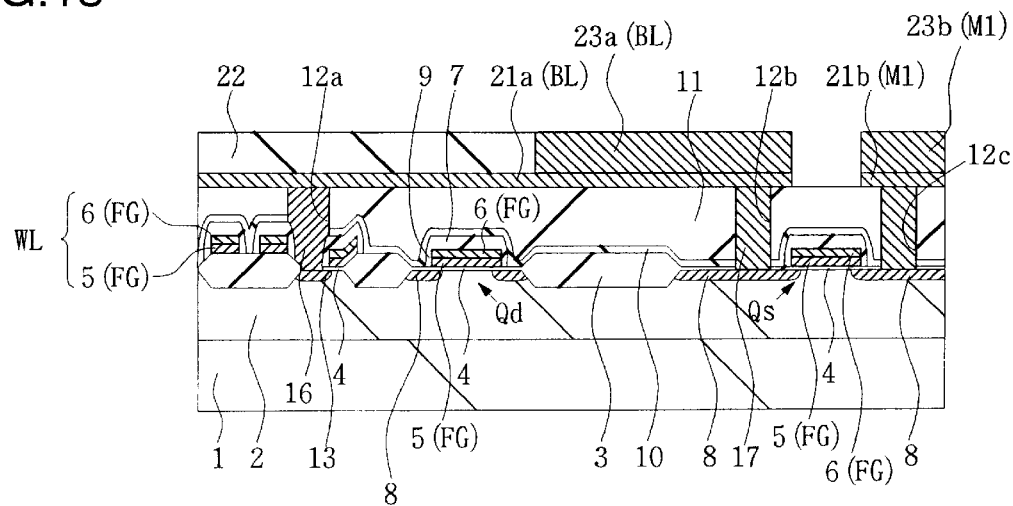
FIG. 18 is a sectional view of the principal portion of a semiconductor substrate and shows a method of manufacturing a semiconductor integrated circuit device according to still another embodiment of the present invention.

Bit line conductors BL and first level interconnect conductors of a direct peripheral circuit portion of a DRAM of a semiconductor integrated circuit device according to the sixth embodiment of the present invention will be explained with reference to FIG. 18.

In the fifth embodiment described above, the bit line conductor BL is constituted by the first W film 21a while the first level interconnect conductor M1 is constituted by the laminate film of the second W film 23 and the first W film 21b. The bit line conductor BL and the first level interconnect conductor M1 are separated from each other at the n-channel MISFETQs which selectively connects the memory cell portion and the sense amplifier of the direct peripheral circuit portion. In this sixth embodiment, however, the second W film 23 extends to the boundary region adjacent to the direct peripheral circuit portion outside the memory cell as shown in FIG. 18. and the bit line conductor BL of this region is constituted by the second W film 23a and the first W film 21a while the first level interconnect conductor M1 is constituted by the laminate film of the second W film 23b and the first W film 21b.

In other words, because the second W film 23 extends to the boundary region adjacent to the direct peripheral circuit portion, the process margin in the region as the boundary between the memory cell portion and the direct peripheral circuit portion can be improved, and the problem that the first level interconnect conductor M1 is constituted by only the first W film 21b and becomes thin due to mis-alignment or over-etching can be prevented.

(Embodiment 7)

Figure 19:
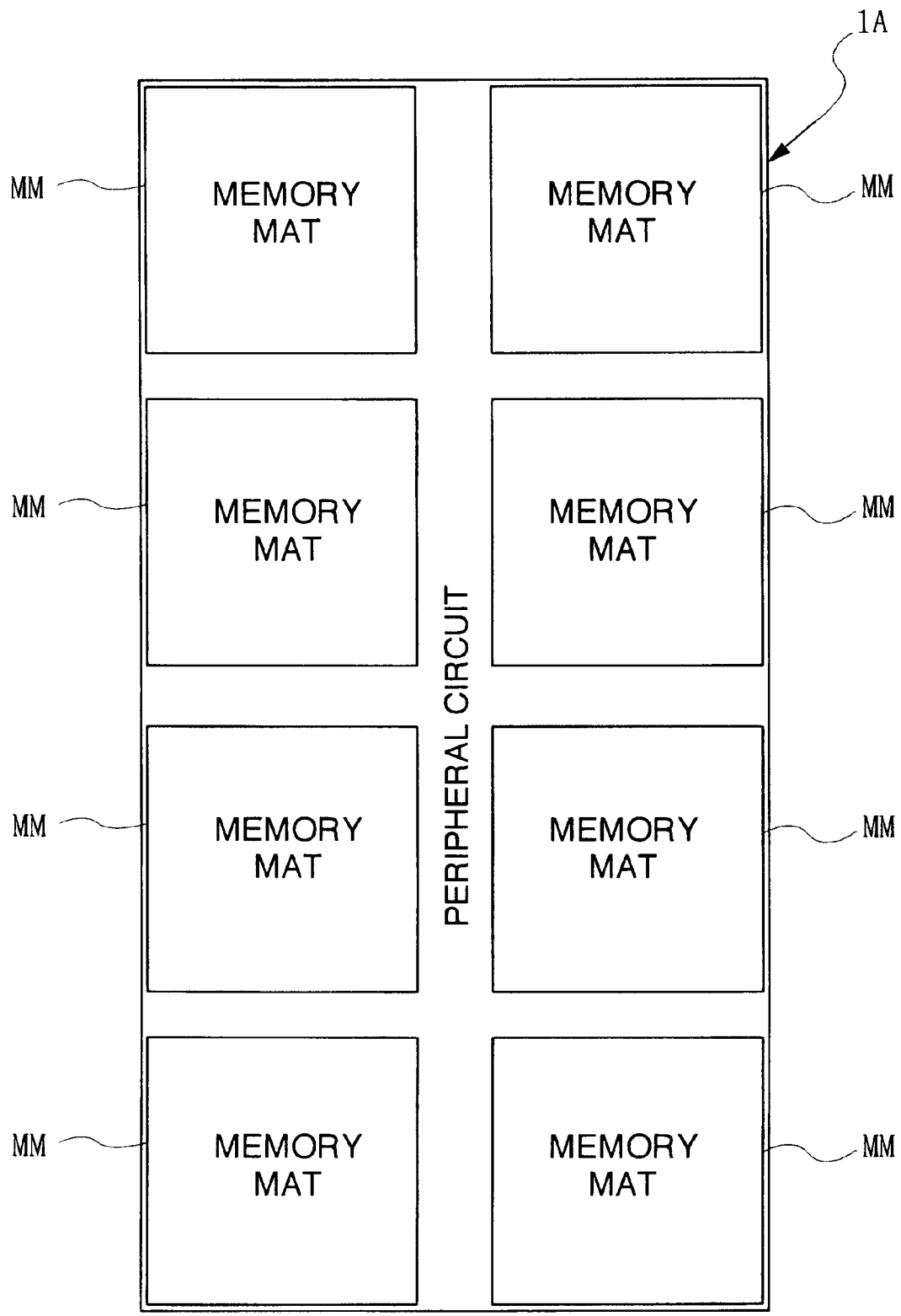
FIG. 19 is an overall plan view of a semiconductor chip on which semiconductor integrated circuit devices including a DRAM are formed, according to still another embodiment of the present invention.
Figure 20:
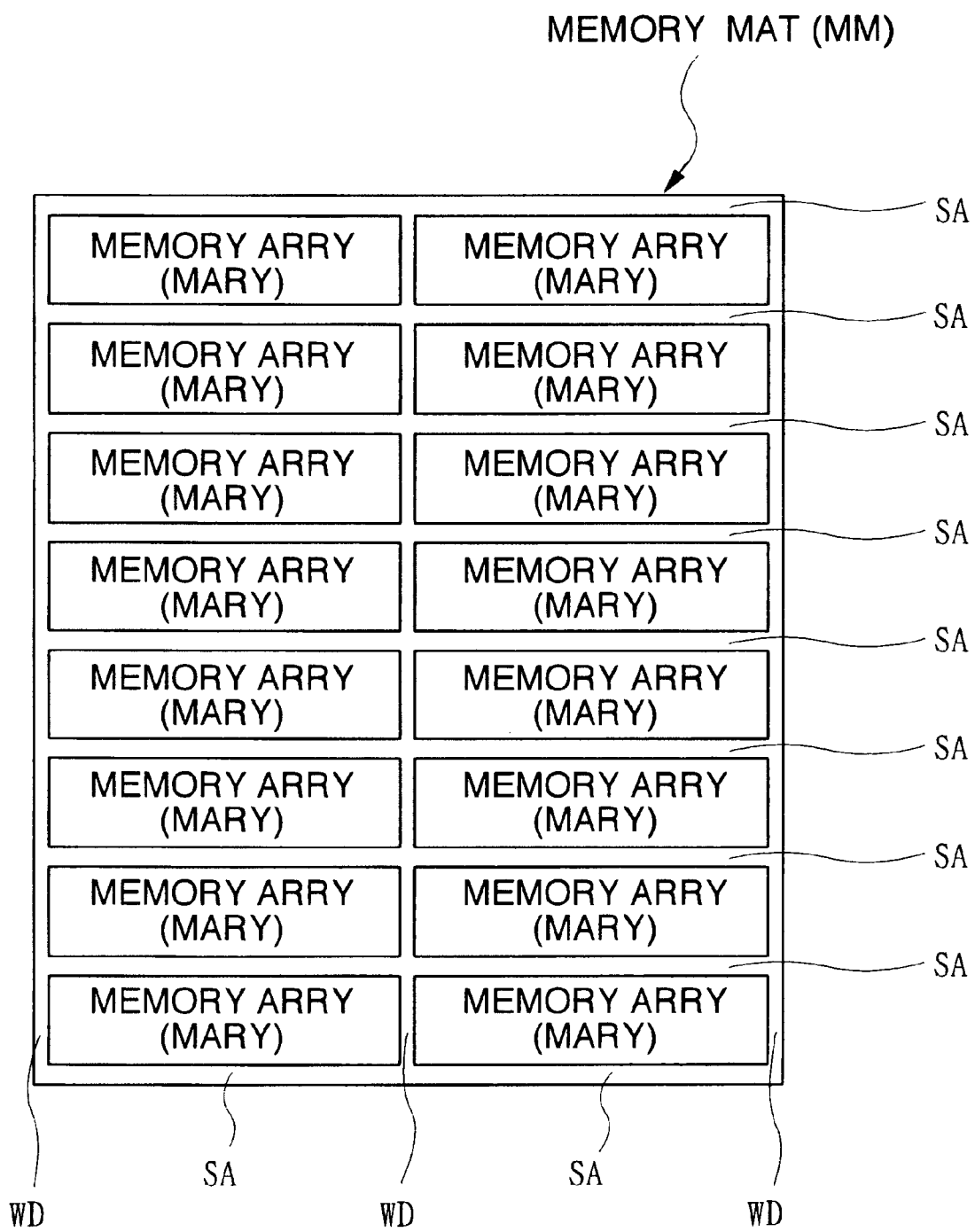
FIG. 20 is an enlarged plan view showing a part of FIG. 19.

FIG. 19 is an overall plan view of a semiconductor chip having 1 a DRAM of a semiconductor integrated circuit device according to a seventh embodiment of the present invention and FIG. 20 is an enlarged plan view showing a part of the semiconductor chip.

A DRAM having a capacity of 64 M bit, for example, is formed on a main surface of a semiconductor chip 1A made of single crystal silicon. As shown in FIG. 19, this DRAM includes eight divided memory mats MM and a peripheral circuit disposed around these memory mats MM. In this specification, term "memory mat" means a set of the units each including a memory cell array, a sense amplifier for amplifying the signals from the memory cell array and a word line driver for supplying a driving signal to the word line in the memory cell. Each of the memory mats MM having an 8M bit capacity is divided into sixteen memory arrays MARY as shown in FIG. 20. Each of these memory arrays MARY includes 2K bits×256 bit=512K bit memory cells arranged in matrix, and peripheral circuits such as the sense amplifiers SA, the word line drivers WD, etc. are disposed around the memory cells.

Figure 21:
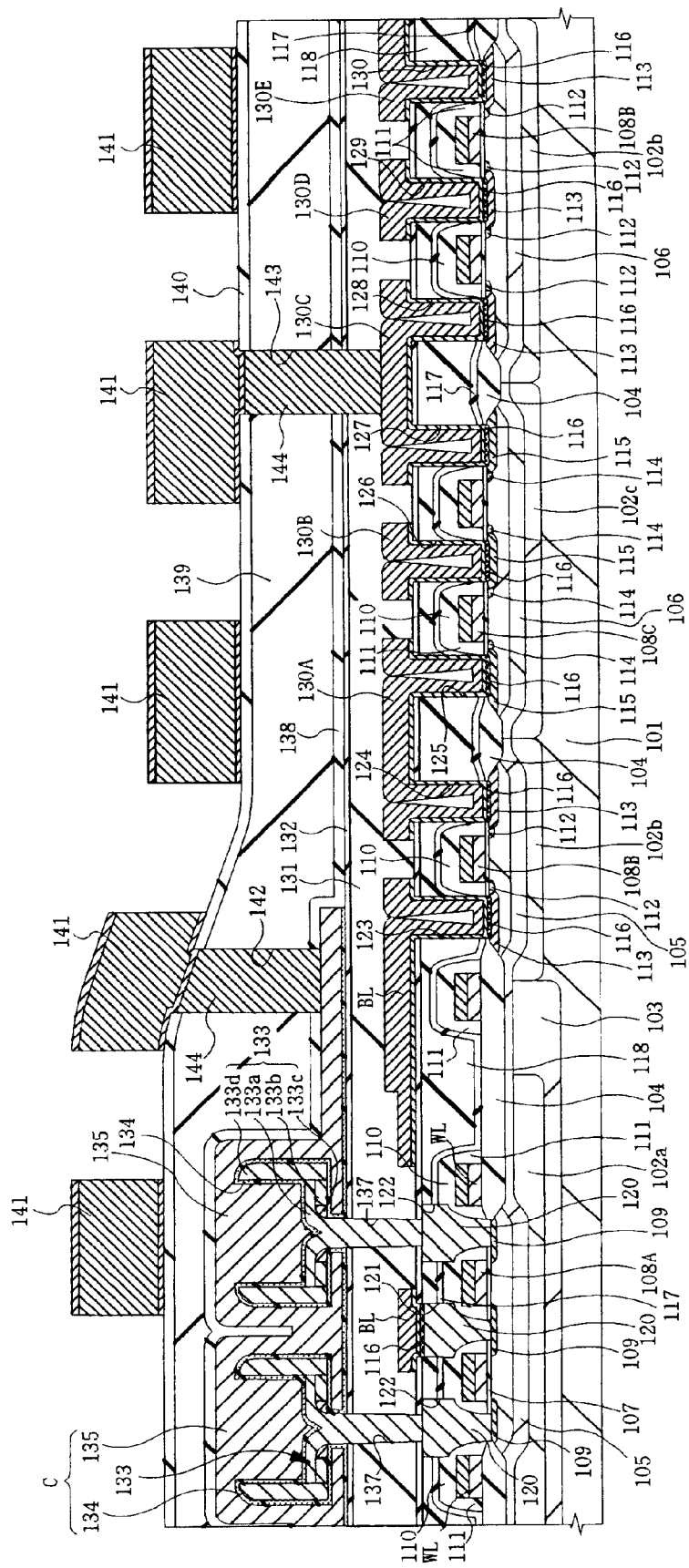
FIG. 21 is a sectional view of the principal portion of a semiconductor integrated circuit device according to still another embodiment of the present invention and shows specifically a part of each of a memory cell array of a DRAM and a peripheral circuit adjacent to the memory cell array.
Figure 22:
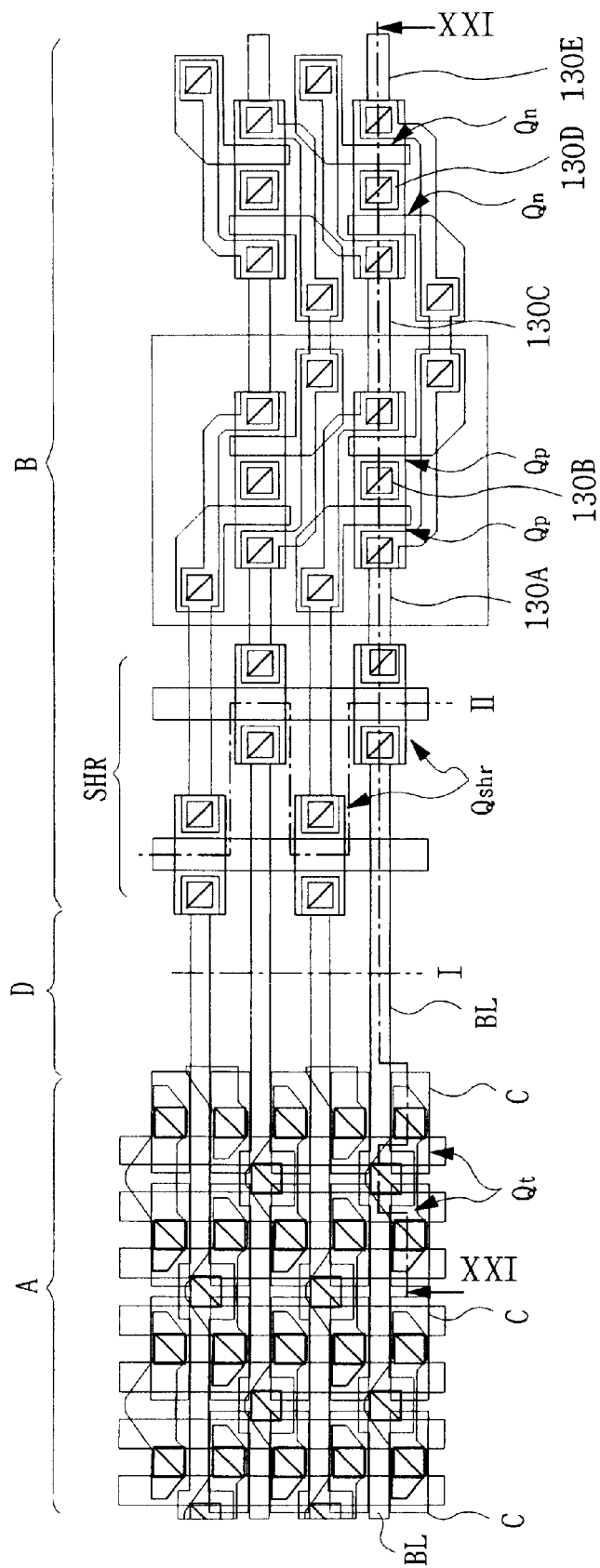
FIG. 22 is a plan view showing the pattern of each of the conductor layers constituting a memory cell of the DRAM shown in FIG. 21 and the conductor layers constituting an MISFET of the peripheral circuit.
Figure 23:
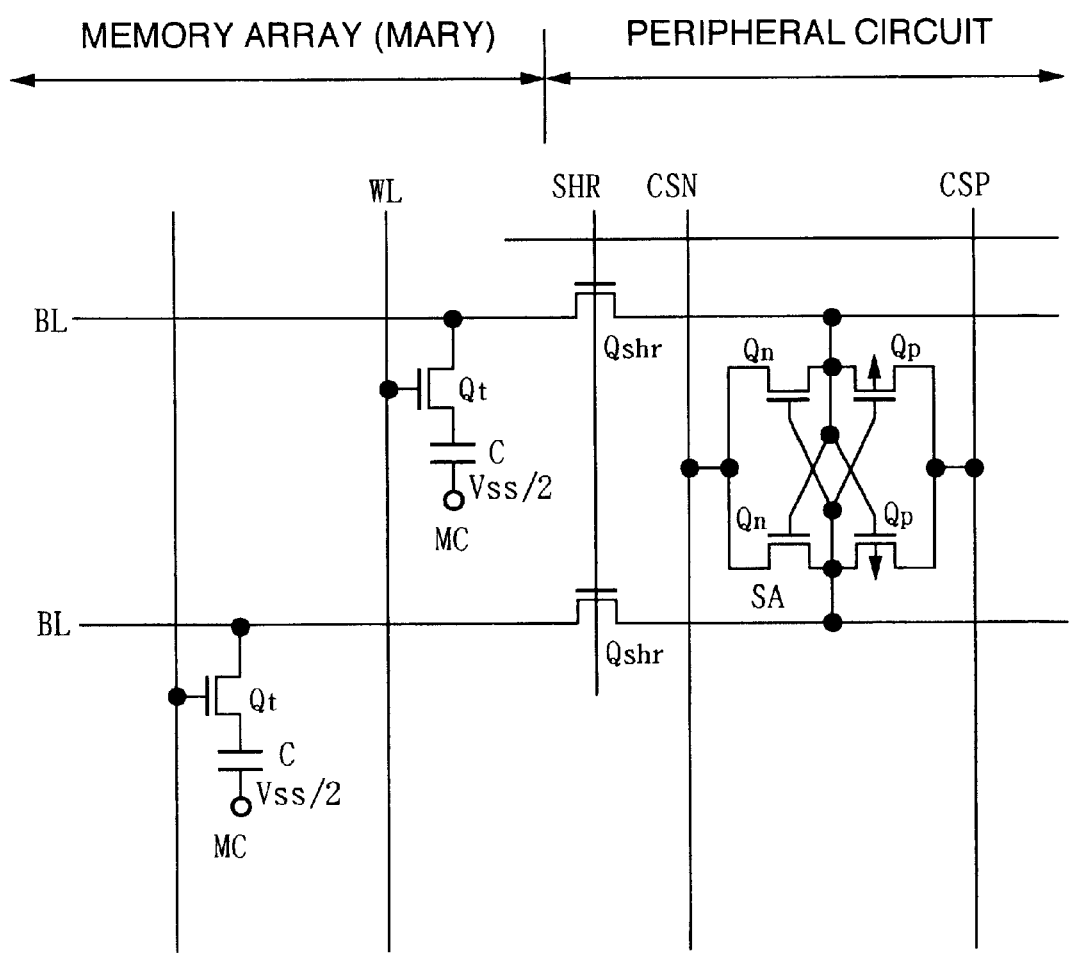
FIG. 23 is a circuit diagram showing a part of each of the memory cell array of the DRAM shown in FIG. 21 and the peripheral circuit adjacent to the memory cell array.

FIG. 21 is a sectional view of the principal portions of the semiconductor substrate and shows the memory arrays of this DRAM and a part each of the adjacent peripheral circuits. FIG. 22 is a plan view showing a pattern of each conductor constituting the MISFET of the peripheral circuit and existing at a mutually different level, and FIG. 23 is a circuit diagram showing a part of the memory array of the DRAM and a part of its adjacent peripheral circuit. FIG. 21 is a sectional view taken along a line XXI—XXI in FIG. 22.

FIG. 21 shows a pair of memory cell selection MISFETQt and MISFETs of the peripheral circuit represented by symbols Qshr, Qn and Qp in FIGS. 22 an 23. Symbol Qshr represents a shared MISFETQshr for selectively connecting the memory cell portion of the DRAM and the sense amplifier SA of the peripheral circuit portion, and symbols Qn and Qp represent a sense amplifier SA including a flip-flop circuit that is constituted by two Qn and Qp. Symbol Qn represents an n-channel MISFETQn and Qp represents a p-channel MISFETQp. Symbol Qshr represents an n-channel MISFET. The memory cell selection MISFETQt is formed at the memory cell portion A as the memory array MARY of the DRAM while Qshr, Qn and Qp are formed at the peripheral circuit portion B of the DRAM. The boundary region D between the memory cell portion A and the peripheral circuit portion B functions as a step mitigation region or as a region for supplying power to wells of the semiconductor substrate.

A p-well 102a of the memory cell portion A, a p-well 102b of the peripheral circuit portions B and an n-well 102c of the peripheral circuit portion B are formed in the semiconductor substrate 101 made of p-type single crystal silicon. The p-well 102a of the memory cell portion A is covered with the n-well 103 inside the substrate 101. Because the p-well 102a is covered with the n-well 103 in this way, the potential of the memory cell selection MISFETQt can be isolated from the potential of the semiconductor substrate 101 and a suitable bias voltage can be applied.

A field oxide film 104 for device isolation is formed on the surface of each of the p-wells 102a and 102b and the n-well 102c. A p-type channel stopper layer 105 is formed inside the p-wells 102a and 102b inclusive of the lower part of the field oxide film 104 and an n-channel stopper layer 106 is formed inside the n-well 102c.

The memory cells are arranged in matrix in the active region of the p-well 102a of the memory cell portion A. Each memory cell includes two circuit devices, that is, one n-channel memory cell selection MISFETQt and one information storage capacitor device C formed on, and connected in series with, the memory cell selection MISFETQt. In other words, this memory has a stacked capacitor structure in which the information storage capacitor device C is stacked on the memory cell selection MISFETQt.

The memory cell selection MISFETQt comprises a gate oxide film 107, a gate electrode 108A formed integrally with a word line WL and source/drain regions (n-type semiconductor regions 109 and 109). The gate electrode 108A (word line WL) comprises a two-layered conductor film formed by laminating a low resistance polysilicon film to which an n-type impurity (phosphorus (P), for example) is doped, and a tungsten silicide (WSi2) film or a three-layered film formed by laminating a low resistance polysilicon film, a TiN (titanium nitride) film and a W film. A silicon nitride film 110 is formed on the gate electrode 108A (word line WL) and a sidewall spacer 11 of silicon nitride is formed on its sidewalls. These insulating films (silicon nitride film 110 and sidewall spacer 111) may be constituted by the silicon oxide film in place of the silicon nitride film.

An n-channel MISFETQn and an n-channel shared MISFETQshr are formed in the active region of the p-well 102b of the peripheral circuit portion B. A p-channel MISFETQp is formed in the active region of the n-well 102c. In other words, this peripheral circuit portion B comprises a CMOS (Complementary Metal Oxide Semiconductor) circuit comprising the combination of the n-channel MISFETQn and the p-channel MISFETQp.

Each of the n-channel MISFETQn and the shared MISFETQshr comprises the gate oxide film 107, the gate electrode 108B and the source/drain regions 13. The gate electrode 108B is made of the same conductor material and at the same level as those of the gate electrode 108A (word line WL) of the memory cell selection MISFETQt. A silicon nitride film 110 is formed over the gate electrode 108B and a sidewall spacer 11 of silicon nitride is formed on the sidewalls. The source and drain regions of each of the n-channel MISFETQn and the shared MISFETQshr has an LDD (Lightly Doped Drain) structure comprising a low impurity concentration n-type semiconductor region 112 and a high impurity concentration $n^+$ type semiconductor region 113, and a Ti silicide (TiSi2) layer 116 is formed on the surface of the $n^+$ type semiconductor region 113.

The p-channel MISFETQp comprises the gate oxide film 107, the gate electrode 108C and the source and drain regions 115. The gate electrode 108C is made of the same conductor material and at the same level as those of the gate electrode 108A (word line WL) of the memory cell selection MISFETQt. A silicon nitride film 110 is formed over the gate electrode 108C and a sidewall spacer 111 of silicon nitride is formed on the sidewalls. The source and drain regions of the p-channel MISFETQp have the LDD structure comprising a low impurity concentration p-type semiconductor region 114 and a high impurity concentration $p^+$ type semiconductor region 115, and a titanium silicide layer 116 is formed on the surface of the $p^+$ semiconductor region 115.

A silicon oxide film 117, a BPSG (Boron PhosphoSilicate Glass) film 118 and a silicon oxide film 119 are formed from below in order named on the memory cell selection MISFETQt, the n-channel MISFETQn, the shared MISFETQshr and the n-channel MISFETQp.

The bit line conductor BL is formed on the silicon oxide film 119 of the memory cell portion A and on the silicon oxide film 119 covering the boundary region D. The bit line conductor BL comprises a two-layered conductor film formed by laminating a TiN film and a W film. The bit line conductor BL is electrically connected to one of the source and drain regions (n type semiconductor region 109) of the memory cell selection MISFETQt through a contact hole 121 into which a polysilicon plug 120 doped with phosphorus (P) or arsenic (As) is buried. The bit line conductor BL is further connected electrically to one of the source and drain regions ($n^+$ type semiconductor region 113) of the shared MISFETQshr of the peripheral circuit portion B through a contact hole 123 (without passing through the polysilicon plug). A low resistance titanium silicide layer 116 is formed on the surface of the $n^+$ type semiconductor region 113 of the shared MISFETQshr so as to reduce the contact resistance of the bit line conductor BL.

The film thickness of the bit line conductor BL changes in the boundary region D, is thick in the memory cell portion A and is thin in the peripheral circuit portion B. The reason why the film thickness of the bit line conductor BL changes in the boundary region D is because the conductor film constituting the bit line conductor BL is etched to a reduced thickness in the region of the memory cell portion A with the boundary region D being regarded as a boundary as will be explained elsewhere. Since the bit line conductor BL becomes thin in the memory cell portion A in this way, the parasitic capacity of the bit line conductor BL can be reduced, so that the detection sensitivity of the charge stored in the information storage capacitor device C can be improved.

First level interconnect conductors 130A, 130B, 130C, 130D and 130E are formed on the silicon oxide film 119 of the peripheral circuit portion B. Each of these first level interconnect conductors 130A to 130E comprises a two-layered conductor film formed by laminating the TiN film and the W film in the same way as the bit line conductor BL described above. One of the ends of the interconnect conductor 130A is electrically connected to the other of the source and drain regions of the shared MISFETQshr ($n^+$ type semiconductor region 113) through the contact hole 124 and the other end is electrically connected to one of the source and drain regions of the p-channel MISFETQp ($p^+$ type semiconductor region 115) through the contact hole 125. The interconnect conductor 130B is electrically connected to the source and drain regions ($p^+$ semiconductor region 115) shared by two p-channel MISFETQp through the contact hole 126. One of the ends of the interconnect conductor 130C is electrically connected to the other of the source and drain regions of the p-channel MISFETQp ($p^+$ type semiconductor region 115) through the contact hole 127 and the other end is electrically connected to one of the source and drain regions of the n-channel MISFETQn ($n^+$ type semiconductor region 113) through the contact hole 128. The interconnect conductor 130D is electrically connected to the source and drain regions ($n^+$ type semiconductor region 113) shared by two n-channel MISFETQn through the contact hole 129. One of the ends of the interconnect conductor 130E is electrically connected to the other of the source and drain regions of the n-channel MISFETQn ($n^+$ type semiconductor region 113) through the contact hole 130. A low resistance titanium silicide layer 116 is formed on the surfaces of the $n^+$ type semiconductor regions 113 of the n-channel MISFETQn and the shared MISFETQshr and on the surface of the $p^+$ type semiconductor region 115 of the p-channel MISFETQp so as to reduce the contact resistances of the interconnect conductors 130A to 130E.

A silicon oxide film 131 and a silicon nitride film 132 are formed over the bit line conductor BL and on the interconnect conductors 130A to 130E. An information storage capacitor device C comprising a storage electrode (lower electrode) 133, a capacity insulating film 134 and a plate electrode (upper electrode) 135 is forded on the silicon nitride film 132 of the memory cell portion A.

The storage electrode 133 of the information storage capacitor device 133 comprises polysilicon films. In other words, it comprises a polysilicon film 133a connected to the polysilicon plug 120 through the contact hole 137, a polysilicon film 133b and a sidewall spacer 133c opening to the contact hole 137 and functioning as a so-called "hard mask", and a polysilicon film 133d formed upright and vertically to the semiconductor substrate 1 and defining crown-like sidewalls. The storage electrode 133 is electrically connected to the other of the source and drain regions of the memory cell selection MISFETQt (n type semiconductor region 109) through the contact hole 122 into which the plug 120 is buried. The capacity insulating film 134 comprises a laminate film of the silicon oxide film and the silicon nitride film, for example, and the plate electrode 135 comprises a polysilicon film, for example.

A silicon oxide film 138, an SOG (Spin-On-Glass) film 139 and a silicon oxide film 140 are serially formed from below in order named over the information storage capacitor device C. A second level interconnect conductor 141 is formed on the silicon oxide film 140. The second level interconnect conductor 141 is electrically connected to a plate electrode 135 through a contact hole 142 opening in the insulating films (silicon oxide film 140, SOG film 139 and silicon oxide film 138) over the plate electrode 135 of the information storage capacitor device C, and supplies a plate voltage (Vdd/2) to the plate electrode 135. The second level interconnect conductor 141 is also connected electrically to the interconnect conductor 130C through a contact hole 143 opening in the insulating films (silicon oxide film 140, SOG film 139, silicon oxide film 138 and silicon oxide film 131) over the first level interconnect conductor 130C of the peripheral circuit portion B. A tungsten (W) plug 144 is buried into the contact hole 142 connecting the interconnect conductor 141 and the plate electrode 135 and into the contact hole 143 connecting the interconnect conductor 141 and the interconnect conductor 130B.

A third level interconnect conductor is formed over the interconnect conductor 141 through an inter-layer insulating film comprising a three-layered insulating film formed by laminating a silicon oxide film, an SOG film and a silicon oxide film, for example, and a passivation film comprising a two-layered insulating film formed by laminating a silicon oxide film and a silicon nitride film is formed on the third level interconnect conductor. However, they are omitted from the drawings.

Next, a method of manufacturing a semiconductor integrated circuit device including the DRAM shown in FIG. 21 will be explained in detail with reference to FIGS. 24 to 41.

Figure 24:
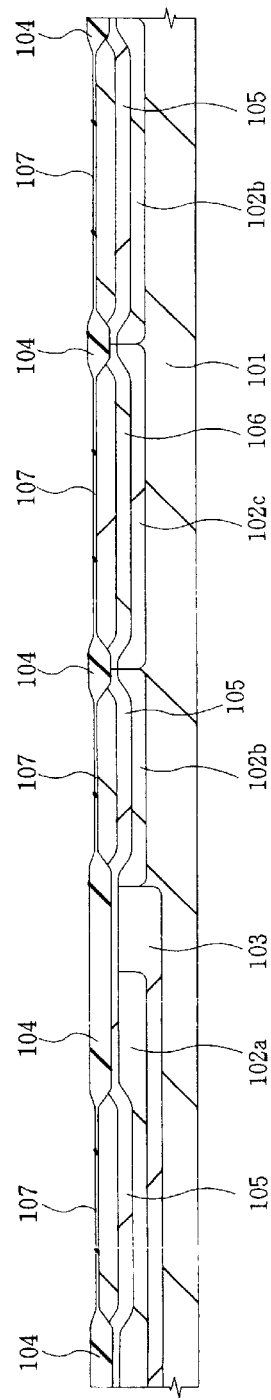
FIGS. 24 to 41 are sectional views showing step-wise a method of manufacturing the semiconductor integrated circuit device shown in FIG. 21.

First, a field oxide film 104 is formed on the surface of a p-type semiconductor substrate 101 having a specific resistance of about 1 to about 100 ohm-cm by a selective oxidation (LOCOS) method as shown in FIG. 24. Ions of p-type impurity (boron (B)) are implanted into a region in which memory cells are to be formed (a memory cell portion A formed at the first portion of the main surface of the substrate 101) and a region in which n-channel MISFETQn and shared MISFETQshr of the peripheral circuit portion B (formed at the second portion of the main surface of the substrate 101) are to be formed, thereby forming p-wells 102a and 102. Ions of n-type impurity (phosphorus (P)) are implanted into a region of the semiconductor substrate 101 in which a p-channel MISFETQp of the peripheral circuit portion B is to be formed so as to form an n-well 102c. Subsequently, n type impurity (phosphorus (P)) ions are implanted into the memory cell portion A so as to form an n-well 103. Further, p type impurity (B) ions are implanted into the p-wells 102a and 102b to form a p-channel stopper layer 105, and n type impurity (P) ions are implanted into the n-well 102c to form an n-type channel stopper layer 106. The p-well 102b of the peripheral circuit portion B and the p-well 102a of the memory cell portion A may be formed by separate process steps.

Thereafter, a gate oxide film 107 is formed by thermal oxidation on the surface of the active region of each of the p-wells 102a, 102b and 102c encompassed by the field oxide film 104, and impurity ions are then implanted into each of the p-wells 102a, 102b and the n-well 102c so as to regulate the threshold voltage (Vth) of the MISFET. Among ion implantation for forming the wells (p-wells 102a, 102b and n-well 102c), ion implantation for forming the channel stopper layers (p-type channel stopper layer 105 and the n-type channel stopper layer 106) and ion implantation for regulating the threshold voltage (Vth) of the MISFET, those having the same conductivity type may be carried out by using the same photoresist mask. The threshold voltage (Vth) may be regulated independently for the respective MISFETs by conducting separately ion implantation for regulating the threshold voltage (Vth) of the memory cell selection MISFETQt and ion implantation for regulating the threshold voltages (Vth) of the MISFETs (n-channel MISFETQn, shared MISFETQshr and p-channel MISFETQp).

Figure 25:
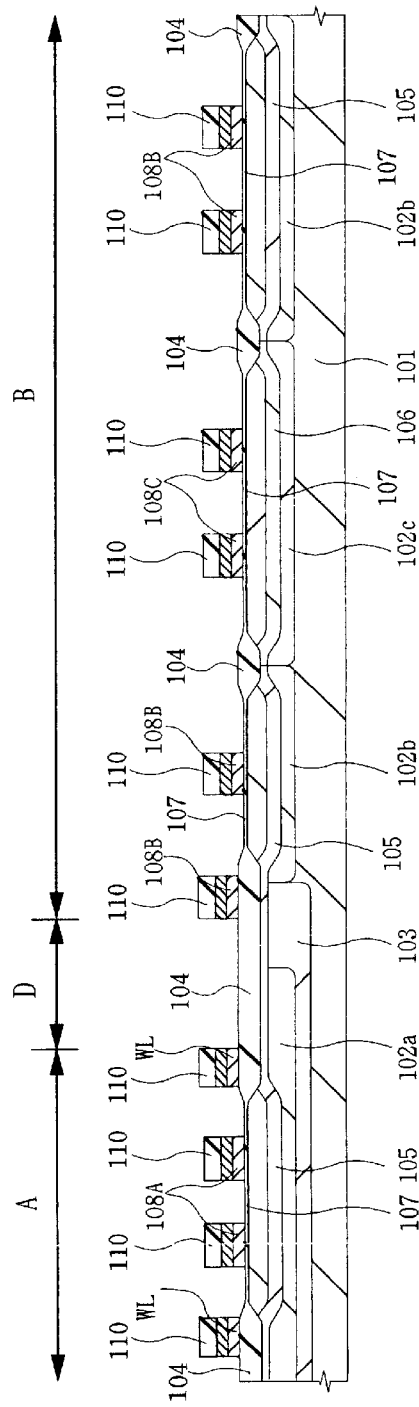

Next, as shown in FIG. 25, a gate electrode 108A (word line conductor WL), a gate electrode 108B of the n-channel MISFETQn and the shared MISFETQshr and a gate electrode 108C of the p-channel MISFETQp are formed. The electrode 108A (word line conductor WL) and the gate electrodes 108B and 108C are formed simultaneously by, for example, depositing serially an n type polysilicon film, a WSi2 film and a silicon nitride film 110 over the semiconductor substrate 101 by the CVD process and then patterning these films by using a photoresist as a mask. Alternatively, they are formed simultaneously by depositing an n type polysilicon film by the CVD process, then depositing a TiN film and a W film by sputtering, further depositing a silicon nitride film 110 by the CVD process and patterning these films by etching using a photoresist as a mask. The TiN film is used as a barrier metal for preventing the reaction between the polysilicon film and the W film. The gate electrode 108A (word line WL) and the gate electrodes 108B and 108C can be constituted by a material having a lower resistance such as a three-layered conductor film formed by laminating a TiN film (or WN (tungsten nitride) film) and a Ti silicide film on an n-type polysilicon film, for example.

Figure 26:
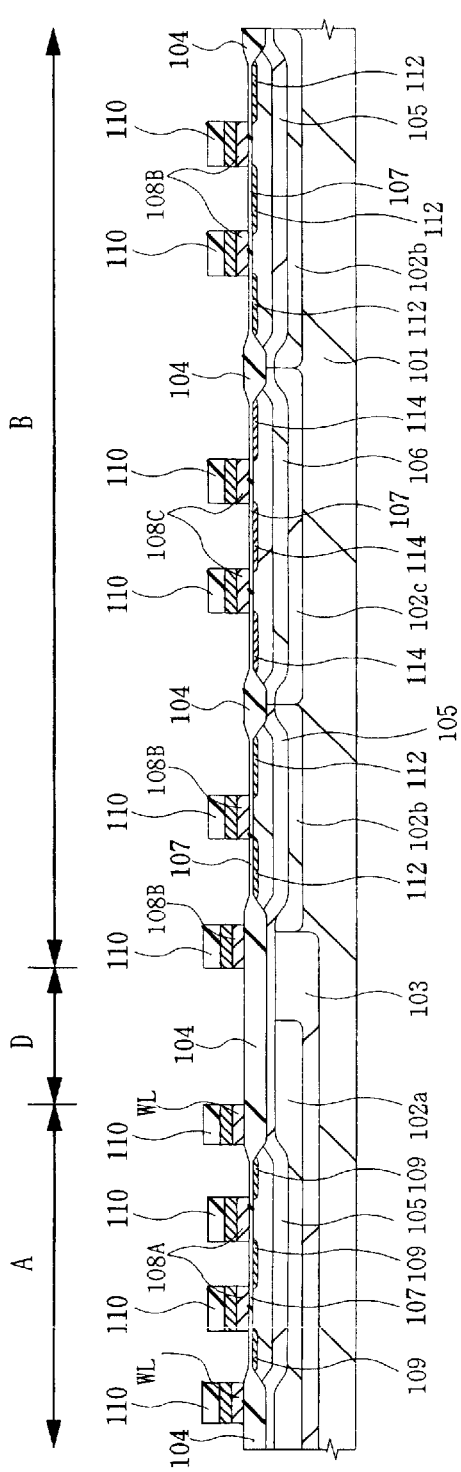

Next, as shown in FIG. 26, n type impurity (P) ions are implanted into the p-wells 102a and 102b so as to form the n-type semiconductor region 109 of the memory cell selection MISFETQt and the n-type semiconductor region 112 of the n-channel MISFETQn and the shared MISFETQshr in self-alignment with the gate electrodes 108A and 108B. Ions of p-type impurity (B) are implanted into the n-well 102c so as to form the p-type semiconductor region 114 of the p-channel MISFETQp in self-alignment with the gate electrode 108C. At this time, ion implantation for forming the n-type semiconductor region 109 of the memory cell selection MISFETQt and ion implantation for forming the n-type semiconductor region 112 of the n-channel type MISFETQn and the shared MISFETQshr may be carried out separately so as to independently regulate the impurity concentrations of the source and drain regions.

Figure 27:
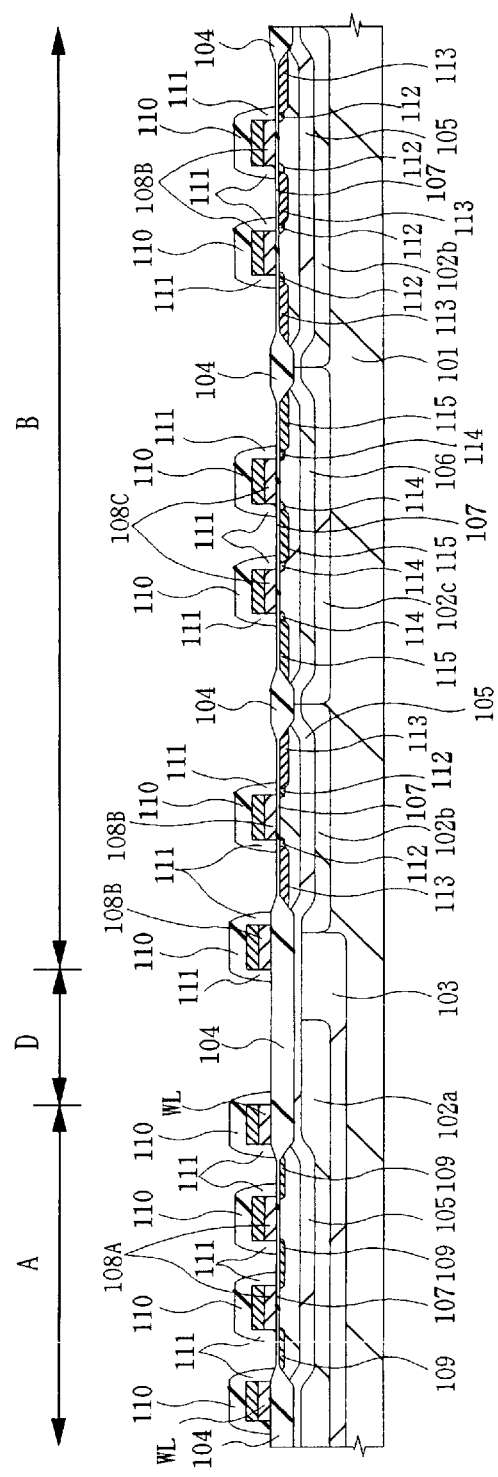

Sidewall spacers 111 are then formed on the sidewalls of the gate electrode 108A (word line conductor WL) of the memory cell selection MISFETQt, the gate electrode 108B of the n-channel MISFETQn and the shared MISFETQshr, and the gate electrode 108C of the p-channel MISFETQp, as shown in FIG. 27. Each sidewall spacer 111 is formed by etching anisotropically the silicon nitride film deposited by the CVD process. Next, ions of n-type impurity (P) are implanted into the p-well 102b of the peripheral circuit portion B in such a manner as to form the $n^+$ type semiconductor region 113 of the n-channel MISFETQn and the shared MISFETQshr in self-alignment with the sidewall spacer 111. Further, ions of n-type impurity (B) are implanted into the n-well 102c in such a manner as to form the $p^+$-type semiconductor region 115 of the p-channel MISFETQp in self-alignment with the sidewall spacer 111. Either one, or both, of the source and drain regions of each of the n-channel MISFETQn and the shared MISFETQshr and either one, or both, of the source and drain regions of the p-channel MISFETQp can be constituted by a single drain structure or a double diffused drain structure, whenever necessary.

Figure 28:
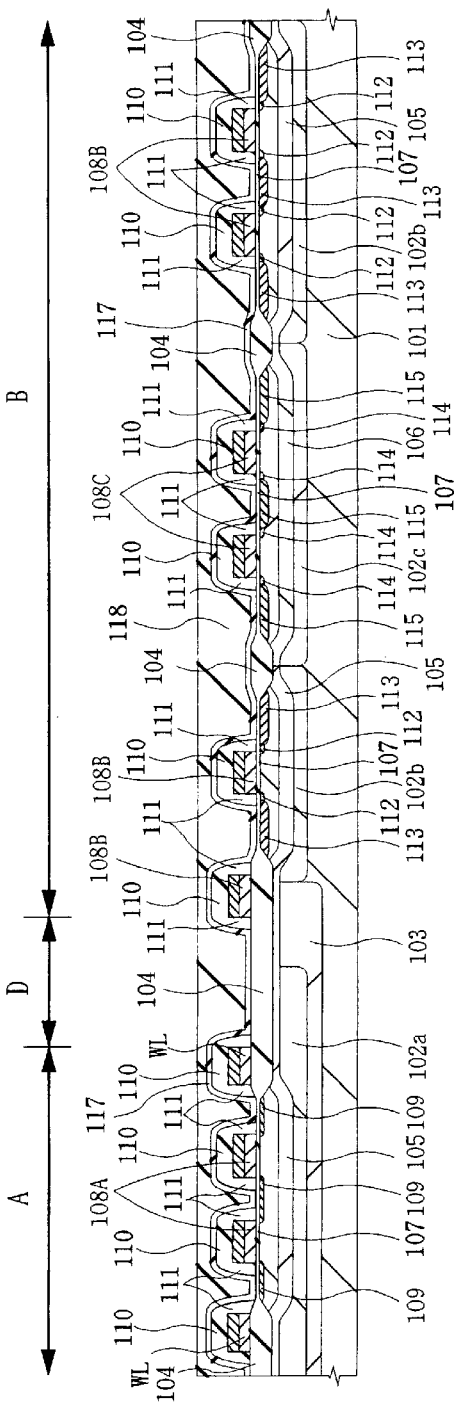

Next, as shown in FIG. 28, a silicon oxide film 117 and a BPSG film 118 are deposited by the CVD process over the gate electrode 108A (word line conductor WL), the gate electrode 108B of the n-channel MISFETQn and the shared MISFETQshr and the gate electrode 108C of the p-channel MISFETQp, respectively, and the BPSG film 118 is polished by CMP (Chemical Mechanical Polishing) method so as to planarize its surface.

Figure 29:
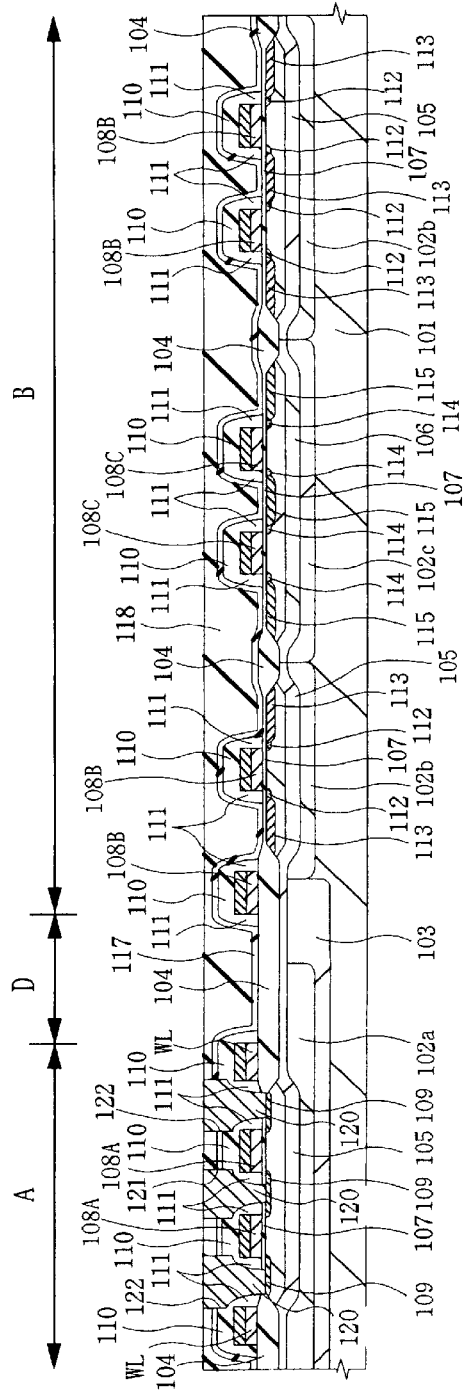

A polysilicon film (not shown) is then deposited by the CVD process on the BPSG film 118 as shown in FIG. 29 and is etched by using a photoresist as a mask. Subsequently, the BPSG film 118, the silicon oxide film 117 and the gate oxide film 107 are etched by using the polysilicon film as the mask so as to form a contact hole 121 on one of the source and drain regions of the memory cell selection MISFETQt (n type semiconductor region 109) and a contact hole 122 on the other (n type semiconductor region 109). When these contact holes 121 and 122 are formed by etching the films 118, 117 and 107, an ordinary photoresist may be used in place of the polysilicon film.

In this instance, the silicon nitride film 110 formed on the gate electrode 108A (word line conductor WL) of the memory cell selection MISFETQt and the sidewall spacer 111 formed on the sidewalls have a different etching rate from that of the silicon oxide type insulating films (BPSG film 118, silicon oxide film 117 and gate oxide film 107), and they are hardly etched but remain as they are. In other words, the gas used for dry etching to form the contact holes 121 and 122 has a high etching rate for the silicon oxide film but a low etching rate for the silicon nitride film. Consequently, the region keeping touch with the n type semiconductor region 109 can form the very small contact holes 121 and 122 constituted in a smaller diameter than resolution of exposure light used for forming the photoresist mask in self-alignment with the sidewall spacer 111 and for this reason, the memory cell size can be reduced.

Next, a polysilicon plug 120 is buried into the contact holes 121 and 122. This plug 120 is formed by depositing a polysilicon film over the afore-mentioned polysilicon film, not shown, by the CVD process and then etching back and removing the polysilicon film over the BPSG film 118. At this time, the polysilicon film used as the etching mask is removed simultaneously. An n-type impurity (P) is introduced into the polysilicon film constituting the plug 120. This impurity diffuses into the n-type semiconductor regions 109 and 109 (source and drain regions) of the memory cell selection MISFETQt through the contact holes 121 and 122, thereby forming a semiconductor region (not shown) having a higher impurity concentration than the n-type semiconductor regions 109 and 109.

Figure 30:
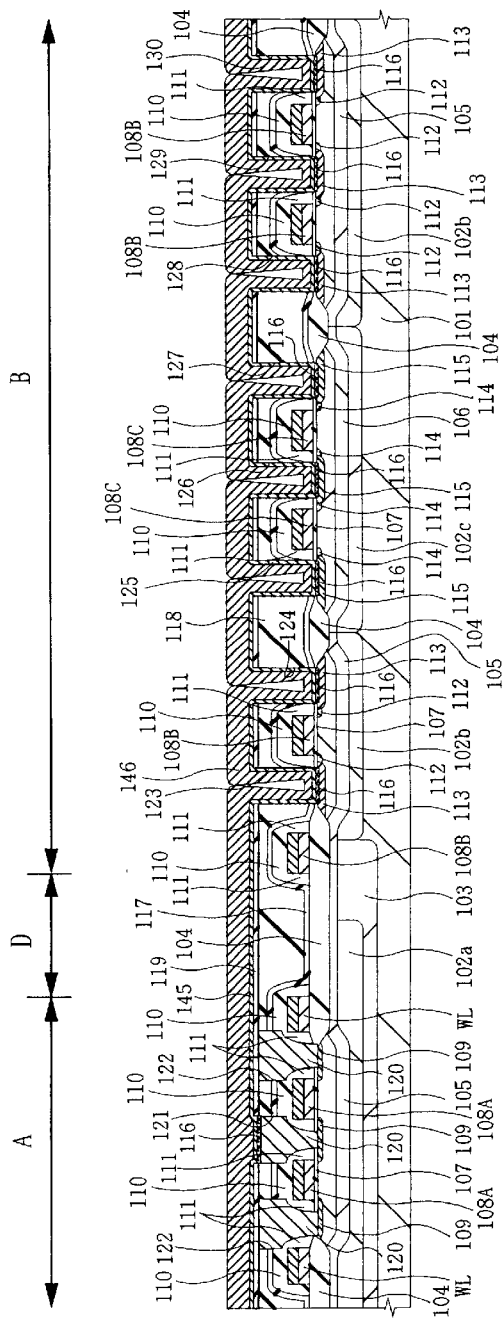

As shown in FIG. 30, a silicon dioxide film 119 is then deposited on the BPSG film 118, and the silicon dioxide film 119 on the contact hole 121 is removed by etching by using a photoresist, which covers the peripheral circuit portion B and has an opening above the bit line conductor BL1, as a mask so as to expose the plug 120 of the region in which the bit line conductor BL1 is formed. Next, the silicon oxide film 119 of the peripheral circuit portion B, the BPSG film 118, the silicon oxide film 117 and the gate oxide film 107 are etched by using a photoresist, which covers the memory cell formation region and has an opening in the peripheral circuit portion B, as a mask so as to form contact holes 123 to 130 on the source and drain regions of the n channel MISFETQn, the shared MISFETQshr and the p channel MISFETQp.

Next, a titanium silicide layer 116 is formed on the surface of the $n^+$ type semiconductor regions 113 and 115 exposed at the bottoms of the contact holes 123 to 130 and on the surface of the plug 120 to which the bit line conductor BL is connected. This titanium silicide layer 116 is formed by annealing the Ti film, which is deposited by sputtering, so as to let the Si substrate ($n^+$-type semiconductor region 113 and $p^+$-type semiconductor region 115) and the polycrystalline silicon (plug 120) react with one another and etching and removing the unreacted Ti film remaining on the silicon oxide film 119. Because the titanium silicide layer 116 is formed in this way, the contact resistance among the $n^+$ type semiconductor region 113 of the n-channel MISFETQn and the shared MISFETQshr, the $p^+$-type semiconductor region of the p-channel MISFETQp, the plug 120 and the interconnect conductors connected to them (bit line conductors BL and interconnect conductors 130A to E) can be reduced.

A TiN film 145 and a W film 146 constituting the bit line conductor BL and the interconnect conductors 130A to E are deposited on the inner surface of the contact holes 123 to 130, on the surface of the plug 120 to which the bit line conductor BL is to be connected and on the surface of the silicon oxide film 119. These TiN film 145 and W film 146 can be deposited by, for example, sputtering or CVD. At this time, the film thickness of each of the TiN film 145 and the W film 146 is adjusted to the thickness of the interconnect conductors 130A to E.

Figure 31:
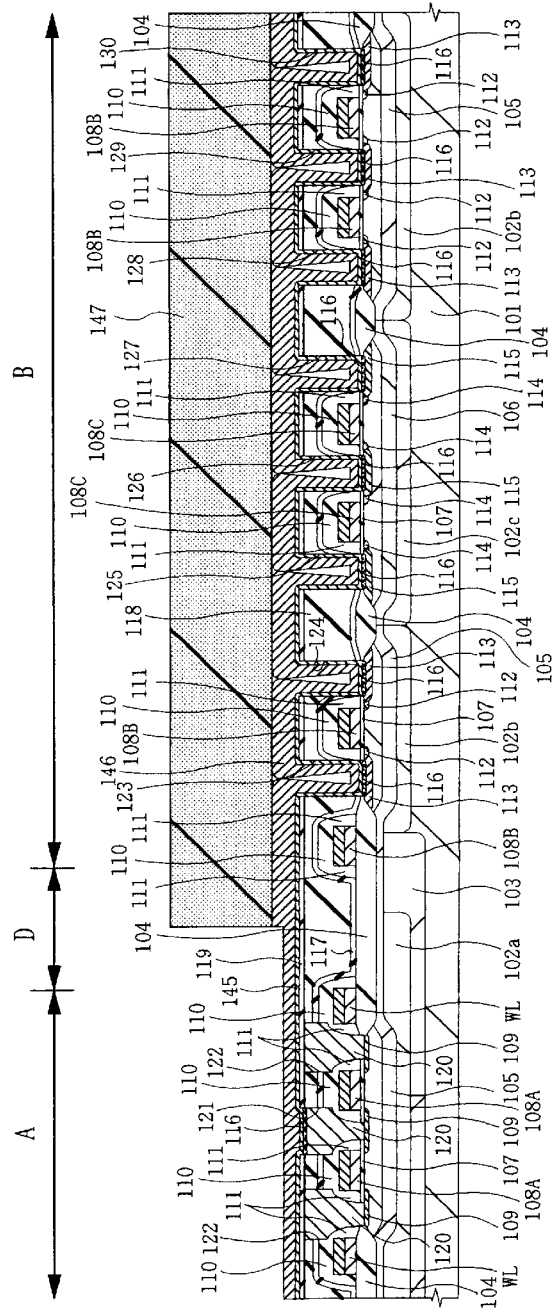

Next, as shown in FIG. 31, the W film 146 of the memory cell portion A is etched and its thickness is reduced by using a photoresist film 147 as a mask. This photoresist film has a pattern which covers at least the memory cell portion and exposes the peripheral circuit portion, and the boundary of the photoresist film is represented by a boundary line I in FIG. 22. A known dry etching method can be used for this etching. Incidentally, the thickness of the W film 146 is reduced so that the film thickness of the W film 146 of the memory cell portion A becomes equal to the film thickness of the bit line conductor BL. Adjustment of the film thickness can be carried out by controlling the processing time of dry etching, for example.

Because the film thickness of the W film 146 in a region which serves as the bit line conductor BL is reduced as described above, the parasitic capacity of the bit line conductor BL can be reduced. The reduction of the film thickness of the W film 146 of the memory cell portion A does not increase a particularly complicated process step and does not prolong the process time, either. Therefore, the parasitic capacity of the bit line conductor BL and the sheet resistance of the interconnect conductors 130A to E can be lowered without lowering through-put.

In this embodiment, the photoresist film 147 is formed with the boundary region D, rather than the upper portion of the shared MISFETQshr, being regarded as a boundary. The boundary line I shown in FIG. 22 is located in the region between the memory cell portion and the shared MISFETQshr. Because the photoresist film is formed in such a manner that the edge portion thereof is formed within the range of the boundary region D, accuracy of alignment need not be particularly improved. Therefore, a margin can be provided to the formation step of the photoresist film 147.

Figure 32:
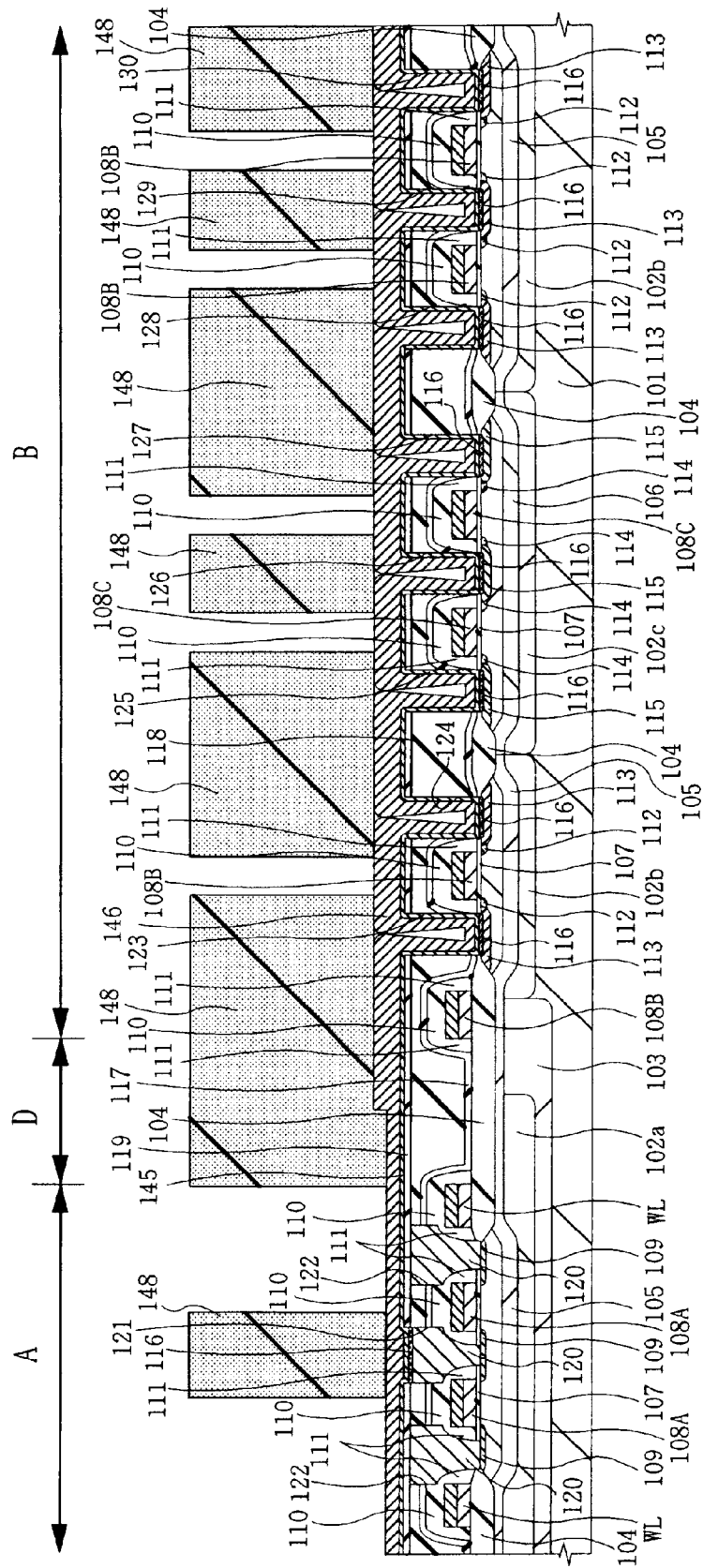
Figure 33:
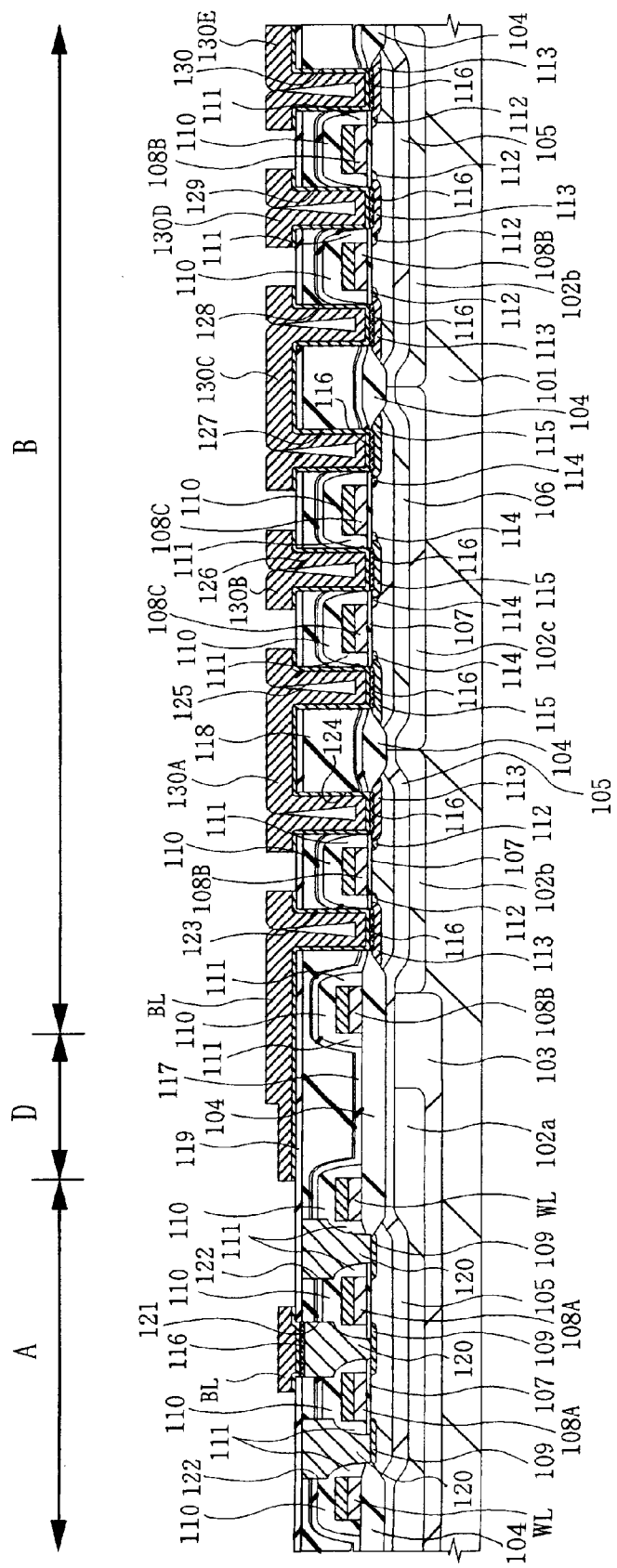

After a photoresist film 148 is formed on the W film 146 as shown in FIG. 32, the W film 146 and the TiN film 145 are patterned by using this photoresist film 148 as the mask so as to simultaneously form the bit line conductor BL and the interconnect conductors 130A to E. Incidentally, since the film thickness of the W film 146 is small at the memory cell portion A, the silicon oxide film 119 or the BPSG film 118 of the memory cell portion A is etched more excessively than those of the peripheral circuit portion B by this etching step but they are omitted from the drawing. Incidentally, further, the bit line conductor BL and the interconnect conductors 130A to E can be constituted by a material having a lower resistance such as a two-layered conductor film obtained by laminating a TiN film (or W film) and a Ti silicide film, for example.

Figure 34:
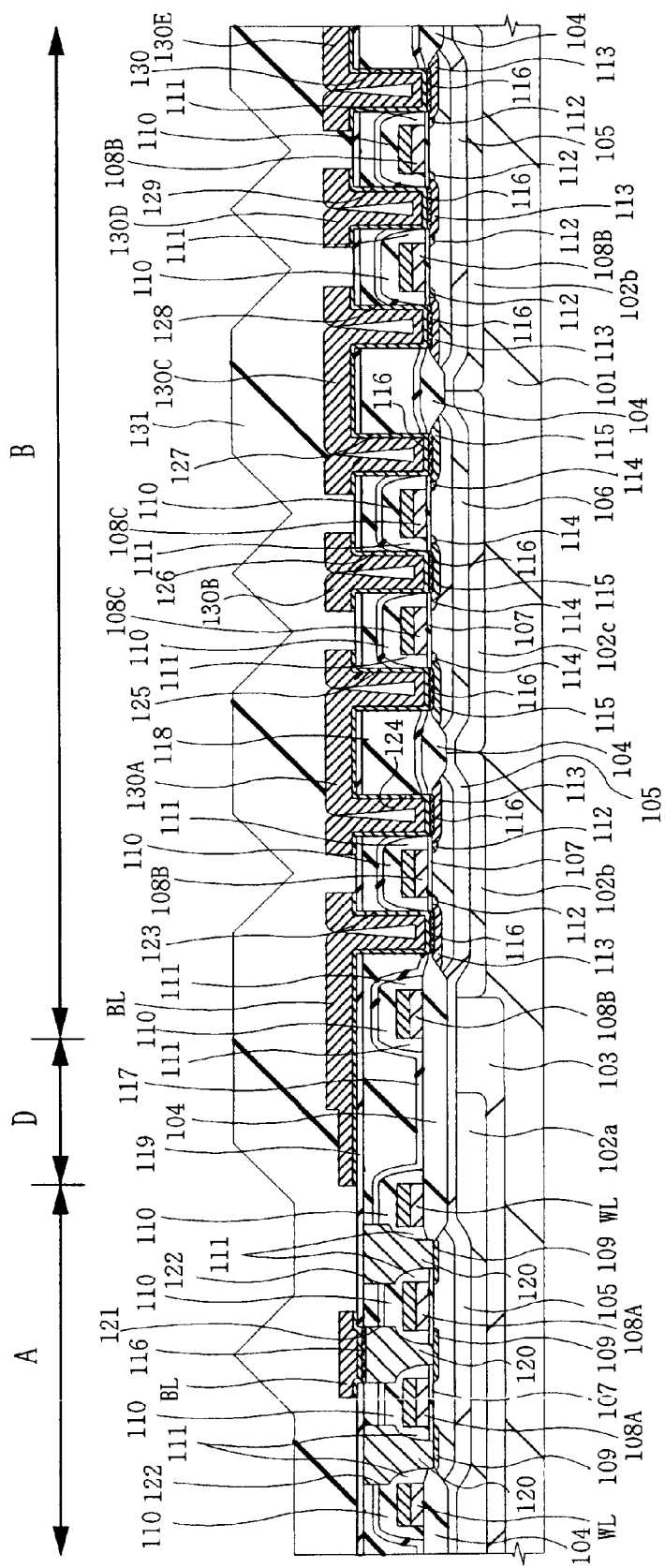

Next, a silicon oxide film 131 covering the bit line conductor BL and the interconnect conductors 130A to E is deposited as shown in FIG. 34. This silicon oxide film 131 is deposited by the ECR CVD process having high step coverage. A film having excellent burying property and high planarity such as a BPSG film or an SOG film can be used in place of the silicon oxide film deposited by the ECR CVD process.

Figure 35:
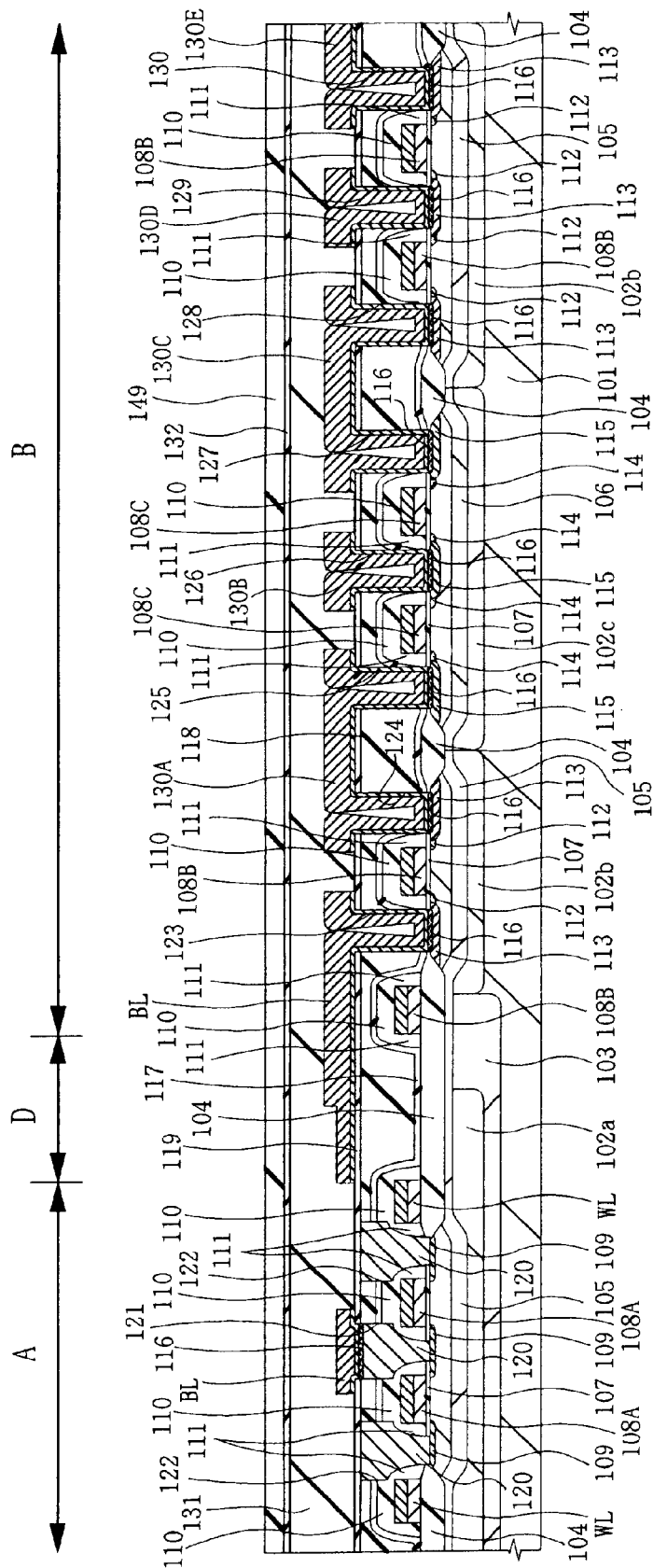

The silicon oxide film 131 is then planarized by the CMP process as shown in FIG. 35 and thereafter a silicon nitride film 132 is deposited. A silicon oxide film 149 is further deposited.

Figure 36:
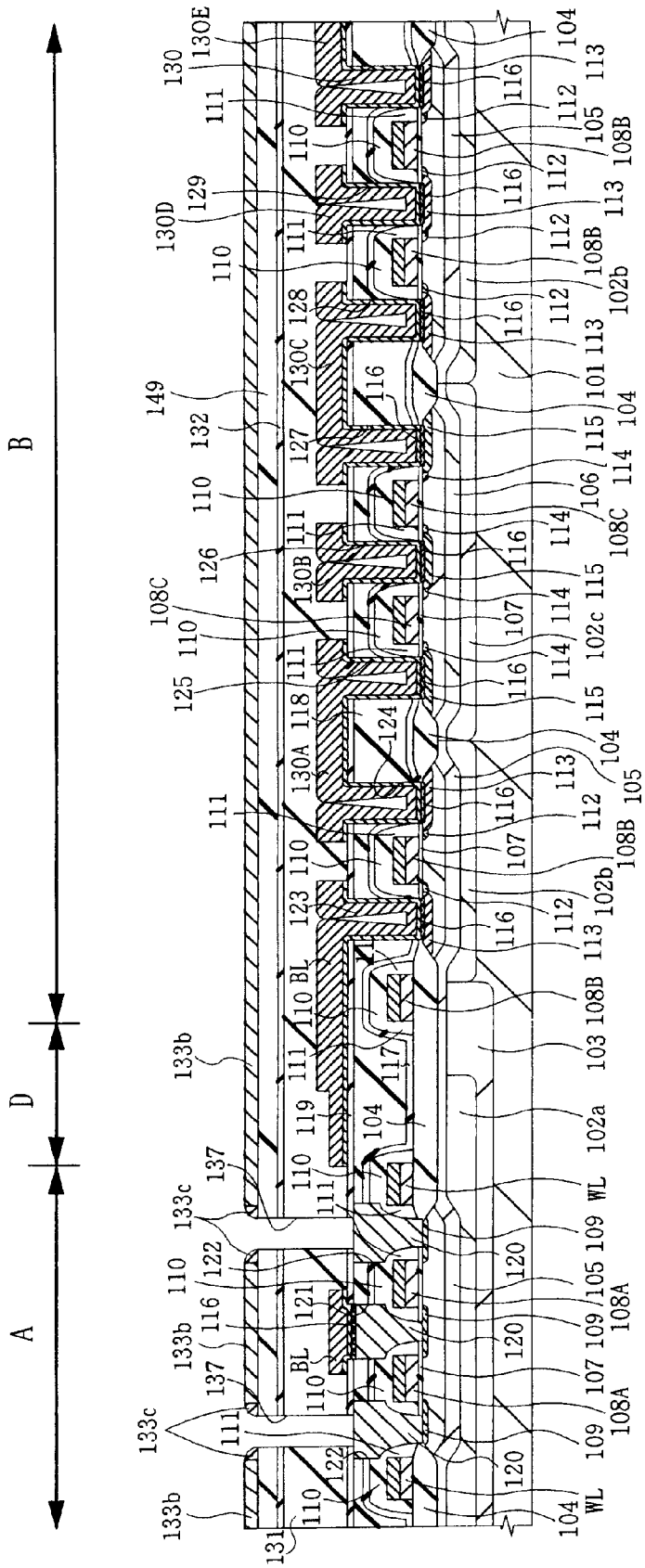

After a polysilicon film 133b is deposited as shown in FIG. 36, this polysilicon film 133b is etched by using a photoresist as a mask so as to form an opening. This opening is formed at the position at which a contact hole 137 is to be later formed. After a polysilicon film (not shown) is further deposited, it is etched by anisotropic etching so as to form a sidewall spacer comprising the polysilicon film at the opening. Thereafter, the silicon oxide film 149, the silicon nitride film 132 and the silicon oxide film 131 are etched by using the polysilicon film 133b and the sidewall spacer 133c as the mask so as to form a contact hole 137 above the contact hole 122 formed on the other (n-type semiconductor region 109) of the source and drain regions of the memory cell selection MISFETQt. Because the contact hole 137 is formed by using the polysilicon film 133b and the sidewall spacer 133c as the mask, the contact hole 137 can be processed by a dimension smaller than minimum resolution of photolithography, and the possibility that the bit line conductor BL is exposed and comes into short-circuit with the information storage capacitor device can be eliminated.

Figure 37:
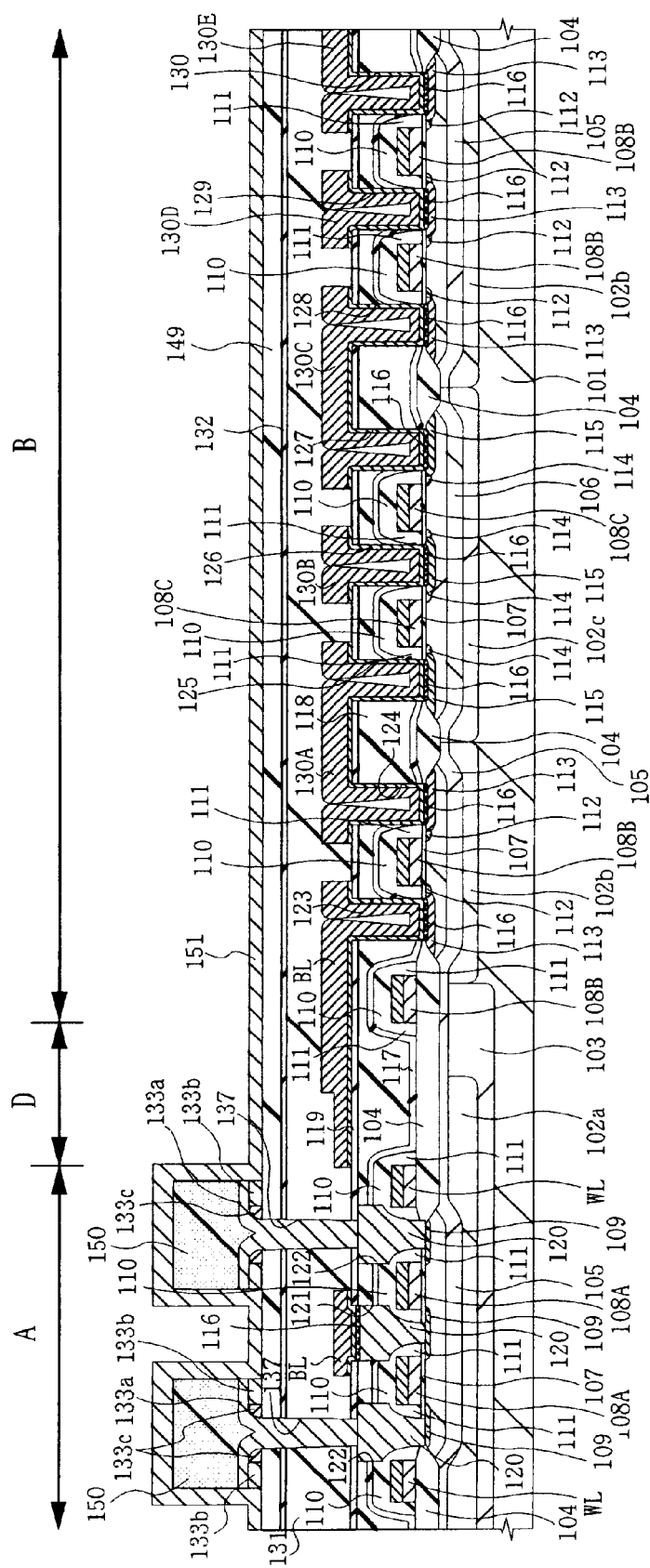

Next, a polysilicon film 133a and a silicon oxide film 150 are deposited on the polysilicon film 133b inclusive of the inside of the contact hole 137 and on the sidewall spacer 133c as shown in FIG. 37, and the silicon oxide film 150 and the polysilicon films 133a and 133b are etched by using a photoresist film as the mask. Thereafter, the photoresist film is removed and a polysilicon film 151 is deposited.

Figure 38:
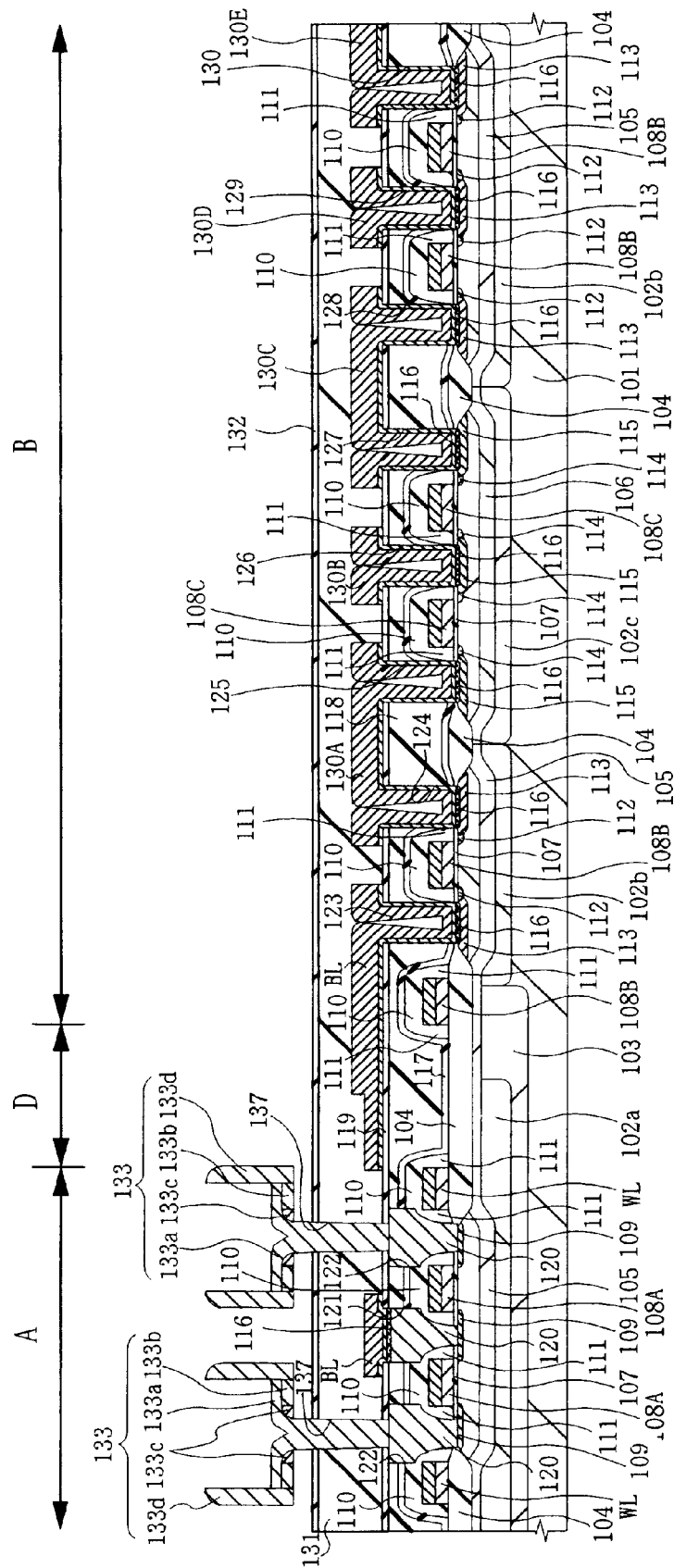

The polysilicon film 151 is etched by anisotropic etching as shown in FIG. 38 and the polysilicon film 151 on the silicon oxide film 149 is removed. Since etching is conducted by anisotropic etching, the polysilicon film 151 on the side surfaces of the silicon oxide film 150 and the polysilicon films 133a and 133b remain as such, forming thereby a polysilicon film 133d as upright sidewalls of a storage electrode 133 of the information storage capacitive device C. Further, the silicon oxide films 149 and 150 are removed by wet etching. In this way, a storage electrode 133 comprising the polysilicon films 133a to d is completed. Incidentally, the silicon nitride film 132 functions as an etching stopper during wet etching.

Figure 39:
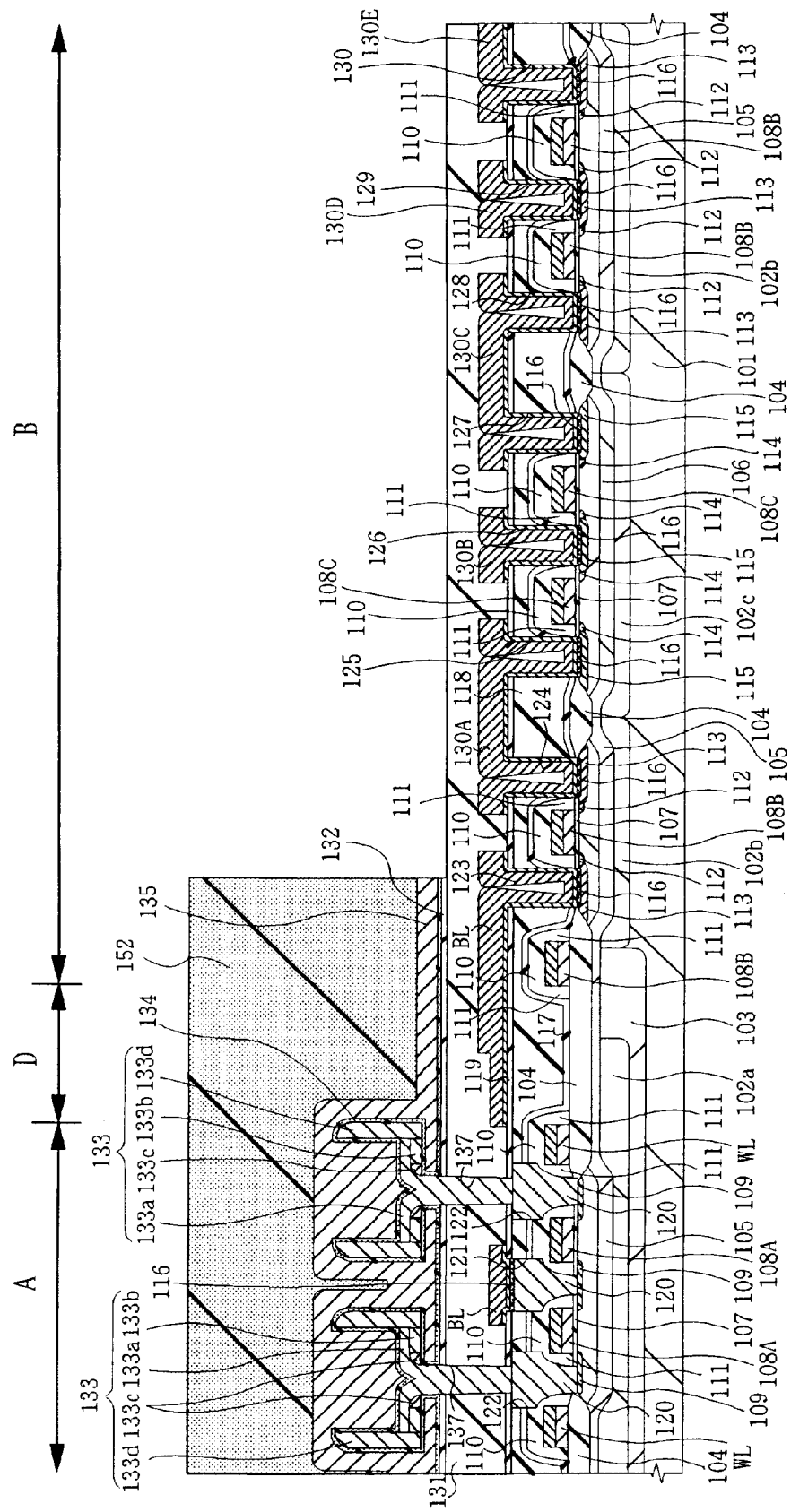
Figure 40:
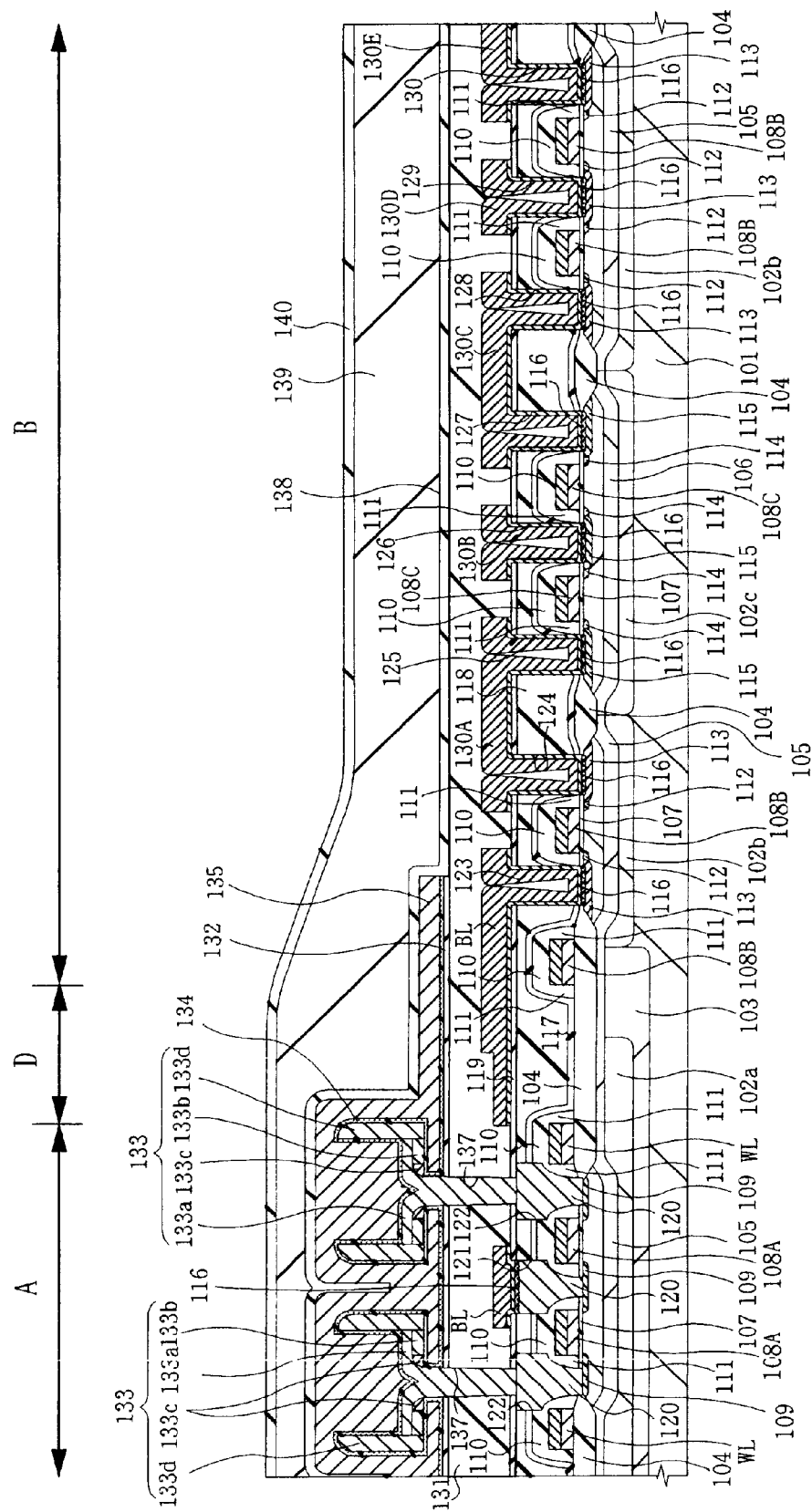

Next, a laminate film 134 of a silicon nitride film and a silicon oxide film is formed on the storage electrode 133 as shown in FIG. 39 and a polysilicon film 135 is deposited further on the laminate film 134. Thereafter, the polysilicon film 135 and the laminate film 134 of the silicon nitride film and the silicon oxide film are etched by using a photoresist film 152 as a mask so as to form a capacitance insulating film 134 comprising a laminate film of the silicon nitride film and the silicon oxide film and a plate electrode 135 comprising the polysilicon film. At this time, the silicon nitride film 132 is simultaneously removed by using the photoresist film 152 as the mask. In this way, the information storage capacitor device C comprising the storage electrode 133, the capacity insulating film 134 and the plate electrode 135 is formed. The capacity insulating film 134 can be constituted by a tantalum oxide film, a high dielectric material such as BST ((Ba,Sr)TiO$_3$) and a ferroelectric material such as PZT (PbZr$_x$Ti$_{1-x}$O$_3$), PLT (PbLa$_x$Ti$_{1-x}$O$_3$), PLZT, PbTiO$_3$, SrTiO$_3$, BaTiO$_3$, PbZrO$_3$, LiNbO$_3$, Bi$_4$Ti$_3$O$_{12}$, BaMgF$_4$, Y1 system (SrBi$_2$(Nb, Ta)$_2$O$_9$), etc. Further, the plate electrode 135 can be constituted also by a TiN film, a metal or conductive metal oxide films such as W silicide/TiN, Ta, Cu, Ag, Pt, Ir, IrO$_2$, Rh, RhO$_2$, Os, OsO$_2$, Ru, RuO$_2$, Re, ReO$_3$, Pd, Au, and so forth.

Figure 41:
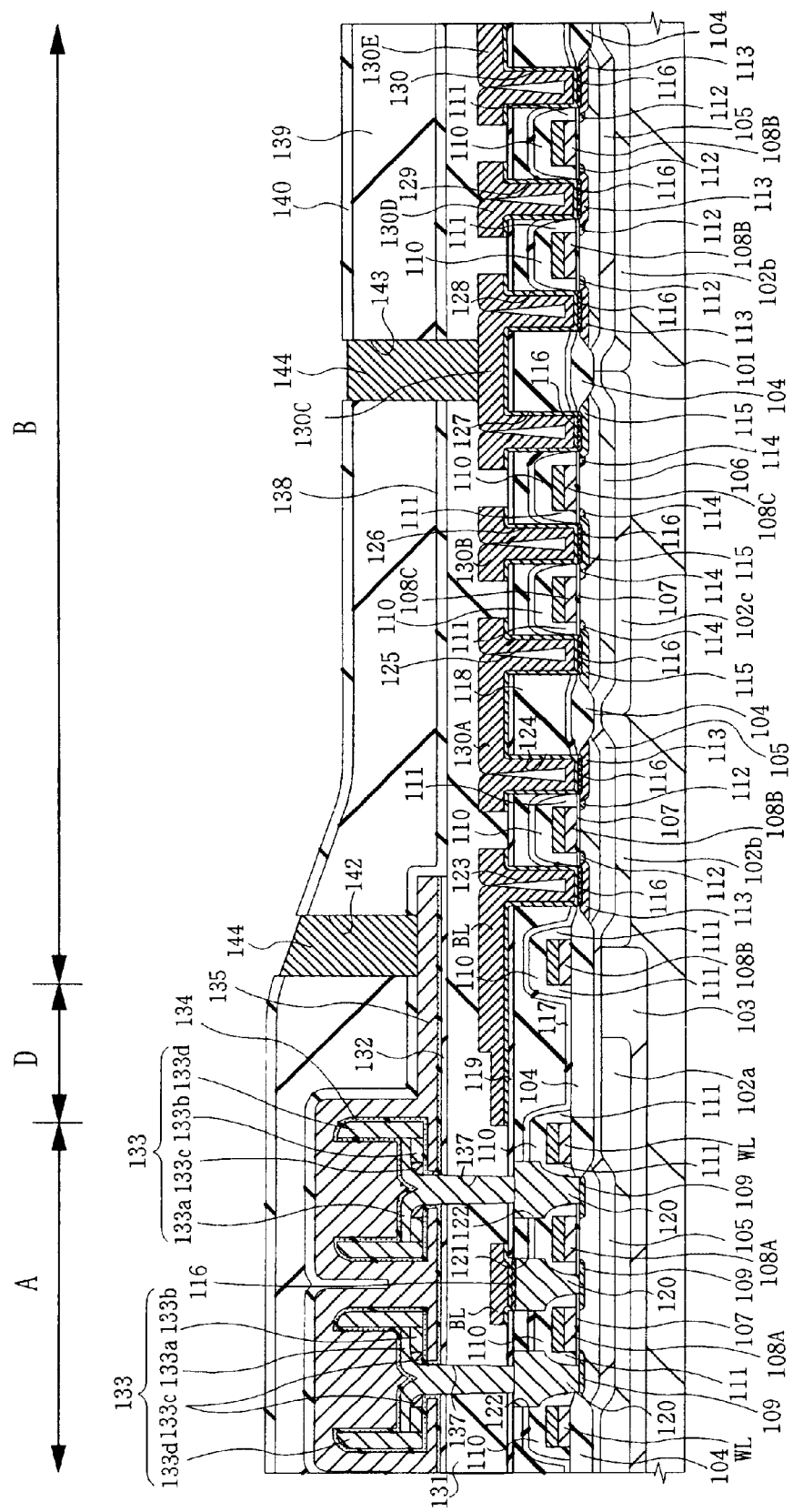

Next, a silicon oxide film 138 is deposited over the information storage capacitor device C by the CVD process, and an SOG film 139 is spin-coated on this silicon oxide film 138. After a silicon oxide film 140 is deposited further on the SOG film 139 by the CVD process, the insulating films (silicon oxide film 140, SOG film 139 and silicon oxide film 138) over the plate electrode 135 of the information storage capacitor device C are etched by using a photoresist as a mask so as to form a contact hole 142 as shown in FIG. 41. At the same time, the insulating films (silicon oxide film 140, SOG film 139, silicon oxide film 138 and silicon oxide film 131) of the first level interconnect conductor 130C of the peripheral circuit portion B are etched so as to form a contact hole 143.

Further, a W plug 144 is buried into the contact holes 142 and 143. This plug 144 is formed by etching back the W film deposited over the silicon oxide film 140 by the CVD process. The plug 144 can be constituted also by a laminate film of a TiN film and a W film.

Thereafter, a second level interconnect conductor 141 is formed on the silicon oxide film 140 and the semiconductor integrated circuit device shown in FIG. 21 can be completed. The interconnect conductor 141 is formed by depositing a TiN film, an Al alloy film and a TiN film on the silicon oxide film 140 by sputtering and simultaneously patterning these films by etching by using a photoresist as a mask. The interconnect conductor 141 can be constituted also by a laminate film of a TiN film and a Cu film.

According to the DRAM and the manufacturing method of the same of this embodiment, the film thickness of the bit line conductor BL can be reduced while the film thickness of the interconnect conductors 130A to E can be increased. As a result, the parasitic capacity of the bit line conductor BL and the resistance of the interconnect conductors 130A to E can be reduced, so that the detection sensitivity of the stored charge of the DRAM can be improved, and the operation speed of the peripheral circuit can be increased.

According to this embodiment, further, the position at which the film thickness of the bit line conductors BL is different from that of the interconnect conductors 130A to E is set to the boundary region D. Therefore, the alignment margin of photolithography of the photoresist film 147 for reducing the film thickness of the W film 146 can be increased.

(Embodiment 8)

Figure 42:
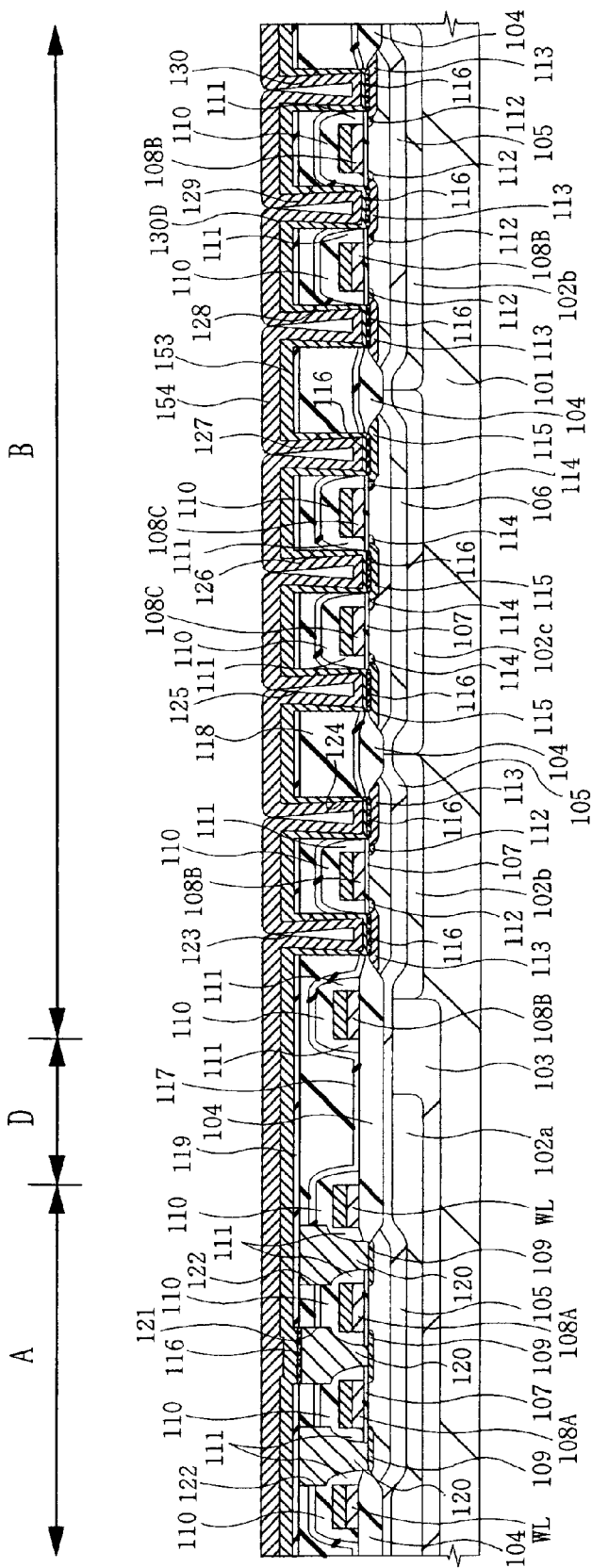
FIGS. 42 and 43 are sectional views showing step-wise a method of manufacturing a semiconductor integrated circuit device including a DRAM according to still another embodiment of the present invention.
Figure 43:
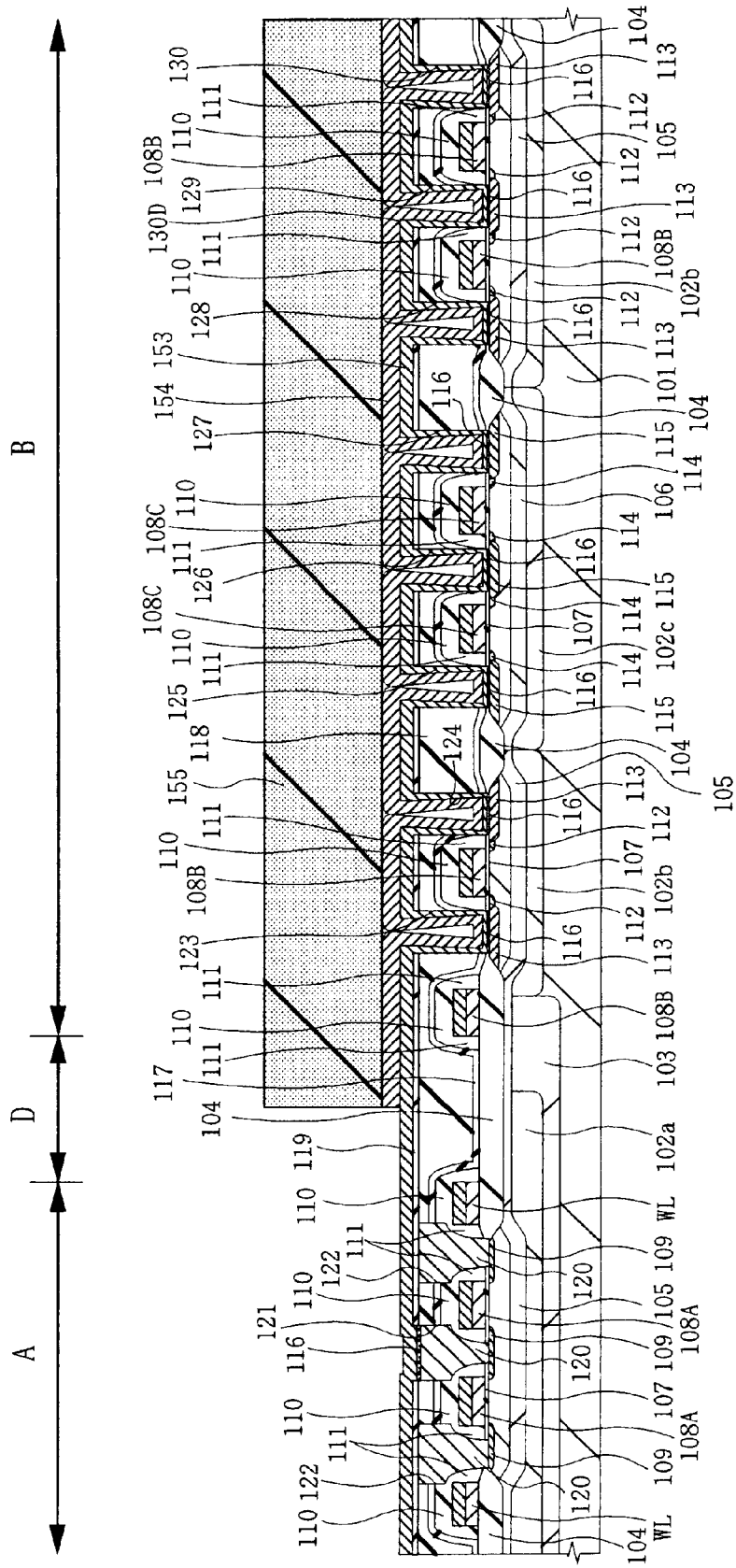

FIGS. 42 and 43 are sectional views showing successive steps of a manufacturing method of a semiconductor integrated circuit device inclusive of a DRAM according to an eighth embodiment of the present invention.

The semiconductor integrated circuit device of this eighth embodiment has substantially the same construction as the device of the seventh embodiment explained above, and is different from the latter in that the film thickness of the TiN film 153 and the W film 154 for constituting the bit line conductor BL and the interconnect conductors 130A to E is different.

The method of manufacturing the device of the eighth embodiment will be explained. First, the process steps up to FIG. 29 of the seventh embodiment may be the same.

Next, as shown in FIG. 42, the TiN film 153 and the W film 154 are deposited in the same way as the process step of FIG. 30 of the seventh embodiment. Here, the TiN film 153 is deposited to a greater thickness than the TiN film 145 in the seventh embodiment. In other words, the film thickness of the TiN film 153 is adjusted to a level such that a required resistance value of the bit line conductor at the memory cell portion A can be secured. The TiN film 153 and the W film 154 are deposited to the respective film thickness so that a required resistance value of the interconnect conductors 130A to E at the peripheral circuit portion B can be secured.

The W film 154 is then etched by using a photoresist 155, which is disposed in the same way as the photoresist 147 shown in FIG. 31, as a mask so as to remove the portion not covered with the resist film 155. In consequence, the first level interconnect conductor of the peripheral circuit portion B exists and extends from a certain position inside the boundary region D to the peripheral circuit side in the sectional view of FIG. 43. This etching is carried out under the condition where tungsten is easily etched but titanium nitride is difficultly etched. Because the W film 154 is etched under the condition where titanium nitride is etched in this way, the TiN film 153 is not etched even when over-etching is applied, and the film thickness of the memory cell portion A can be stably formed as the film thickness of the TiN film 153. Therefore, it is not necessary to control the time so as to adjust the film thickness of the tungsten film as required in the seventh embodiment. As a result, the process steps can be stabilized.

Since the subsequent process steps are the same as those of the seventh embodiment, the explanation will be omitted.

(Embodiment 9)

FIGS. 44 to 48 are sectional views showing successive steps of a method of manufacturing a semiconductor integrated circuit device inclusive of a DRAM according to a ninth embodiment of the present invention.

Figure 44:
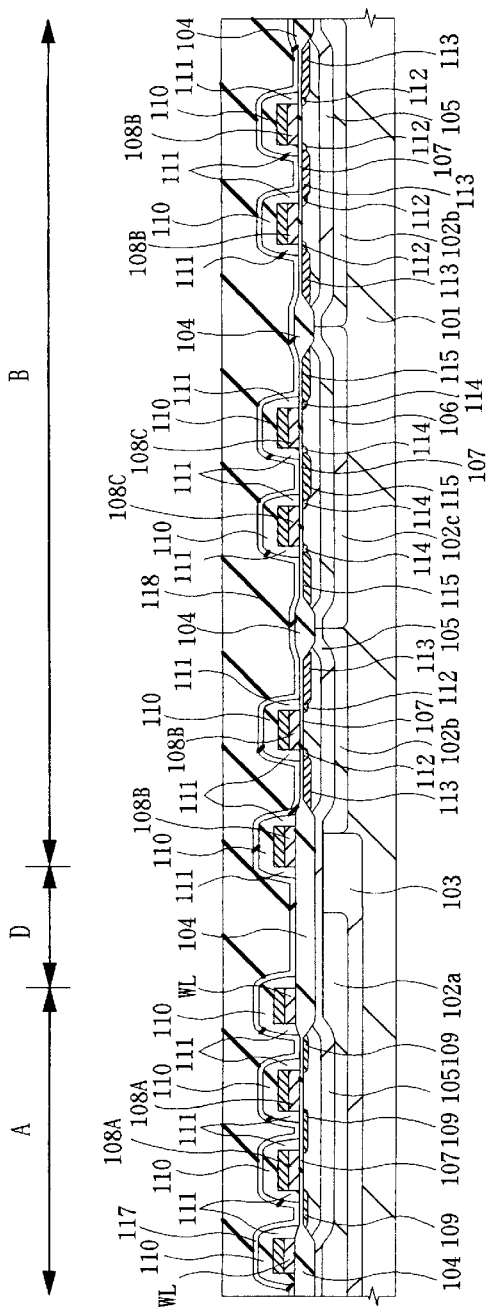
FIGS. 44 to 48 are sectional views showing step-wise a method of manufacturing a semiconductor integrated circuit device including a DRAM according to still another embodiment of the present invention.

First, a BPSG film 118 is formed in the same way as the process steps shown in FIG. 28 and its surface is planarized. In this embodiment, however, the BPSG film 118 is formed to a thickness greater by at least the difference between the bit line conductor BL and the interconnect conductor M1 than the BPSG film 118 of the seventh embodiment as shown in FIG. 44.

Figure 45:
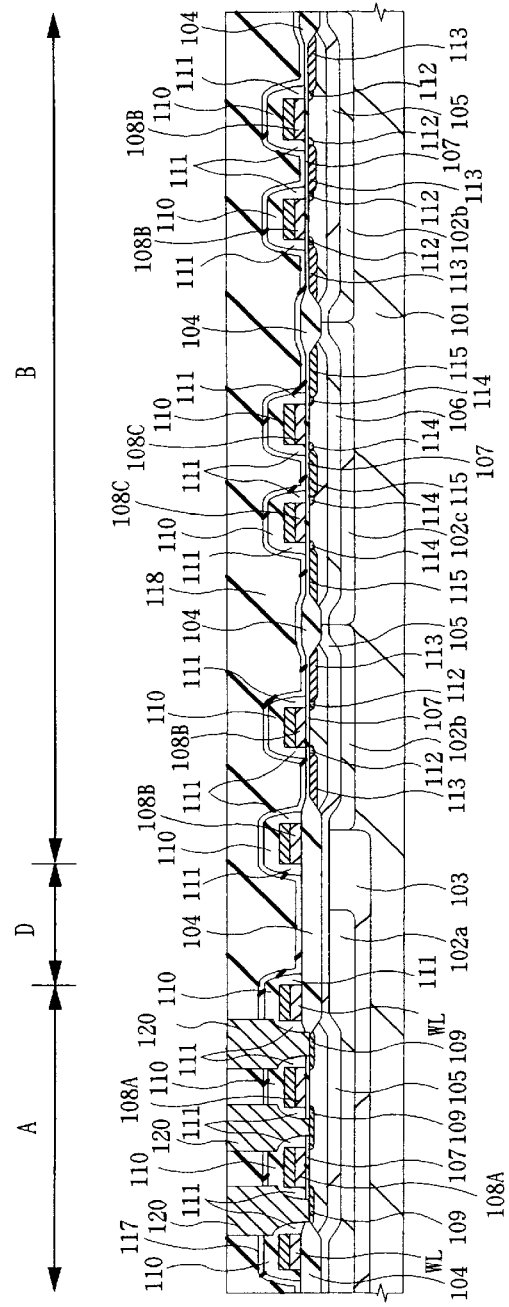

Next, as shown in FIG. 45, a plug 120 comprising a polysilicon film is formed in the same way as in the seventh embodiment.

A photoresist film 156 which covers at least a memory cell portion A formed at the first portion of a main surface of the substrate 1 (covering the memory cell portion A and a part of the boundary region D in the illustrated structure) is formed, and the BPSG film 118 of the peripheral circuit portion B is anisotropically etched by dry etching by using the photoresist film 156 as a mask. The etching depth of this BPSG film 118 corresponds to the difference of the film thickness between the bit line conductor BL and the interconnect conductors 130A to E.

Incidentally, the edge of the photoresist film 156 is set to a boundary region D. Because the photoresist film 156 is formed with the boundary region D being regarded as the boundary in this way, the mask alignment margin becomes great and the photolithography process can be made easier.

Figure 47:
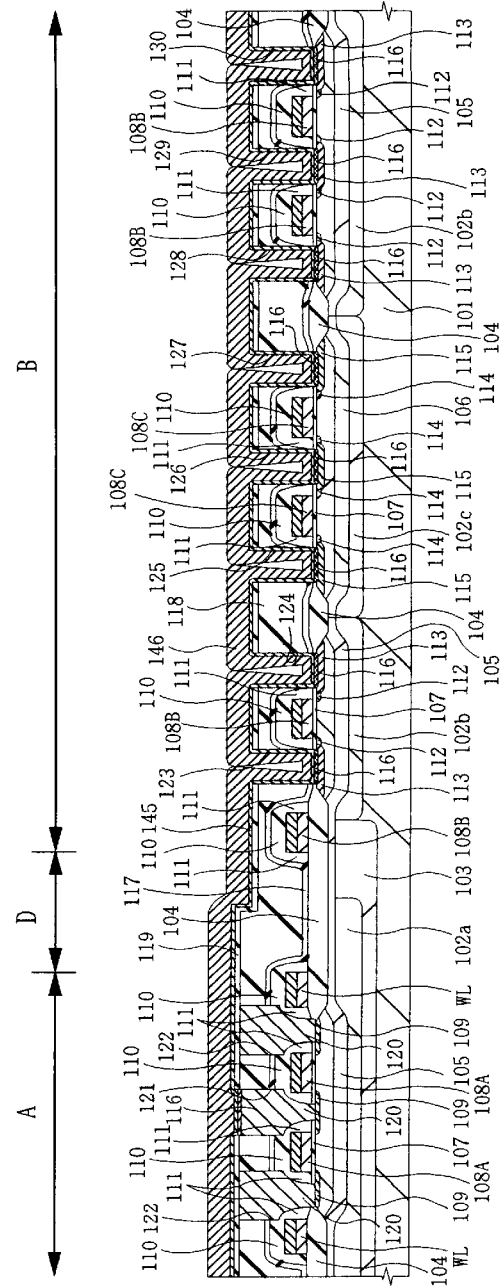
Figure 48:
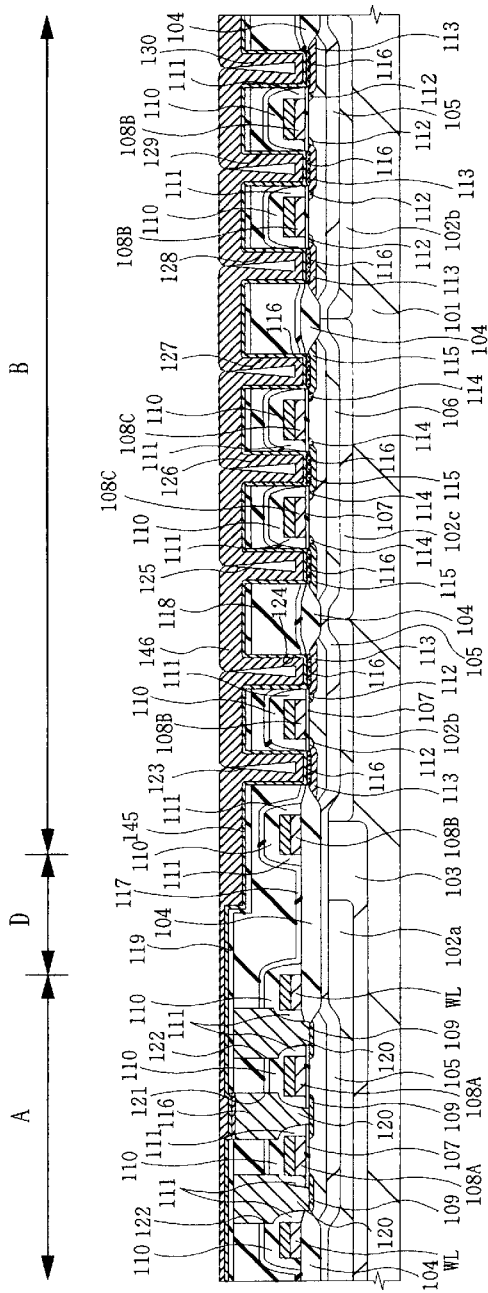

Next, a silicon oxide film 119, a TiN film 145 and a W film 146 are deposited as shown in FIG. 47 in the same way as in the seventh embodiment and furthermore, the surface of the W film 146 is planarized as shown in FIG. 48. A CMP method can be used for this planarization.

Thereafter, the W film 146 and the TiN film 145 are patterned so as to form the bit line conductor BL and the interconnect conductors 130A to E, and the explanation of this process will be omitted because it is the same as that of the seventh embodiment.

In this ninth embodiment, the surface of the W film 146 is planarized before the W film 146 and the TiN film 145 are patterned. Therefore, patterning of the W film 146 and the TiN film 145 can be effected highly accurately. In other words, focusing in photolithography for patterning need not be carried out by using the substrate having an uneven main surface as the reference, and focusing can be made with an excellent planarized surface as the reference. As a result, the photo-lithographic process can be stabilized.

(Embodiment 10)

Figure 49:
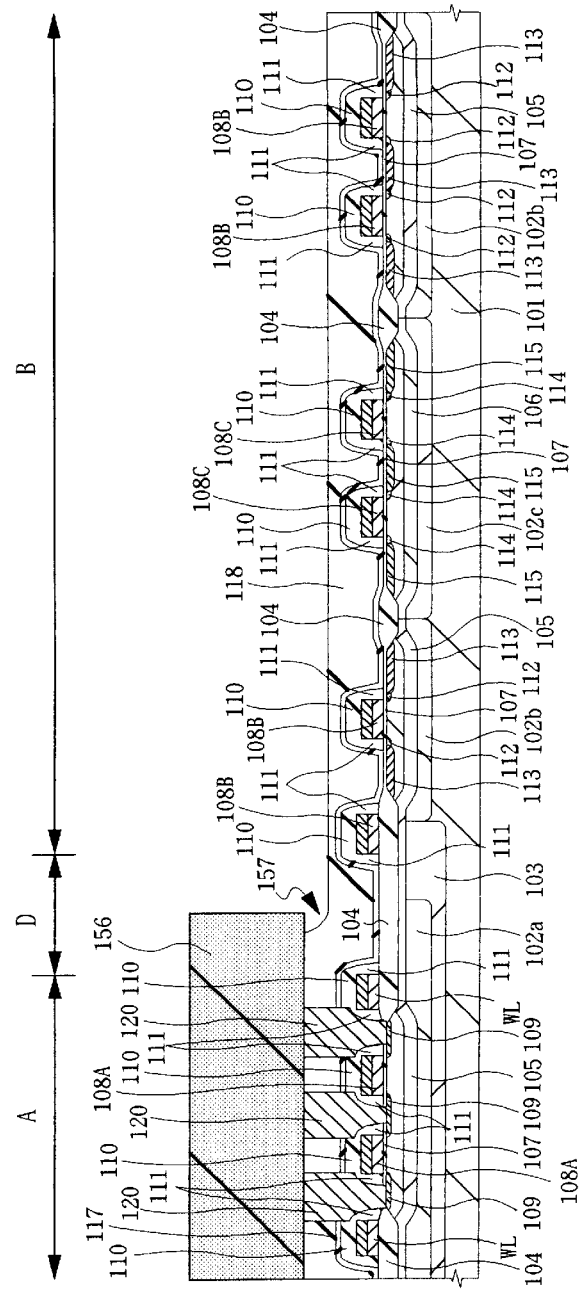
FIGS. 49 to 51 are sectional views showing step-wise a method of manufacturing a semiconductor integrated circuit device including a DRAM according to still another embodiment of the present invention.
Figure 50:
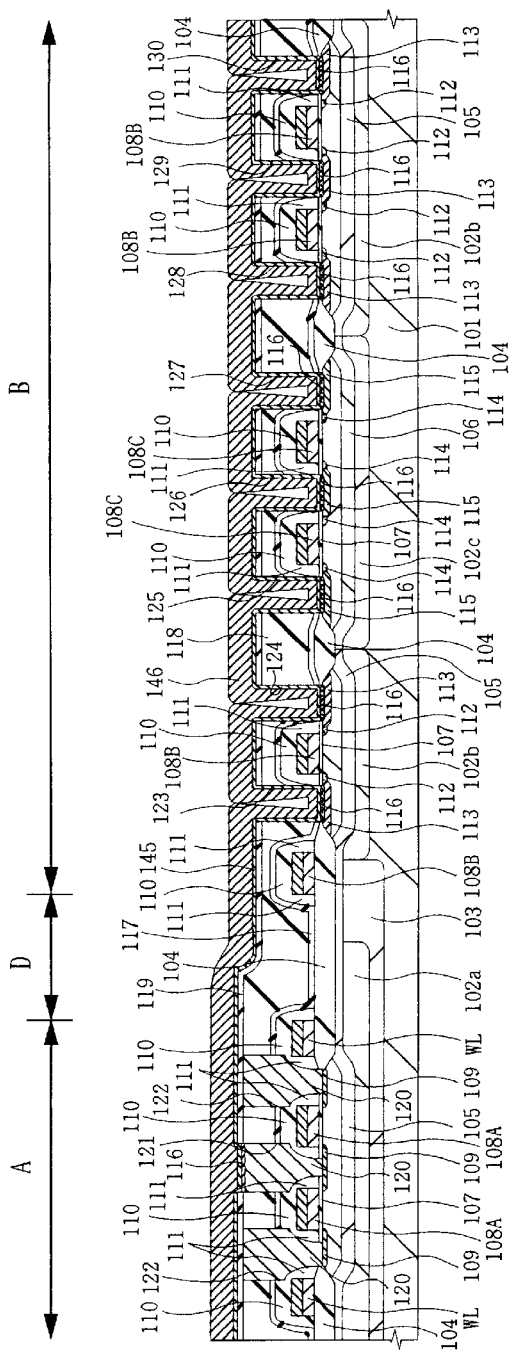
Figure 51:
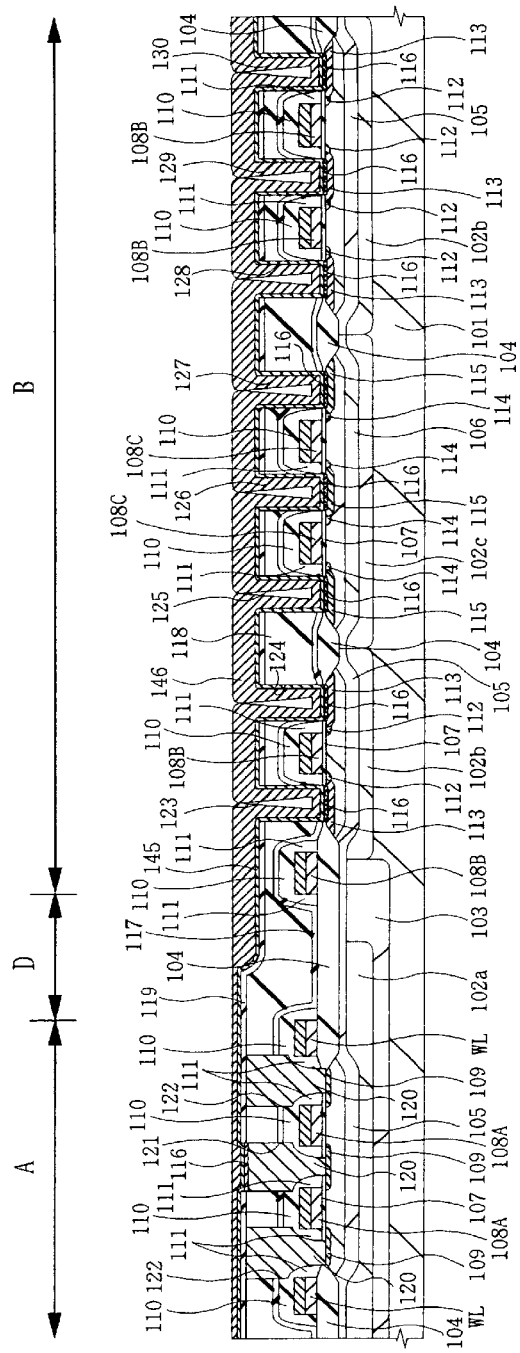
Figure 52:
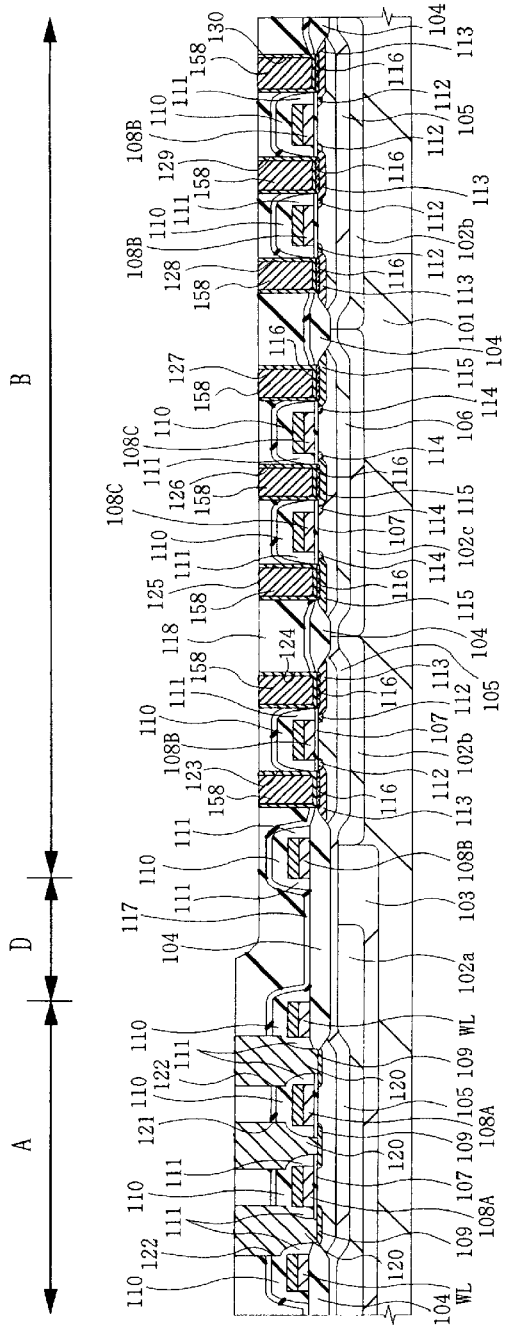
FIGS. 52 to 58 are sectional views showing step-wise a method of manufacturing a semiconductor integrated circuit device including a DRAM according to still another embodiment of the present invention.

FIGS. 49 to 51 are sectional views showing successive steps of a method of manufacturing a semiconductor integrated circuit device inclusive of a DRAM according to a tenth embodiment of the present invention.

Figure 46:
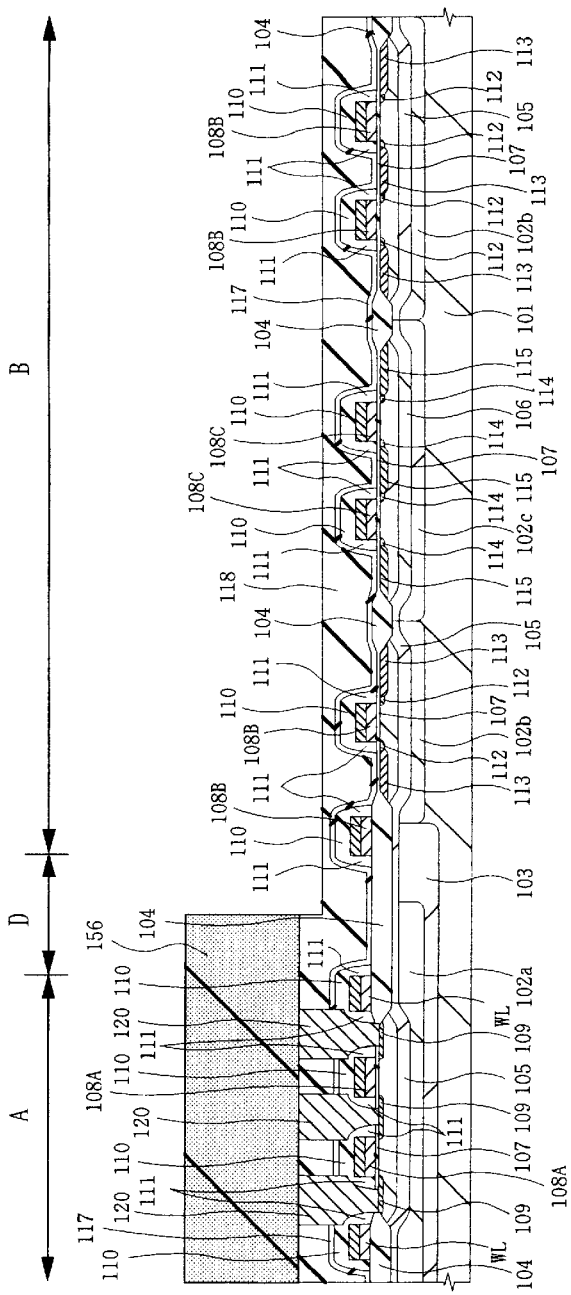

A photoresist film 156 is first formed as shown in FIG. 49 in the same way as in the ninth embodiment shown in FIG. 46. Though a BPSG film 118 is then etched, this embodiment uses wet etching in place of dry etching. Since wet etching is isotropic etching, a step portion 157 is rounded. Incidentally, the etching depth corresponds to the difference between the film thickness of the bit line conductors BL and that of the interconnect conductors 130A to E in the same way as in the ninth embodiment.

Next, a silicon oxide film 119, a TiN film 145 and a W film 146 are deposited as shown in FIG. 50, and the surface of the W film 146 is planarized as shown in FIG. 51. A CMP method can be used for this planarization.

Thereafter, the W film 146 and the TiN film 145 are patterned to form the bit line conductor BL and the interconnect conductors 130A to E but because this process step is the same as that of the seventh embodiment, the explanation will be omitted.

Besides the advantage that the surface of the W film 146 is planarized in the same way as in the ninth embodiment, this tenth embodiment can obtain the rounded step portion 157. Therefore, step coverage of the silicon oxide film 119, the TiN film 145 and the W film 146 can be improved, the step margin can be improved and the process can be stabilized. In other words, the possibility that voids are formed in the silicon oxide film 119, the TiN film 145 or the W film 146 can be reduced, and reliability of the interconnect conductors can be improved.

(Embodiment 11)

FIGS. 52 to 58 are sectional views showing successive steps of a method of manufacturing a semiconductor integrated circuit device inclusive of a DRAM according to an eleventh embodiment of the present invention.

First, a BPSG film 118 is wet etched in the same way as the step of the tenth embodiment shown in FIG. 49. The etching depth corresponds to the difference between the film thickness of the bit line conductor BL and that of the interconnect conductors 130A to E in the same way as in the tenth embodiment.

Figure 53:
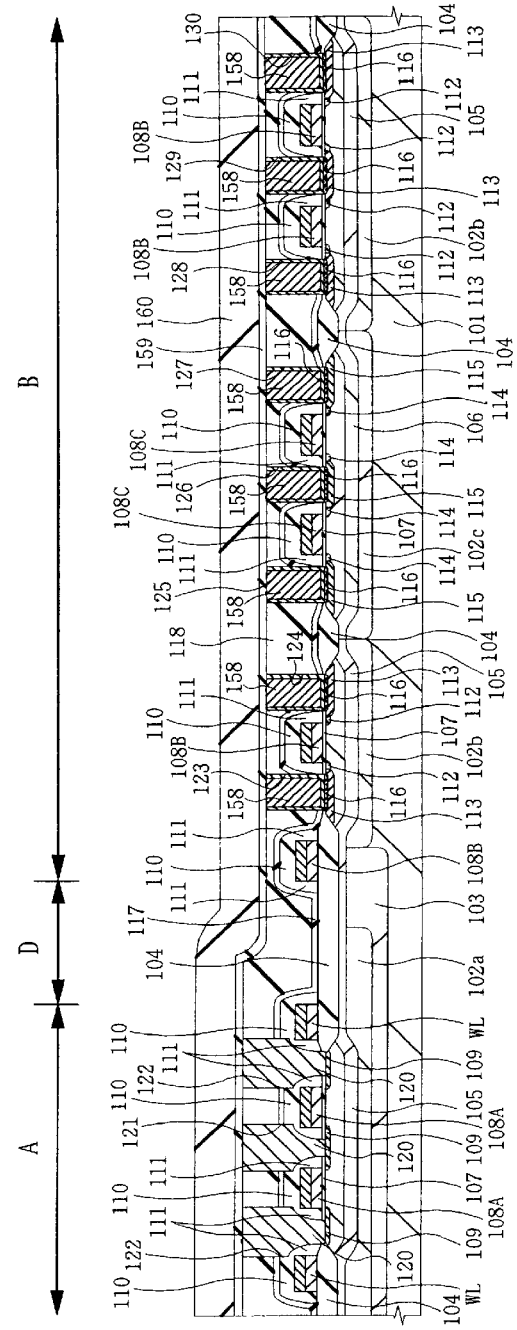
Figure 54:
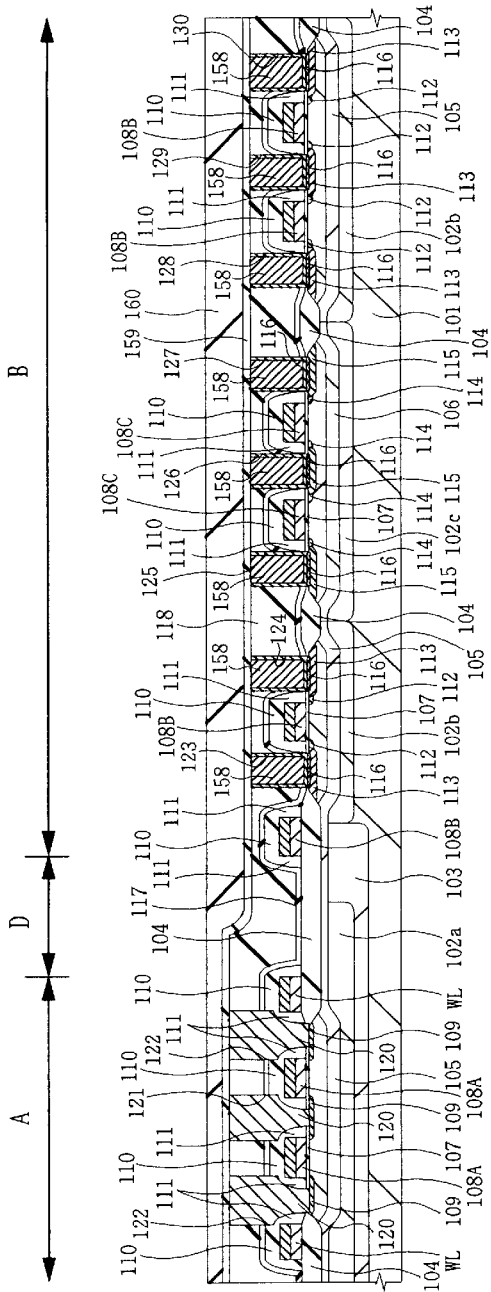

Next, a silicon nitride film 159 and a silicon oxide film 160 are serially deposited as shown in FIG. 53 and the surface of the silicon oxide film 160 is planarized as shown in FIG. 54.

Figure 55:
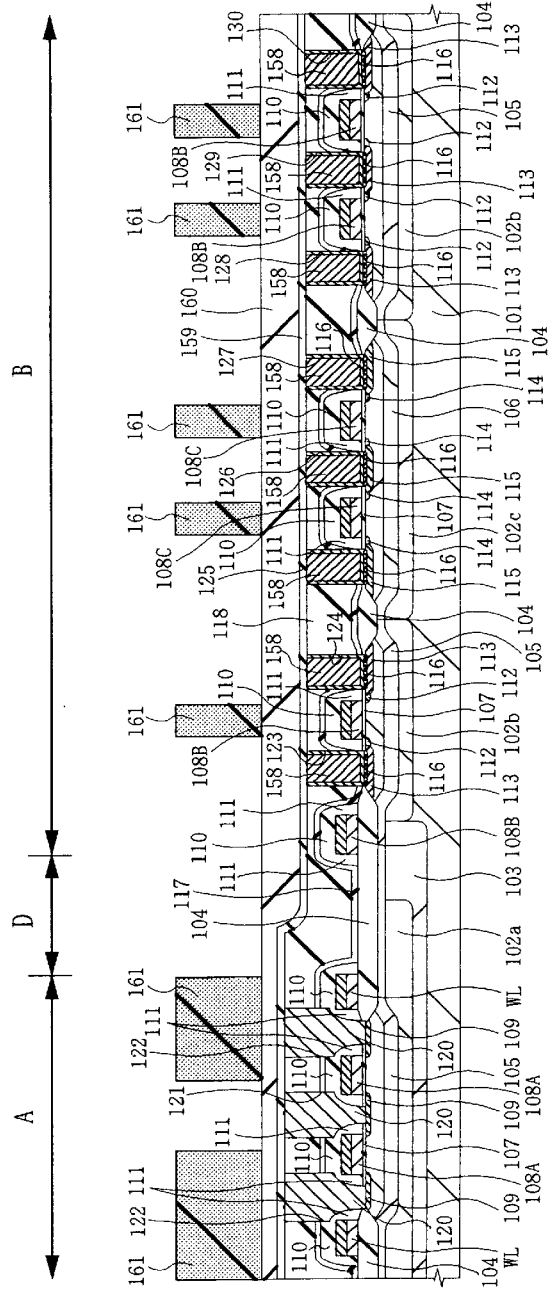
Figure 56:
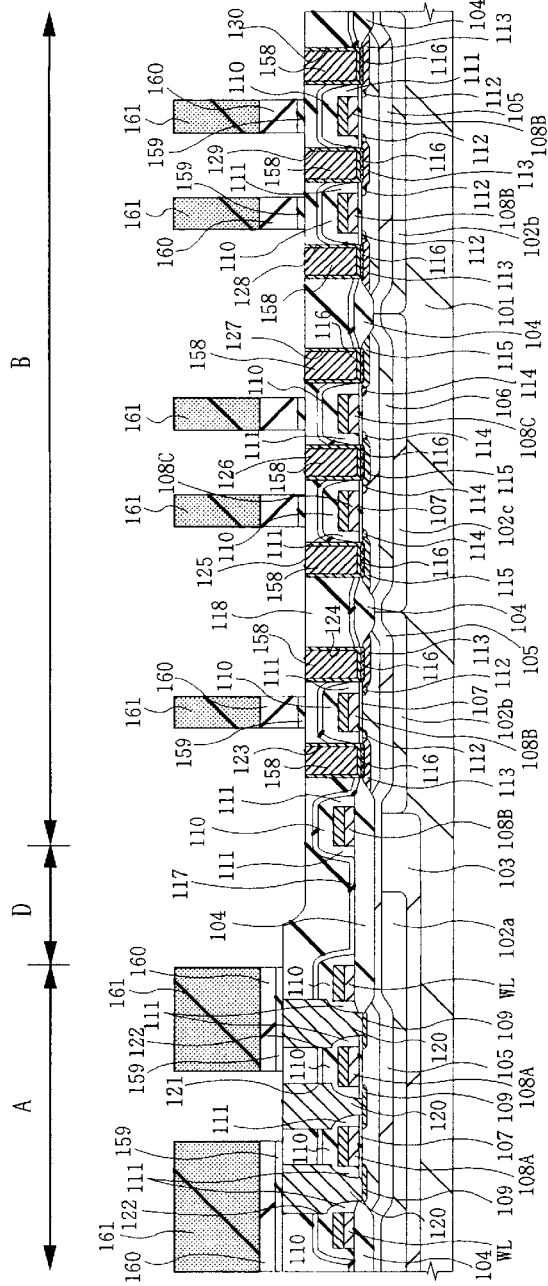

A photoresist film 161 opening to regions where the bit line conductor BL and the interconnect conductors 130A to E are formed is defined as shown in FIG. 55, and the silicon oxide film 160 and the silicon nitride film 159 are etched by using the photoresist film 161 as a mask. Etching is carried out under the condition where silicon oxide is first etched easily but silicon nitride is etched difficultly. Since the silicon nitride film 159 is not etched under such a condition, over-etching can be carried out even when the film thickness of the silicon oxide film 160 is different as shown in the drawing, and the silicon oxide film can be etched in accordance with the pattern of the photoresist film 161 in both the memory cell portion A and the peripheral circuit portion B along the shape of the silicon nitride film 159, that is, even when any step exists between the memory cell portion A and the peripheral circuit portion B. After the silicon oxide film 160 is etched, the exposed silicon nitride film 159 is etched. In this case, etching is effected under the condition where silicon nitride is easily etched. Though the silicon oxide film is etched, too, under such a condition, the influences of over-etching can be reduced by setting the film thickness of the silicon nitride film 159 to a sufficiently small value.

Figure 57:
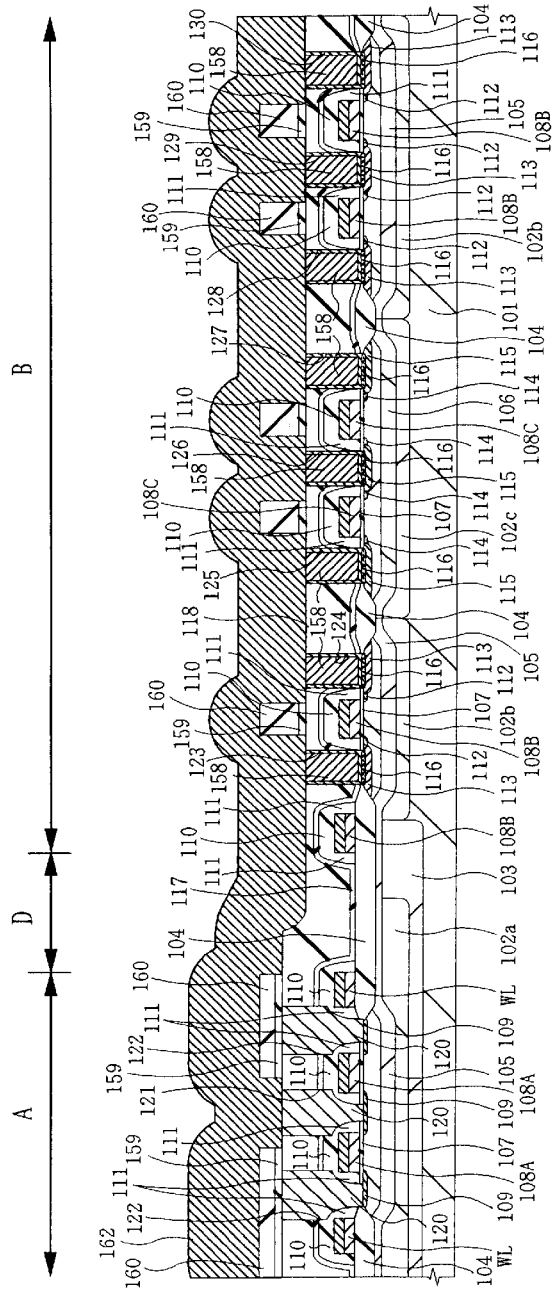
Figure 58:
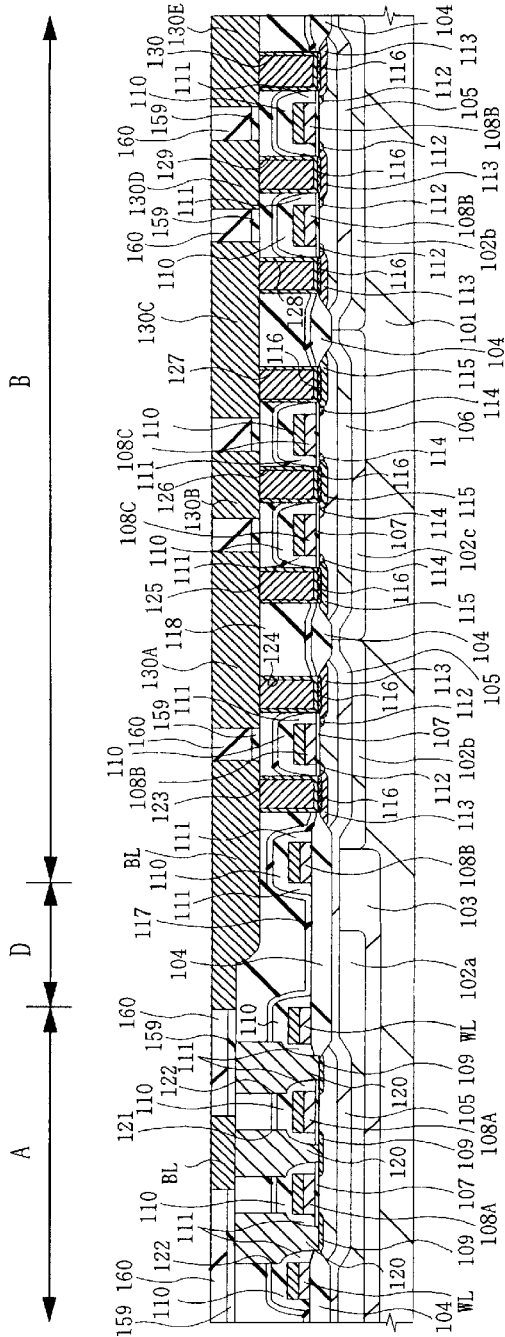

Next, a tungsten film 162 is deposited as shown in FIG. 57. This tungsten film 162 is then planarized by the CMP method and is etched back, and the tungsten film 162 is buried into trenches formed in the silicon oxide film 160 and the silicon nitride film 159 as shown in FIG. 58 so as to thereby form a bit line conductor BL and interconnect conductors 130A to E.

Since the subsequent process steps are the same as those of the seventh embodiment, the explanation will be omitted.

According to this eleventh embodiment, the bit line conductors BL and the interconnect conductors 130A to E can be formed by the so-called "Damascene method", and a metal film such as a tungsten film whose fine patterning has been difficult can be carried out. Needless to say, the advantages obtained by the seventh embodiment can be obtained in this eleventh embodiment, too.

Incidentally, the metal to be buried into the trenches formed in the silicon oxide film 160 and in the silicon nitride film 159 is not particularly limited to tungsten, and metals having high conductivity such as copper, platinum, gold, etc. can be used.

(Embodiment 12)

FIGS. 59 to 66 are sectional views showing successive steps of a method of manufacturing a semiconductor integrated circuit device inclusive of a DRAM according to a twelfth embodiment of the present invention.

Figure 59:
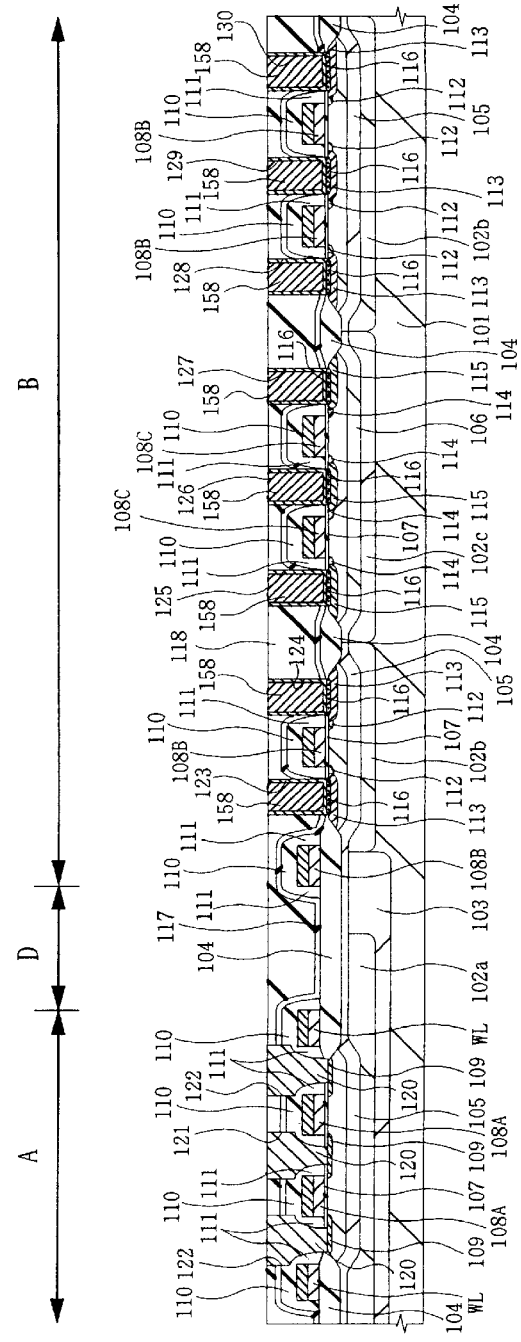
FIGS. 59 to 66 are sectional views showing step-wise a method of manufacturing a semiconductor integrated circuit device including a DRAM according to still another embodiment of the present invention.

First, a plug 120 is formed by the steps up to those shown in FIG. 29 in the seventh embodiment and then contact holes 123 to 130 are opened by using a photoresist film as a mask as shown in FIG. 59. After a titanium silicide layer 116 is formed in the same way as in the seventh embodiment, a titanium nitride film and a tungsten film are serially deposited and are then etched back so as to form a plug 158 made of titanium nitride and tungsten inside each of the contact holes 123 to 130.

Figure 60:
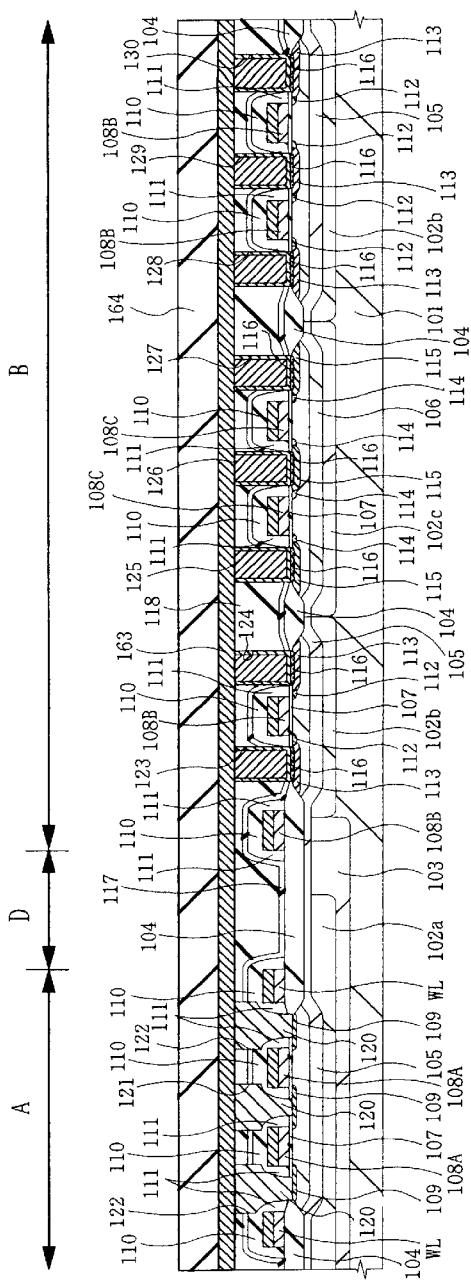
Figure 61:
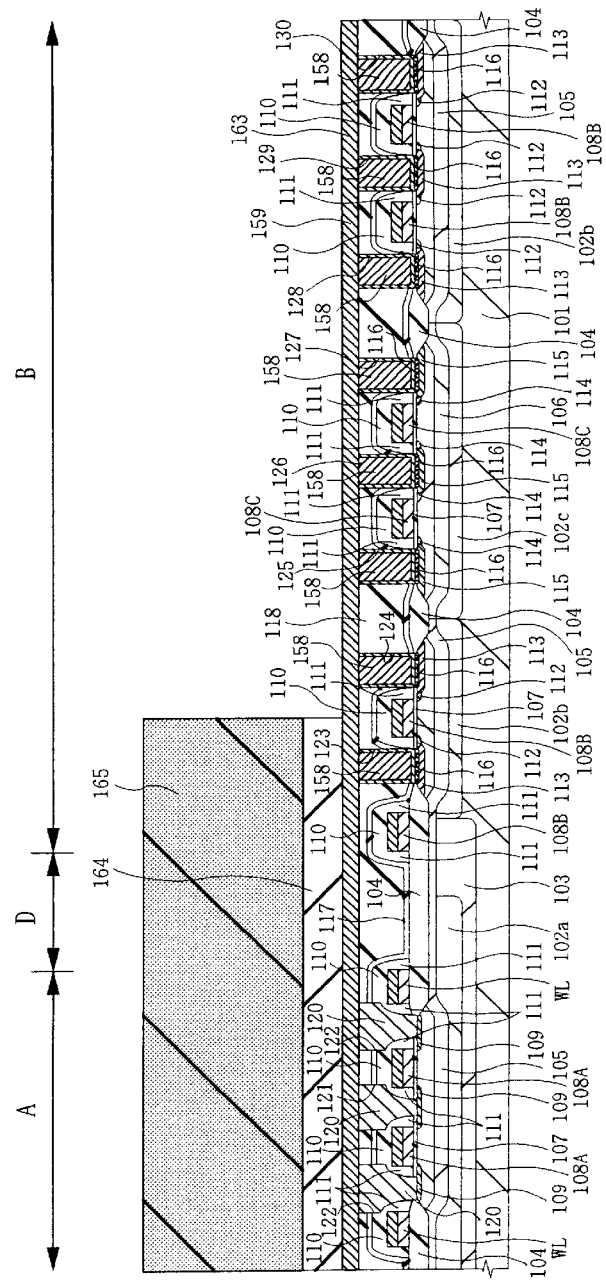

Next, as shown in FIG. 60, a tungsten film 163 and a silicon oxide film 164 are serially deposited, and the silicon oxide film 164 is etched by using a photoresist film 165 as a mask as shown in FIG. 61. In this instance, the edge of the photoresist film 165 exists over the shared MISFETQshr inside the peripheral circuit portion or in other words, the photoresist film 165 covers at least the memory cell portion A formed at the first portion of a main surface of a substrate (the photoresist film 165 is shown as covering the memory cell portion A, the boundary region D and a part of the peripheral circuit portion B). Incidentally, since the shared MISFETQshrs are so formed as to deviate alternately from one another as shown in FIG. 22, the pattern of the edge of the photoresist film 165 becomes zigzag in match with this arrangement of the shared MISFETQshrs. In FIG. 22, the boundary line is represented by "II".

Figure 62:
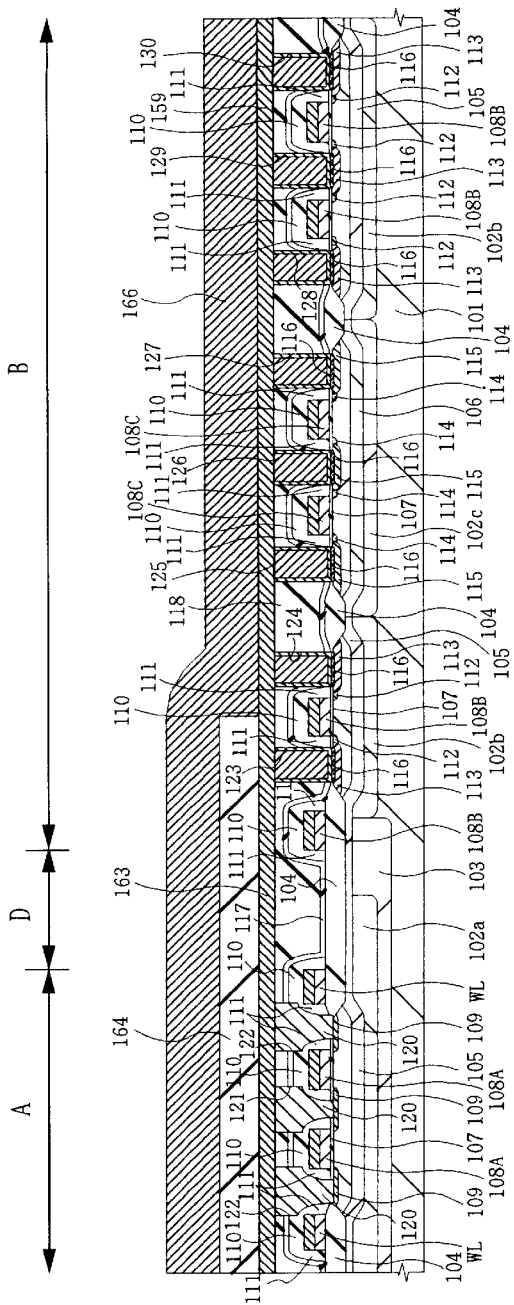
Figure 63:
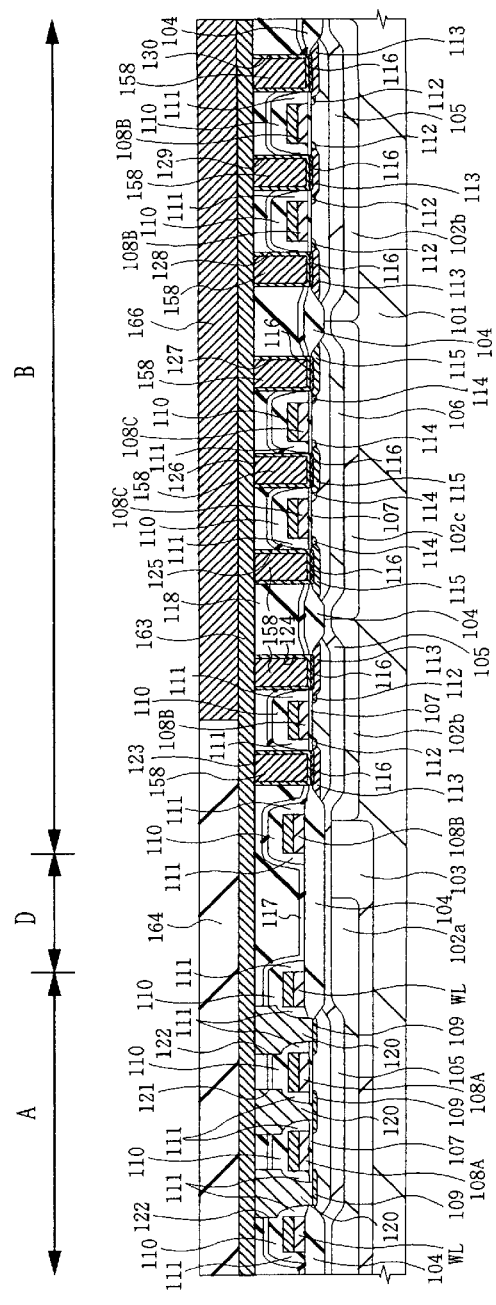

After a tungsten film 166 is deposited as shown in FIG. 62, the surface of this film 166 is then planarized as shown in FIG. 63. Planarization is carried out by a CMP method, for example, and the silicon oxide film 164, too, is somewhat cut off so that the tungsten film 166 should not be left on the silicon oxide film 164.

Figure 64:
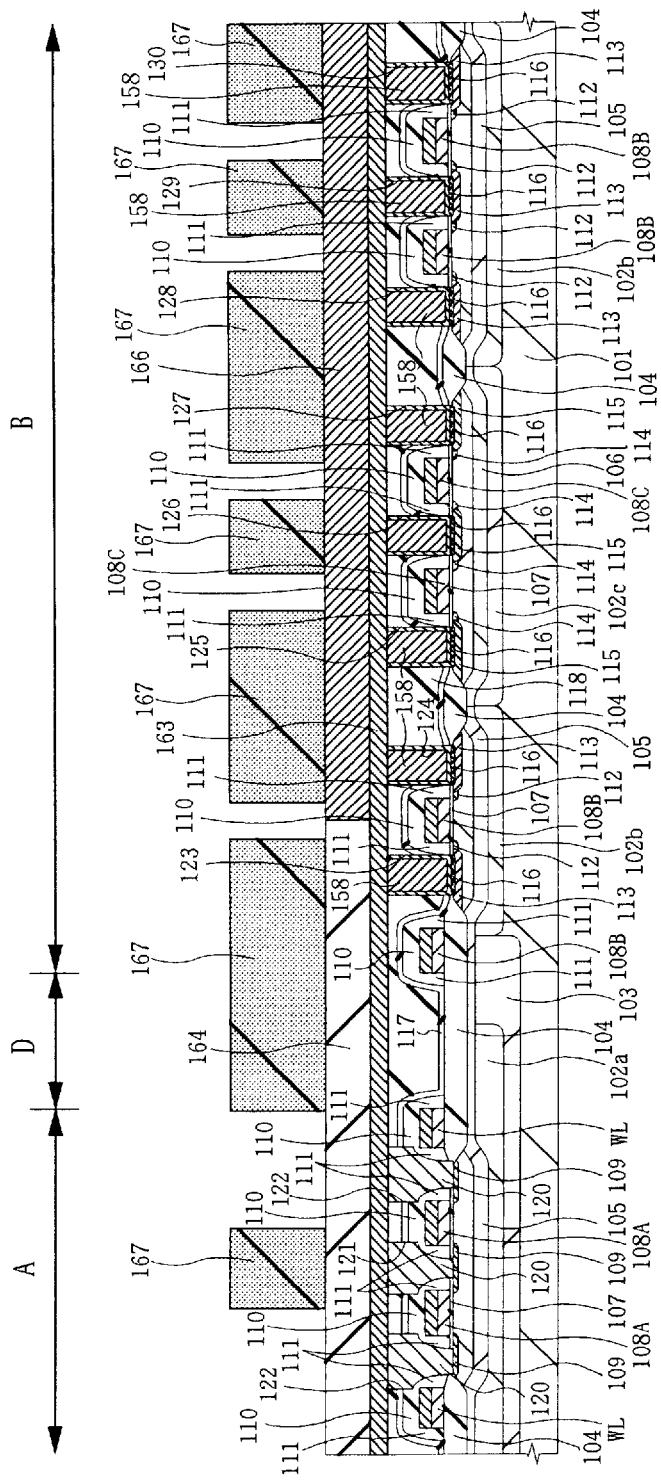

Next, a photoresist film 167 having openings in the region where the tungsten films 163 and 166 are to be removed is formed as shown in FIG. 64.

Figure 65:
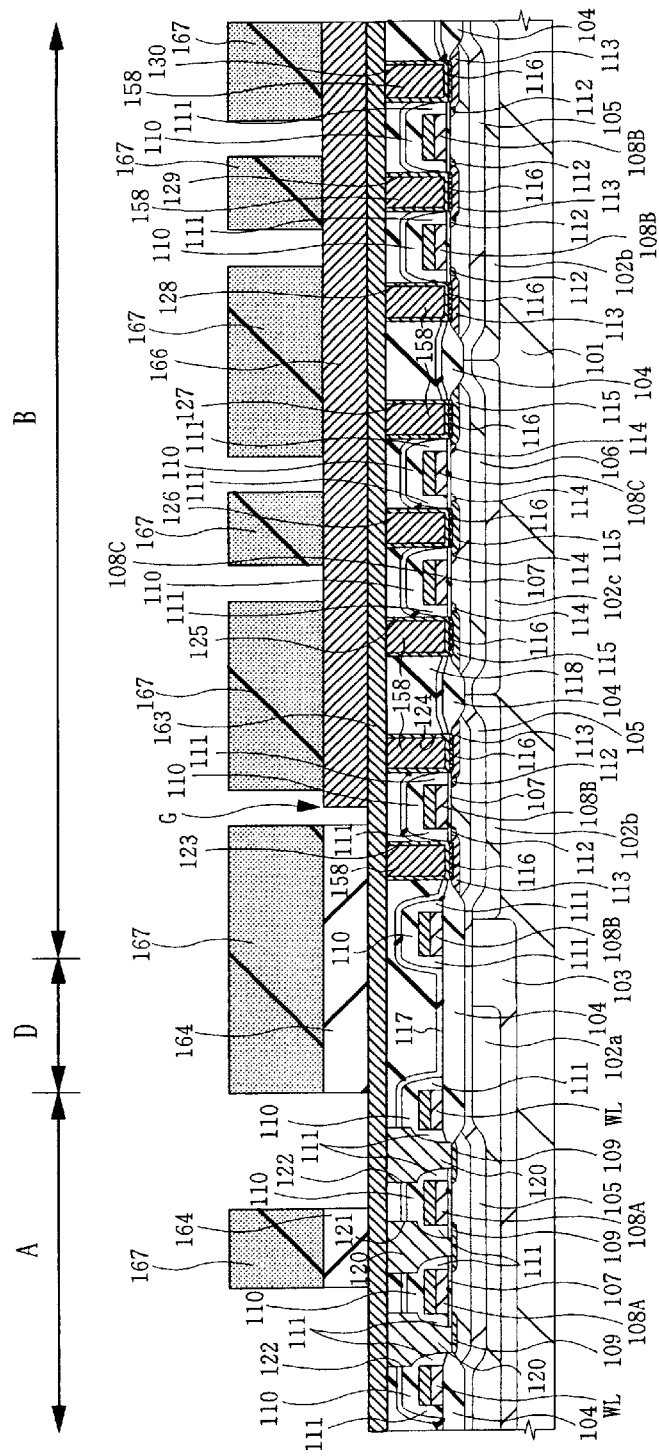
Figure 66:
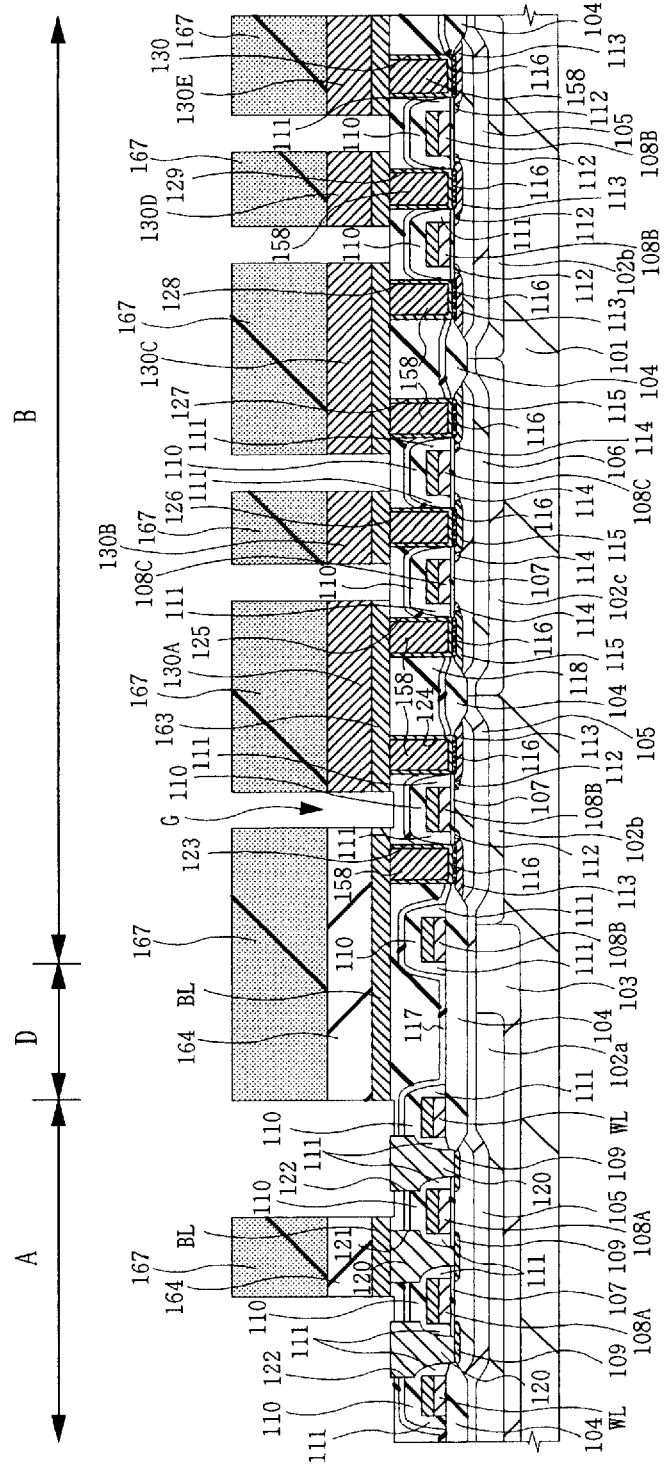

The silicon oxide film 164 is then etched by using the photoresist film 167 as the mask as shown in FIG. 65 and then the tungsten films 163 and 166 are etched by using the photoresist film 167 as the mask as shown in FIG. 66. As a result, bit line conductors BL and interconnect conductors 130A to E are formed. The subsequent process steps are the same as those of the seventh embodiment and their explanation will be therefore omitted.

In addition to the effects explained in the seventh embodiment, this twelfth embodiment can improve controllability of the film thickness of the bit line conductor BL because it is constituted by the tungsten film 163. In other words, this twelfth embodiment forms the bit line conductor BL as a region having a small film thickness by only the deposition of the tungsten film 163 without using means for forming a thin film such as etching of the tungsten film. Deposition of thin films generally has high controllability and consequently, DRAM performance can be improved by improving uniformity of the film thickness of the bit line conductor BL. Since accuracy of sense amplifiers greatly depends on the balance between the bit line conductors interposing the sense amplifier therebetween, both of the sensitivity of the sense amplifiers and DRAM performance can be improved by uniforming the film thickness of the bit line conductors and improving their parasitic capacity and resistance value.

By the way, the film thickness of the tungsten film at the memory cell portion A becomes small during etching of the tungsten films 163 and 166. Therefore, over-etching develops at the memory cell portion A as shown in the drawing. However, this problem can be avoided by forming in advance the BPSG film 118 to a greater thickness.

According to this twelfth embodiment, the boundary of the photoresist film 165 exits on the shared MISFETQshr. Therefore, even when any patterning defect occurs at the position (G portion in FIG. 65) at which the film thickness of the tungsten films 163 and 166 changes, the problem described above does not get actualized because such a patterning defect portion is removed.

(Embodiment 13)

Figure 67:
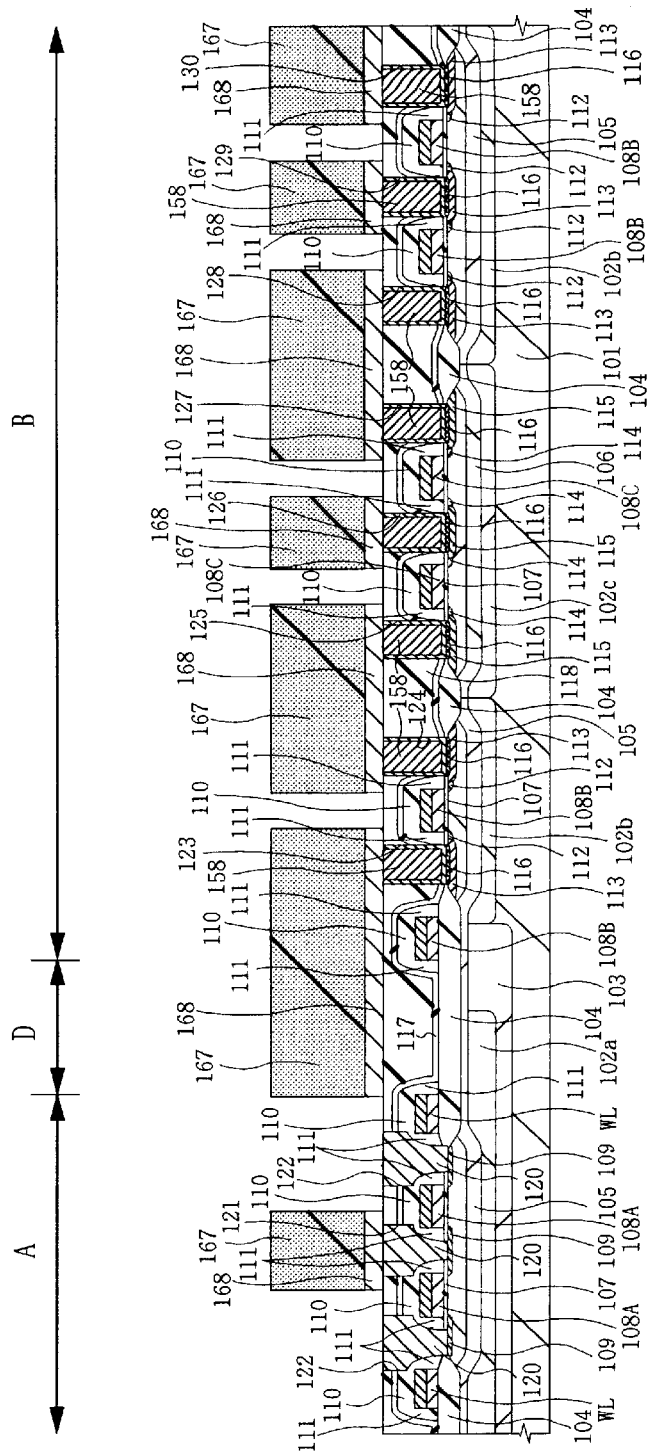
FIGS. 67 to 69 are sectional views showing step-wise a method of manufacturing a semiconductor integrated circuit device including a DRAM according to still another embodiment of the present invention.
Figure 68:
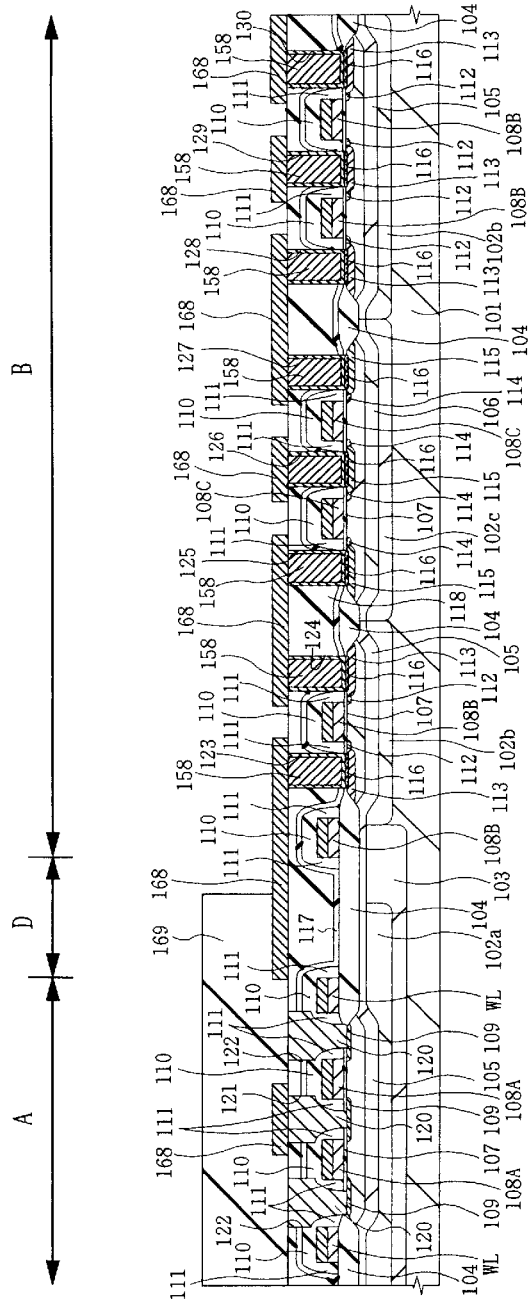
Figure 69:
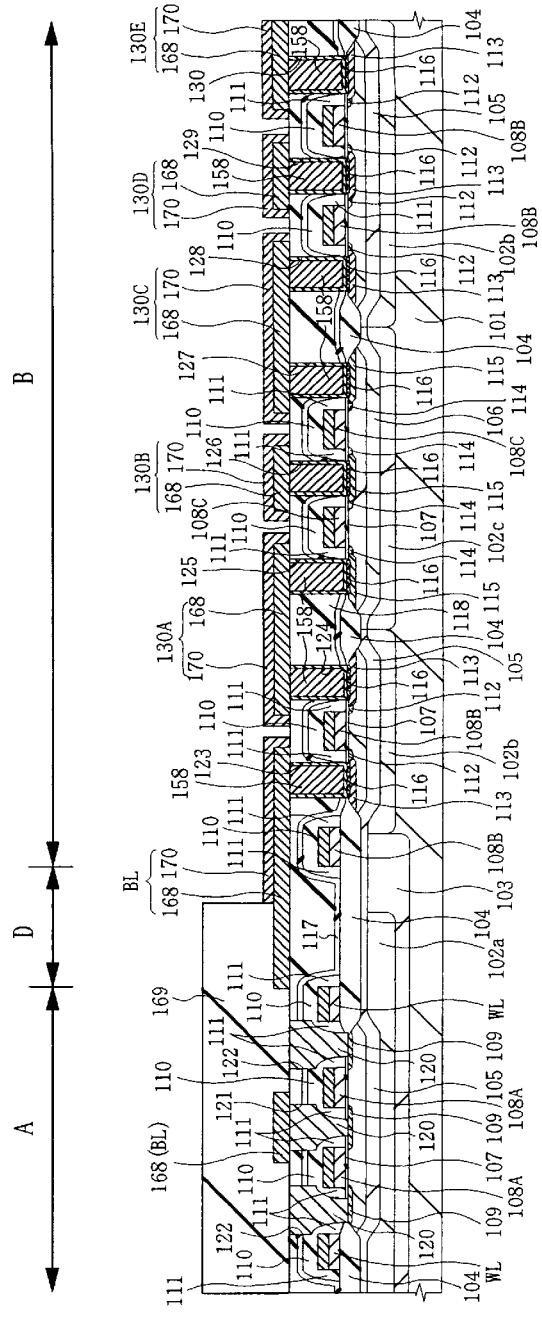

FIGS. 67 to 69 are sectional views showing successive steps of a method of manufacturing a semiconductor integrated circuit device inclusive of a DRAM according to a thirteenth embodiment of the present invention.

First, contact holes 123 to 130 and a titanium silicide layer 116 are formed in the same way as the process steps shown in FIG. 59 in the twelfth embodiment, and a tungsten plug 158 is formed inside each of the contact holes 123 to 130.

After a tungsten film 168 is deposited, this tungsten film 168 is patterned by using a photoresist film 167 as a mask as shown in FIG. 67. In this case, the film thickness of the tungsten film 168 is set to be equal to that of bit line conductors BL.

Next, a silicon oxide film 169 is formed in such a fashion as to cover at least the tungsten film 168 at the memory cell portion A, which is formed at the first portion of a main surface of a substrate 101 (in such a fashion as to cover the memory cell portion A and a part of a boundary region D in the drawing) as shown in FIG. 68. This silicon oxide film 169 is formed by depositing a silicon oxide film to the entire surface of the semiconductor substrate 101 and patterning the silicon oxide film.

Next, a tungsten film 170 is selectively deposited on the surface of the tungsten film 168 which is exposed by a selective CVD process of the tungsten film, as shown in FIG. 69. In consequence, interconnect conductors 130A to E comprising the tungsten film 168 and the tungsten film 170 formed by the selective CVD process are formed. Incidentally, the bit line conductors BL are constituted by the tungsten film 168. Since the subsequent process steps are the same as those of the seventh embodiment, their explanation will be omitted.

This thirteenth embodiment can simplify the process steps because it increases the film thickness of the interconnect conductors of the peripheral circuit portion B by using the selective CVD process.

Although the present invention completed by the present inventors has thus been described concretely with reference to the preferred embodiments, the invention is not particularly limited thereto but can be naturally changed or modified in a variety of ways without departing from the scope thereof.

For example, though the foregoing embodiments use the W film as the conductor film for constituting the bit line conductor and the first level interconnect conductor, other conductor films such as an aluminum alloy film, a copper film, etc. may be used, as well.

The seventh to tenth embodiments described above represent the case where the interconnect conductors 130A to E and the semiconductor substrate 101 are directly connected by the titanium nitride film and the tungsten film constituting the interconnect conductors without using the plug, but the tungsten plug using the titanium nitride film as the barrier layer may be employed, too, in the same way as in the eleventh to thirteen embodiments.

The plug for connecting the interconnect conductors 130A to E and the semiconductor substrate 101 is not particularly limited to the tungsten plug using the titanium nitride film as the barrier layer but may be a tungsten plug formed by a blanket CVD process using a titanium nitride film or a sputtered tungsten film as a bonding layer.

Figure 70:
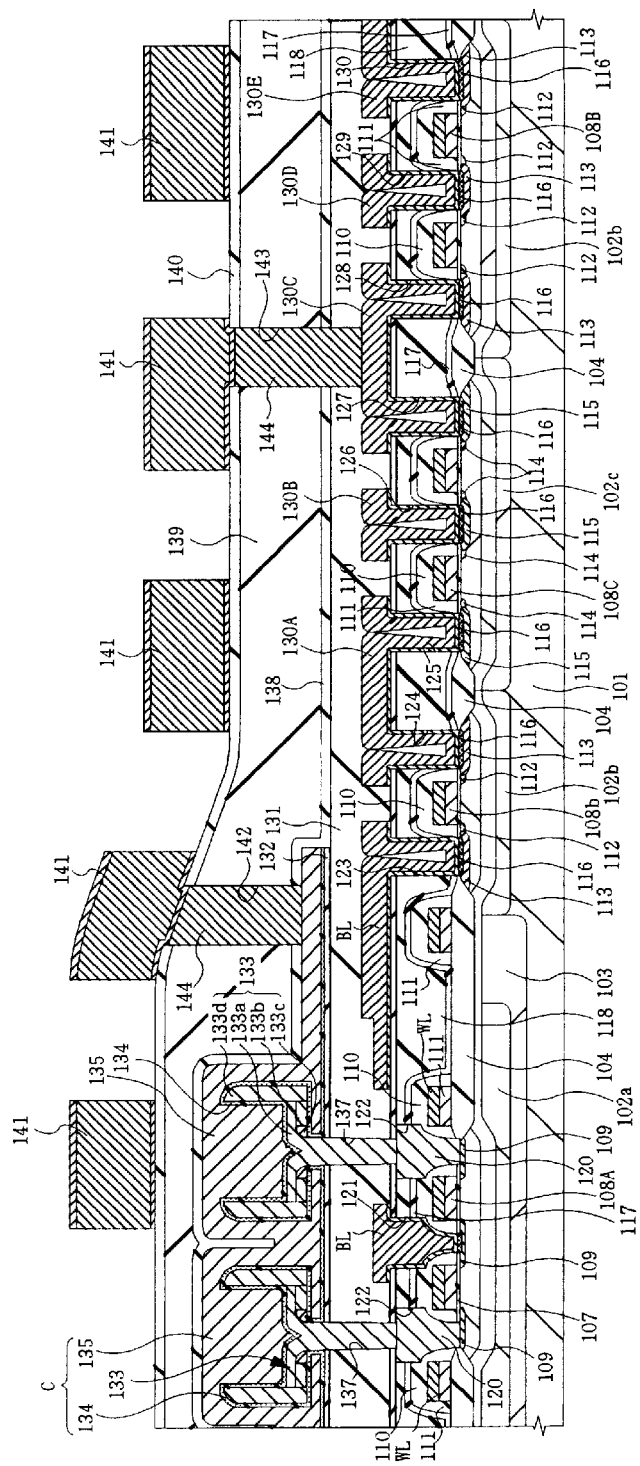
FIG. 70 is a sectional view showing a semiconductor integrated circuit device including a DRAM according to still another embodiment of the present invention.

Though the foregoing embodiments represent the example of the plug comprising the polysilicon film for the connection of the bit line conductors BL and the semiconductor substrate 101, they may be directly connected by the titanium nitride film and the tungsten film that constitute the bit line conductor BL, as shown in FIG. 70. Further, the plug may be a tungsten plug using a titanium nitride film as the barrier layer or a tungsten plug formed by a blanket CVD process using a titanium nitride film or a sputtered tungsten film as the bonding layer.

Figure 71:
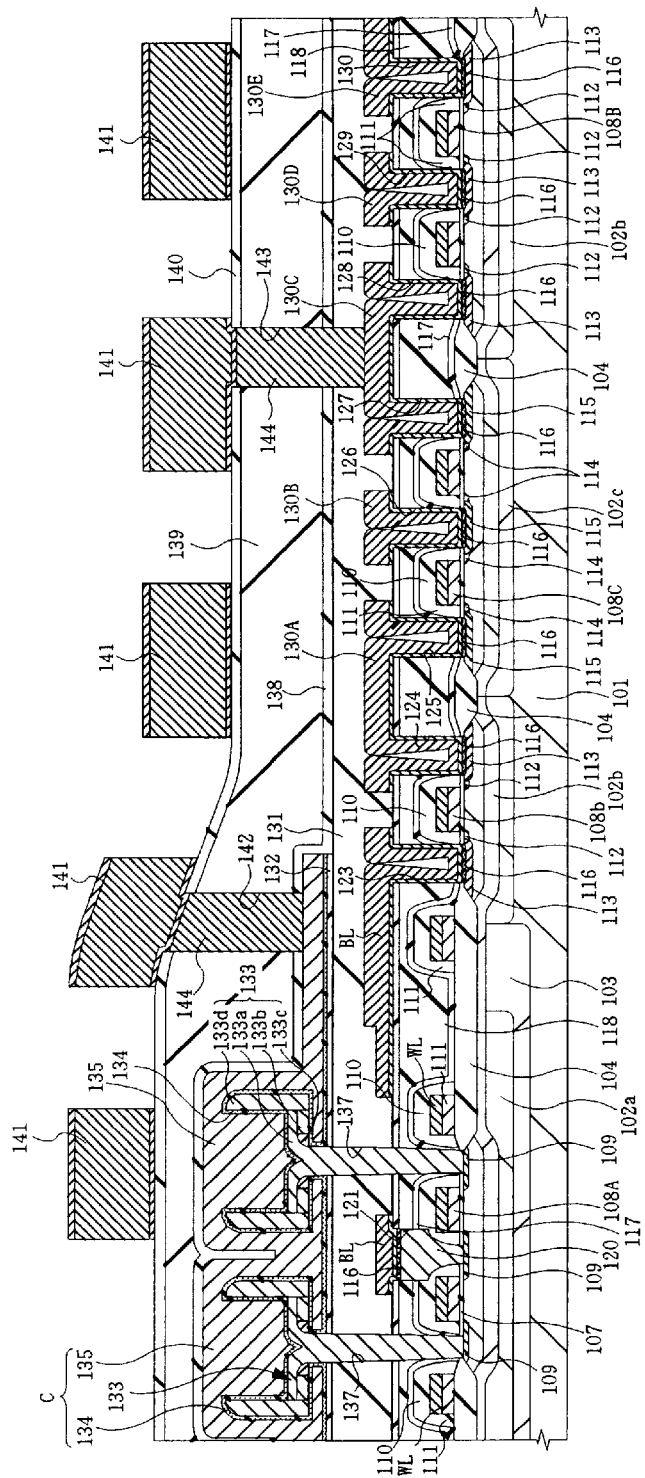
FIG. 71 is a sectional view showing a semiconductor integrated circuit device including a DRAM according to still another embodiment of the present invention.

The foregoing embodiments represent the case where the storage electrode (lower electrode) of the information storage capacitor device C is connected to the semiconductor substrate 101 through the plug comprising the polysilicon film but the storage electrode may be directly connected to the semiconductor substrate 101 by a part of polysilicon constituting the lower electrode without using the plug as shown in FIG. 71.

As can be clearly understood from the foregoing embodiments, the present invention can reduce the parasitic capacity of the bit line conductors and can also reduce the resistance of the interconnect conductors of the peripheral circuit in the semiconductor integrated circuit device in which the bit line conductors and the first level interconnect conductors in the peripheral circuit are formed in the same level.

The bit line conductors having a low parasitic capacity and the interconnect conductors having a low resistance in the peripheral circuit portion can be formed in the same process.

When the film thickness of the bit line conductor is different from the film thickness of the interconnect conductor on the MISFET for selectively connecting the memory cell portion and the sense amplifier of the peripheral circuit portions as the boundary, patterning accuracy is likely to drop at the portion having this difference of film thickness during patterning of the bit line conductor and the interconnect conductor. However, because the conductive film constituting the bit line conductor and the interconnect conductor is removed on the MISFET by etching, the drop of patterning accuracy does not get actualized. When the film thickness of the bit line conductor is different from that of the interconnect conductor at the boundary region between the peripheral circuit portion and the memory cell portion as the boundary, positioning accuracy of the mask used for patterning the bit line conductor and the interconnect conductor need not be increased. Therefore, the load to the process steps can be reduced by increasing the processing margin.

The interconnect conductor described above may be a laminate film of a first conductor film and a second conductor film having an etching selection ratio to the first conductor film and the bit line may comprise the first conductor film.

According to the semiconductor integrated circuit device described above, the first conductor film can be allowed to function as an etching stopper of the second conductor film when the thickness of the conductor film is reduced. As a result, the reduction of the film thickness of the conductor film becomes easier and the processing margin of the process steps can be increased.

A single-layered film of a titanium nitride film or a laminate film containing the titanium nitride film is an example of the first conductor film and a tungsten film is an example of the second conductor film.

The bit line conductor may comprise the tungsten film and the interconnect conductor may be the tungsten film and a tungsten selective CVD growth film formed on the surface of the tungsten film.

According to the semiconductor integrated circuit device described above, the film thickness and width of tungsten at the interconnect conductors can be easily increased by the selective CVD growth of tungsten and the resistance value of the interconnect conductors can be reduced.

A plug made of polysilicon or a metal may be formed in the contact hole for connecting the bit line conductor and the semiconductor substrate. A plug made of polysilicon may be formed in the contact hole for connecting the MISFET and the information storage capacitor device that together constitute the memory cell. Alternatively, it is possible to employ the structure wherein the plug is not formed in the contact hole and the lower electrode of the information storage capacitor device is directly connected to the main surface of the semiconductor substrate.

According to the first and seventh embodiments, the thickness of the conductor film located at the memory cell portion is reduced by etch-back. Therefore, the film thickness of the bit line conductor formed by processing the conductor film located at the memory cell portion can be made smaller than the film thickness of the interconnect conductor formed by processing the conductor film located at the peripheral circuit portion. In other words, the thin bit line conductor constituted by the conductor film of the same level and the thick interconnect conductor of the peripheral circuit portion can be formed at the same process step.

Incidentally, the reduction of the film thickness can be achieved also by using a laminate film of a titanium nitride film and a tungsten film serially deposited on an insulating film as the conductor film described above and etching the conductor film under the condition where the titanium nitride film is difficulty etched so as to remove the tungsten film located at the memory cell portion. In such a case, the titanium nitride film is not excessively etched even when over-etching is effected during etching of the tungsten film, and the film thickness of the conductor film can be stably reduced.

According to the second, third, ninth, tenth and eleventh embodiments, the conductor film is deposited after the insulating film at the peripheral circuit portion is etched back and is then planarized. Therefore, the film thickness of the bit line conductor, which is formed by processing the conductor film located at the memory cell portion, can be made smaller than the film thickness of the interconnect conductor formed by processing the conductor film located at the peripheral circuit portion. In other words, the thin bit line conductor of the same level and the thick interconnect conductor at the peripheral circuit portion can be formed by the same process step.

Since the conductor film before patterning of the bit line conductor and the interconnect conductor is planarized, the photoresist mask for patterning the bit line conductor and the interconnect conductor can be formed with a high level of accuracy. In other words, the occurrence of the focus error due to the existence of a foundation step of the photomask can be restricted.

Incidentally, etch-back of the insulating film can be conducted by the wet etching method and the dry etching method. In the case of wet etching, it is possible to mitigate the step of the regions having different film thickness of the conductor films, to increase the process margin in the subsequent planarization step of the conductor film or in the patterning step of the bit line conductor and the interconnect conductor, and to stabilize the process steps.

According to the fourth embodiment, the second insulating film is processed so that the film thickness of the second insulating film located at the memory cell portion becomes substantially equal to the thickness of the bit line conductor at the peripheral circuit portion and after the second insulating film is etched to form the trenches, the conductor film is deposited over the semiconductor substrate and is then processed so as to form the bit line conductor and the interconnect conductor of the peripheral circuit portion inside the trenches. Therefore, it is possible to make the film thickness of the bit line conductor different from that of the interconnect conductor, that is, to make the bit line conductor thin and the interconnect conductor thick, and to form the thin bit line conductor and the thick interconnect conductor of the peripheral circuit portion made of the same conductor material, by the same process step.

In this case, the first insulating film located at the peripheral circuit portion can be etched back by the dry etching method or the wet etching method by using the photoresist film formed at the memory cell portion as the mask so that the level difference between the top faces of the first insulating film located at the memory cell portion and that of the first insulating film position at the peripheral circuit portion is substantially equal to the difference of the thickness between the bit line conductor and the interconnect conductor at the peripheral circuit portion.

According to the fifth, sixth and twelfth embodiments described above, the thin bit line conductor and the thick interconnect conductor constituted by the conductor film of the same level can be formed at the same process step.

Incidentally, the bit line conductors disposed in the regions (boundary regions) of the memory cell portion adjacent to the peripheral circuit portion may comprise a laminate film of the first conductor film and the second conductor film.

In the method of manufacturing the semiconductor integrated circuit device described above, the edge of the photoresist film formed at the memory cell portion or at the peripheral circuit portion can be formed at the upper part of the MISFET for separating the peripheral circuit portion and the memory cell portion or in the boundary region between the peripheral circuit portion and the memory cell portion.

When the film thickness of the bit line conductor and that of the interconnect conductor is different with the MISFET being the boundary, which MISFET selectively connects the memory cell portion and the sense amplifier of the peripheral circuit portion, patterning accuracy is likely to drop at this portion having the difference of the film thickness during patterning of the bit line conductor and the interconnect conductor. However, because the conductor film constituting the bit line conductor and the interconnect conductor is removed by etching on the MISFET, the drop of patterning accuracy does not get actualized. When the film thickness of the bit line conductor is different from that of the interconnect conductor with the boundary region between the peripheral circuit portion and the memory cell portion being the boundary, positioning accuracy of the exposure mask for forming the photoresist film need not be increased. Therefore, the load to the process step can be reduced by increasing the process margin.

What is claimed is:

1. A method of manufacturing a semiconductor integrated circuit device comprising the steps of:

(a) preparing a semiconductor substrate having a main surface;

(b) forming a circuit device of a memory cell portion at a first portion of the main surface of said semiconductor substrate and forming a circuit device of a peripheral circuit portion at a second portion of the main surface of said semiconductor substrate;

(c) forming an insulating film having a flat surface, for covering said circuit devices of said memory cell portion and said peripheral circuit portion and the main surface of said semiconductor substrate;

(d) forming contact holes passing through said insulating film and reaching the main surface of said semiconductor substrate;

(e) forming conductor films on said insulating film in such a manner as to be electrically connected to said circuit devices of said memory cell portion and said peripheral circuit portion through said contact holes;

(f) reducing the thickness of said conductor films located over at least said first portion of the main surface of said semiconductor substrate in such a manner as to define a step at a boundary between said conductor films the thickness of which is so reduced and the rest of said conductor films; and (g) treating said conductor film so that the portions of said conductor films having the reduced thickness constitute bit lines and the rest of portions constitute interconnect conductors in said peripheral circuit portion.

2. A method of manufacturing a semiconductor integrated circuit device according to claim 1, wherein each of said conductor films is a laminate film of a titanium nitride layer formed on said insulating film and a tungsten layer formed on said titanium nitride layer, and said step (f) includes a step of reducing the thickness of said tungsten layer located over at least the first portion of said semiconductor substrate.

3. A method of manufacturing a semiconductor integrated circuit device according to claim 1, wherein each of said conductor films is a laminate film of a titanium nitride layer and a tungsten layer formed on said titanium nitride layer, and said step (f) includes a step of removing a portion of said tungsten layer located over at least said first portion of the main surface of said semiconductor substrate under a condition that said titanium nitride layer is little etched.

4. A method of manufacturing a semiconductor integrated circuit device comprising the steps of:

(a) preparing a semiconductor substrate having a main surface;

(b) forming a circuit device of a memory cell portion at a first portion of the main surface of said semiconductor substrate and forming a circuit device of a peripheral circuit portion at a second portion of the main surface of said semiconductor substrate;

(c) forming an insulating film having a flat surface, for covering said circuit devices of said memory cell portion and said peripheral circuit portion and the main surface of said semiconductor substrate;

(d) reducing the film thickness of said insulating film located over the second portion of the main surface of said semiconductor substrate and etching back said insulating film in such a manner as to define a step at a boundary between the reduced thickness portion of said insulating film and the rest of said insulating film;

(e) forming contact holes passing through said insulating film and reaching the main surface of said semiconductor substrate;

(f) forming conductor films on said insulating film in such a manner as to be electrically connected to said circuit devices of said memory cell portion and said peripheral circuit portion through said contact holes;

(g) planarizing surface of said conductor films in such a manner as to define conductor film portions having a relatively small film thickness over said first portion of the main surface of said semiconductor substrate and conductor film portions having a relatively large film thickness over said second portion of the main surface of said semiconductor substrate; and (h) treating said conductor films so that said conductor film portions having a relatively small film thickness constitute bit lines and said conductor film portions having a relatively large film thickness constitute interconnect conductors in said peripheral circuit portion.

5. A method of manufacturing a semiconductor integrated circuit device according to claim 4, wherein said step (d) includes a step of etching back said insulating film by dry etching.

6. A method of manufacturing a semiconductor integrated circuit device according to claim 4, wherein said step (d) includes a step of etching back said insulating film by wet etching.

7. A method of manufacturing a semiconductor integrated circuit device comprising the steps of:

(a) preparing a semiconductor substrate having a main surface;

(b) forming a circuit device of a memory cell portion at a first portion of the main surface of said semiconductor substrate and forming a circuit device of a peripheral circuit portion at a second portion of the main surface of said semiconductor substrate;

(c) forming a first insulating film for covering said circuit devices of said memory cell portion and said peripheral circuit portion and the main surface of said semiconductor substrate;

(d) forming contact holes passing through said insulating film and reaching the main surface of said semiconductor substrate;

(e) forming a second insulating film on said first insulating film;

(f) treating said second insulating film so that a portion of said second insulating film located above at least said first portion of the main surface of said semiconductor substrate has a first thickness and a portion of said second insulating film located over said second portion of the main surface of said semiconductor substrate has a second thickness greater than said first thickness;

(g) removing portions having said first thickness and said second thickness from said second insulating film so processed, and forming first and second trench portions having depths corresponding to said first and second thickness, respectively;

(h) forming conductor films on said second insulating film having said first and second trench portions in such a manner as to be electrically connected to said circuit devices of said memory cell portion and said peripheral circuit portion through said contact holes; and (i) treating said conductor films in such a manner that conductor film portions having a relatively small film thickness and functioning as bit lines are formed over said first portion of the main surface of said semiconductor substrate and conductor film portions having a relatively large film thickness and functioning as interconnect conductors of said peripheral circuit portion are formed over said second portion of the main surface of said semiconductor substrate in a mutually isolated arrangement.

8. A method of manufacturing a semiconductor integrated circuit device according to claim 7, wherein said first insulating film formed at said step (c) is an insulating film having a flat surface, and said second insulating film treated at said step (f) is an insulating film obtained by removing a portion of said first insulating film located over said second portion of the main surface of said semiconductor substrate by a predetermined depth and planarizing the surface of said second insulating film formed thereon.

9. A method of manufacturing a semiconductor integrated circuit device comprising the steps of:

(a) preparing a semiconductor substrate having a main surface;

(b) forming a circuit device of a memory cell portion at a first portion of the main surface of said semiconductor substrate and forming a circuit device of a peripheral circuit portion at a second portion of the main surface of said semiconductor substrate;

(c) forming a first insulating film having a flat surface, for covering said circuit devices of said memory cell portion and said peripheral circuit portion and the main surface of said semiconductor substrate;

(d) forming contact holes passing through said insulating film and reaching the main surface of said semiconductor substrate;

(e) forming first conductor films on said first insulating film in such a manner as to be electrically connected to said circuit devices of said memory cell portion and said peripheral circuit portion through said contact holes, and forming a second insulating film on said first conductor films;

(f) removing a portion of said second insulating film located over at least said second portion of the main surface of said semiconductor substrate and exposing partially said first conductor film;

(g) forming second conductor films on said second insulating film and said first conductor films so exposed;

(h) planarizing the surface of said second conductor films and the surface of said second insulating film so that the thickness of portions of said second conductor films located over said second portion of the main surface of said semiconductor substrate and the thickness of a portion of said insulating film located over at least said first portion of the main surface of said semiconductor substrate reach predetermined values, respectively; and (i) treating said first and second conductor films so that conductor film portions having a relatively small film thickness and functioning as bit lines are formed over at least said first portion of the main surface of said semiconductor substrate and conductor film portions having a relatively large film thickness, comprising said first and second conductor films and functioning as interconnect conductors of said peripheral circuit portion are formed over said second portion of the main surface of said semiconductor substrate.

10. A method of manufacturing a semiconductor integrated circuit device according to claim 9, wherein said first and second conductor films are treated so that portions of said bit lines opposing said peripheral circuit portion comprise said first and second conductor films.

11. A method of manufacturing a semiconductor integrated circuit device according to claim 9, wherein said peripheral circuit portion includes a switching circuit disposed at a portion of said peripheral circuit portion opposing said memory cell portion for selectively electrically connecting said peripheral circuit portion and said memory cell portion, and said portion of said second insulating film to be removed at said step (f) exists on the peripheral circuit portion side with respect to a position above said switching circuit.

12. A method of manufacturing a semiconductor integrated circuit device according to claim 9, wherein the portion of said second insulating film to be removed at said step (f) exists on the peripheral circuit portion side with respect to a portion above between said first and second portions of the main surface of said semiconductor substrate.

13. A method of manufacturing a semiconductor integrated circuit device according to claim 9, wherein a buried conductor film is formed in each contact hole formed at said step (d) passing through said first insulating film and reaching the main surface of said semiconductor substrate.

14. A method of manufacturing a semiconductor integrated circuit device according to claim 1, wherein a buried conductor film is formed in each contact hole formed at said step (d) passing through said insulating film and reaching the main surface of said semiconductor substrate.

15. A method of manufacturing a semiconductor integrated circuit device according to claim 4, wherein a buried conductor film is formed in each contact hole formed at said step (e) passing through said insulating film and reaching the main surface of said semiconductor substrate.

16. A method of manufacturing a semiconductor integrated circuit device according to claim 7, wherein a buried conductor film is formed in each contact hole formed at said step (d) passing through said insulating film and reaching the main surface of said semiconductor substrate.

17. A method of manufacturing a semiconductor integrated circuit device comprising the steps of:

(a) preparing a semiconductor substrate having a main surface;

(b) forming a circuit device of a memory cell portion at a first portion of the main surface of said semiconductor substrate and forming a circuit device of a peripheral circuit portion at a second portion of the main surface of said semiconductor substrate;

(c) forming a first insulating film having a flat surface, for covering said semiconductor devices of said memory cell portion and said peripheral circuit portion and the main surface of said semiconductor substrate;

(d) forming contact holes passing through said insulating film and reaching the main surface of said semiconductor substrate;

(e) forming first conductor films on said first insulating film in such a manner as to be electrically connected to said circuit devices of said memory cell portion and said peripheral circuit portion through said contact holes;

(f) forming a second insulating film for covering portions of said first conductor films located over at least said first portion of the main surface of said semiconductor substrate;

(g) forming second conductor films for covering portions of said first conductor films not covered with said second insulating film; and (h) treating said first and second conductor films so that conductor film portions having a relatively small film thickness and comprising said first conductor films functioning as bit lines are formed over at least said first portion of the main surface of said semiconductor substrate and conductor film portions having a relatively large film thickness and comprising said first and second conductor films functioning as interconnect conductors of said peripheral circuit portion are formed over at least said second portion of the main surface of said semiconductor substrate.

* * * * *